US009198283B2

(12) United States Patent
Ellinger

(10) Patent No.: US 9,198,283 B2
(45) Date of Patent: Nov. 24, 2015

(54) VERTICALLY SPACED ELECTRODE STRUCTURE

(71) Applicant: Carolyn Rae Ellinger, Rochester, NY (US)

(72) Inventor: Carolyn Rae Ellinger, Rochester, NY (US)

(73) Assignee: EASTMAN KODAK COMPANY, Rochester, NY (US)

(*) Notice: Subject to any disclaimer, the term of this patent is extended or adjusted under 35 U.S.C. 154(b) by 76 days.

(21) Appl. No.: 14/198,658

(22) Filed: Mar. 6, 2014

(65) Prior Publication Data
US 2015/0257260 A1 Sep. 10, 2015

(51) Int. Cl.
H05K 1/16 (2006.01)
H05K 1/02 (2006.01)
H05K 1/09 (2006.01)

(52) U.S. Cl.
CPC ............ *H05K 1/0284* (2013.01); *H05K 1/09* (2013.01); *H05K 2201/0137* (2013.01); *H05K 2201/0326* (2013.01)

(58) Field of Classification Search
USPC .......................................... 361/765; 174/255
See application file for complete search history.

(56) References Cited

U.S. PATENT DOCUMENTS

| 7,160,819 | B2 | 1/2007 | Conley et al. |
| 7,413,982 | B2 | 8/2008 | Levy |
| 7,456,429 | B2 | 11/2008 | Levy |
| 7,572,686 | B2 | 8/2009 | Levy et al. |
| 7,789,961 | B2 | 9/2010 | Nelson et al. |
| 7,998,878 | B2 | 8/2011 | Levy et al. |
| 8,017,183 | B2 | 9/2011 | Yang et al. |
| 2002/0117329 | A1* | 8/2002 | Haba et al. ............. 174/255 |
| 2005/0084610 | A1 | 4/2005 | Selitser |
| 2005/0126820 | A1* | 6/2005 | Fukuoka et al. ............. 174/260 |
| 2006/0213957 | A1 | 9/2006 | Addington et al. |
| 2008/0166880 | A1 | 7/2008 | Levy |
| 2009/0051749 | A1 | 2/2009 | Baker |
| 2009/0078204 | A1 | 3/2009 | Kerr et al. |
| 2009/0081366 | A1 | 3/2009 | Kerr et al. |
| 2009/0081827 | A1 | 3/2009 | Yang et al. |
| 2009/0130858 | A1 | 5/2009 | Levy |

FOREIGN PATENT DOCUMENTS

WO WO 2008/082472 7/2008

OTHER PUBLICATIONS

Sinha, A. et al., "Area Selective Atomic Layer Deposition of Titanium Dioxide: Effect of Precursor Chemistry", J. Vac. Sci. Technol. B 24(6), pp. 2523-2532, Nov./Dec. 2006.
Sinha, A. et al., "A Top Surface Imaging Method Using Area Selective ALD on Chemically Amplified Polymer Photoresist Films", Electrochemical and Solid-State Letters, 9 (11), pp. G330-G333 (2006).

* cited by examiner

Primary Examiner — Andargie M Aychillhum
(74) Attorney, Agent, or Firm — William R. Zimmerli

(57) ABSTRACT

A vertically separated electrode structure includes a polymeric material post on a substrate. An inorganic material cap covers the top of the post and extends beyond an edge of the post in at least a width dimension to define a first reentrant profile. A first electrode is located over the cap. A second electrode is located over the substrate and not over the post. The second electrode is adjacent to the edge of the post in the reentrant profile such that a distance between the first electrode and second electrode is greater than zero when measured orthogonally to the substrate surface. The first electrode and second electrode have the same material composition and layer thickness.

12 Claims, 46 Drawing Sheets

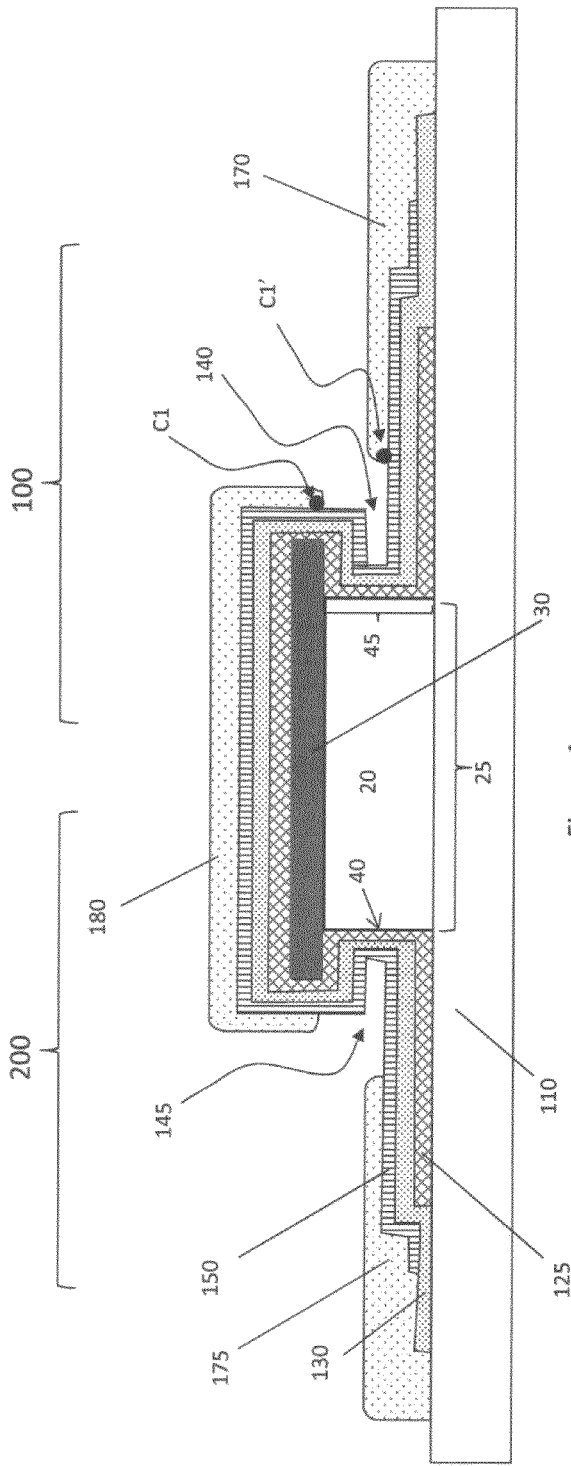
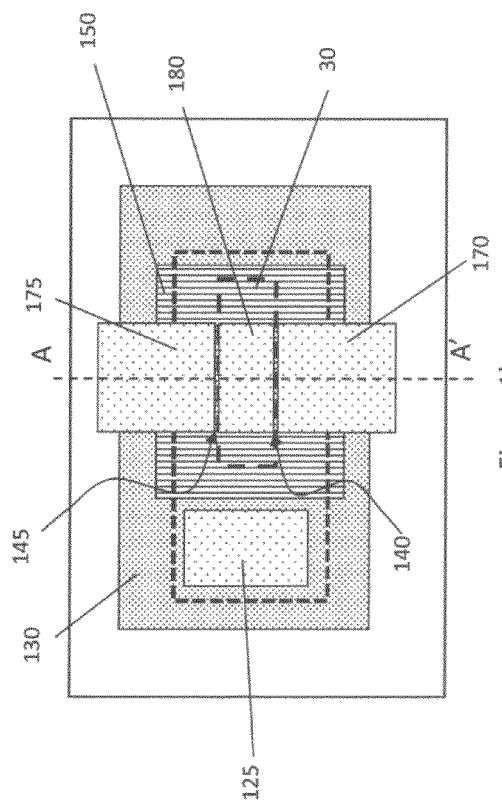

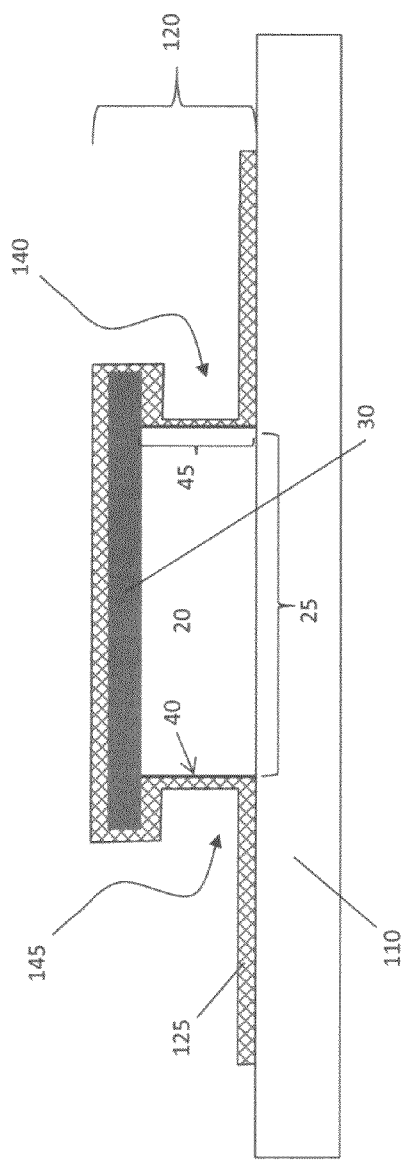
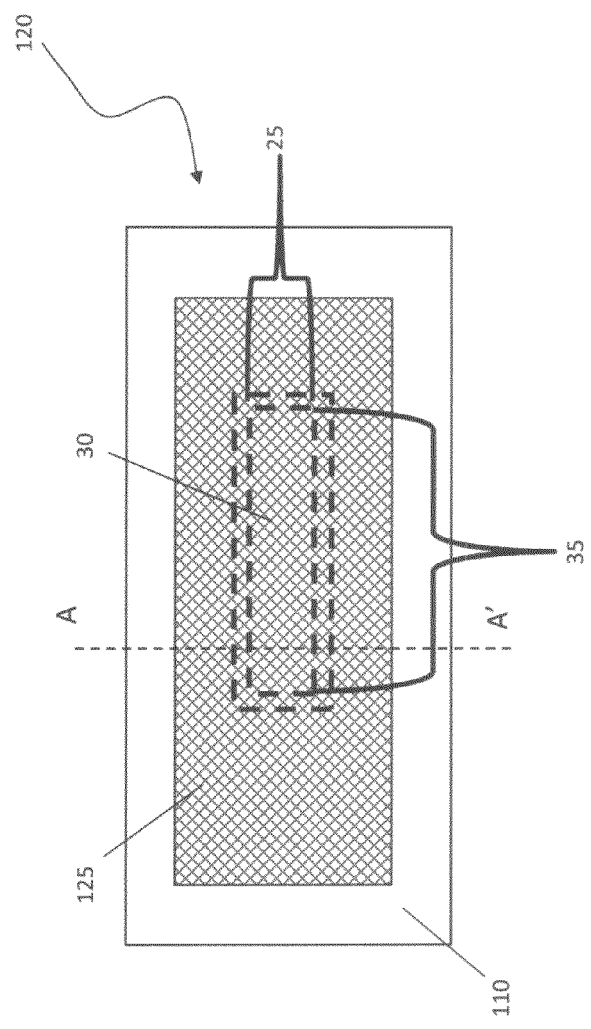
Figure 2a
Figure 2b

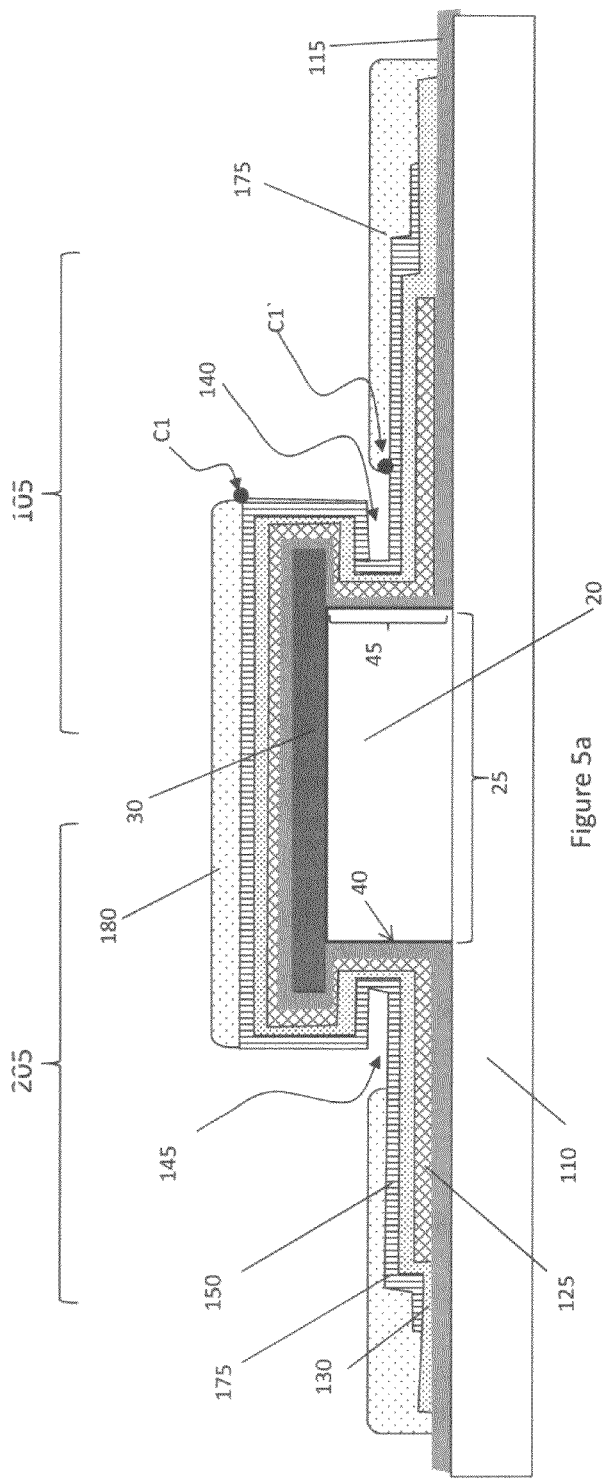
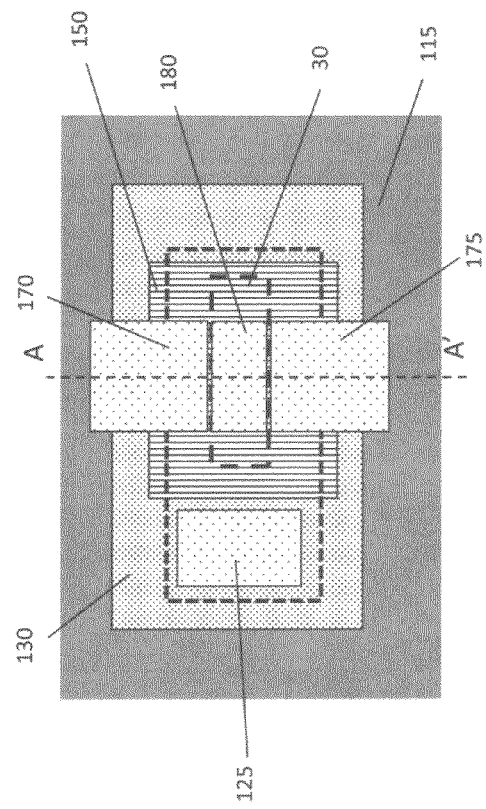

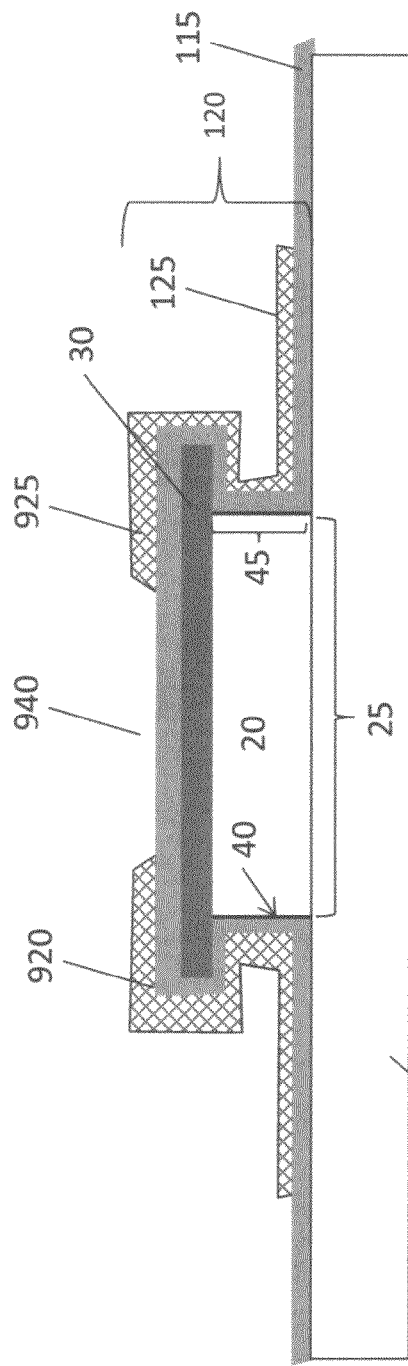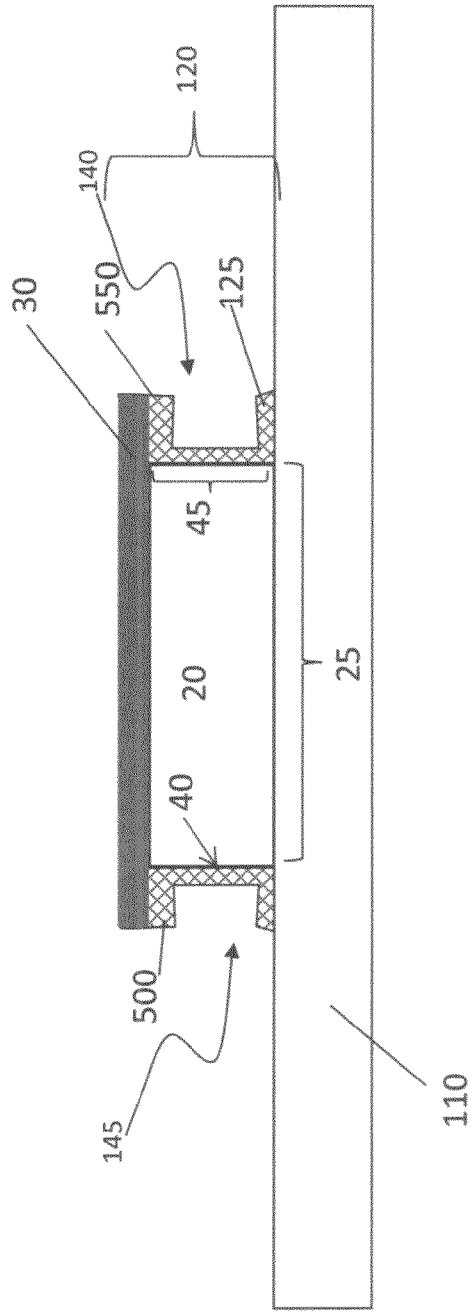

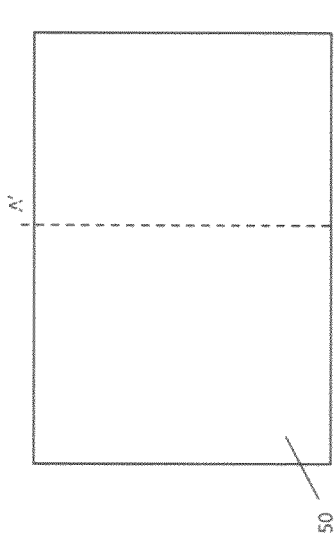
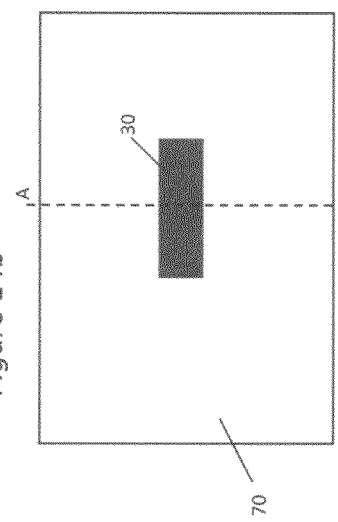
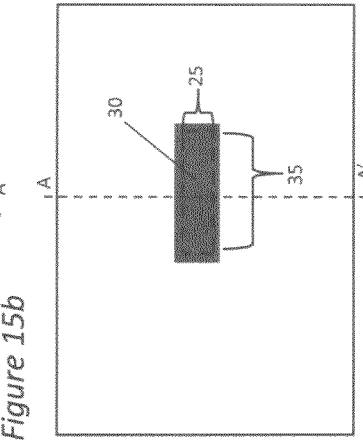
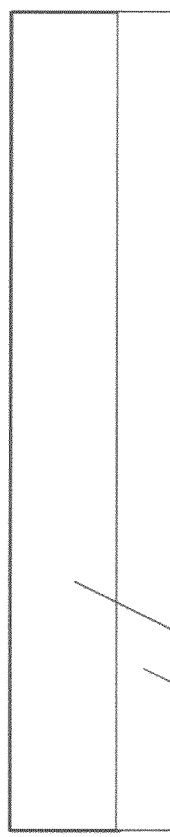
Figure 14a
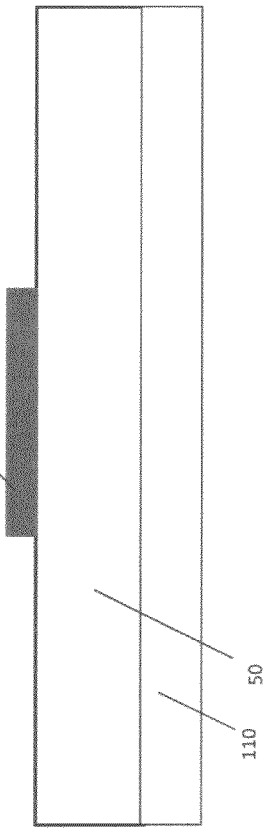
Figure 15a
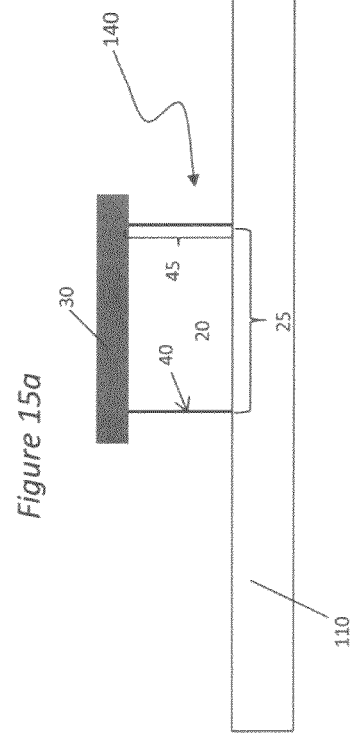
Figure 16a

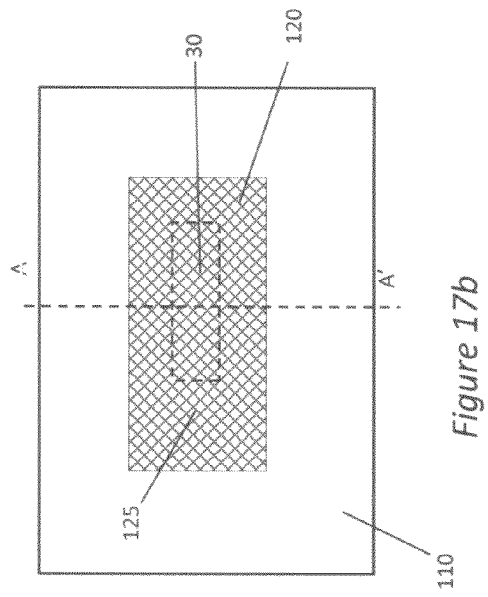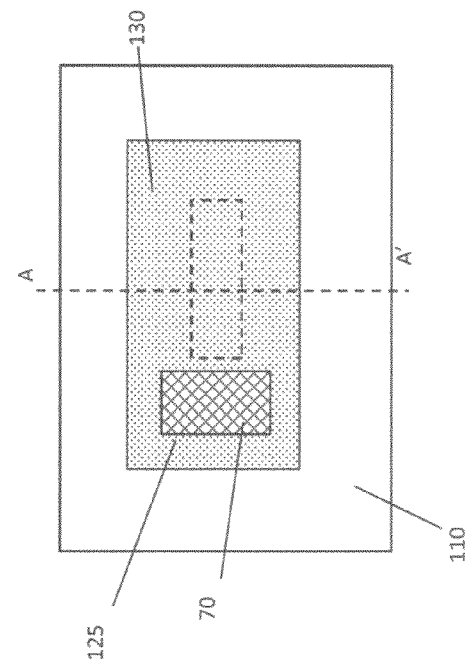
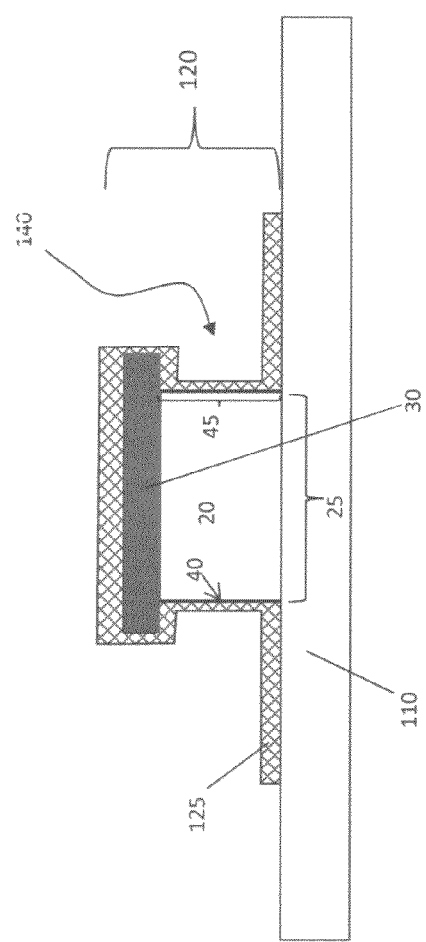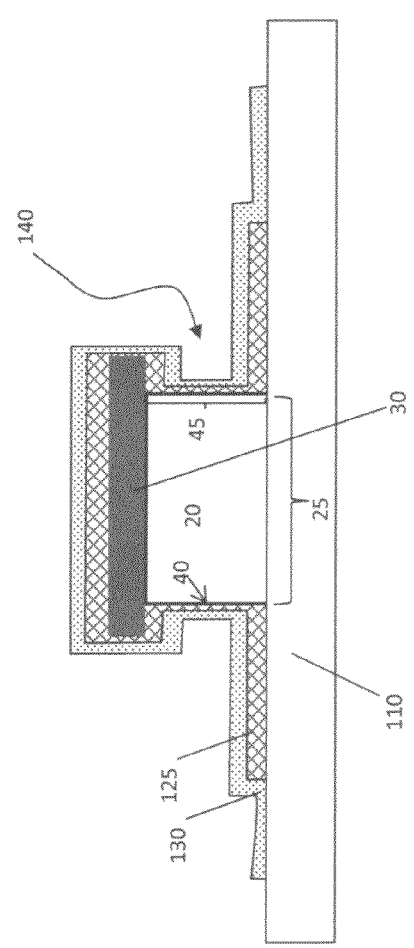
Figure 17b
Figure 18b
Figure 17a
Figure 18a

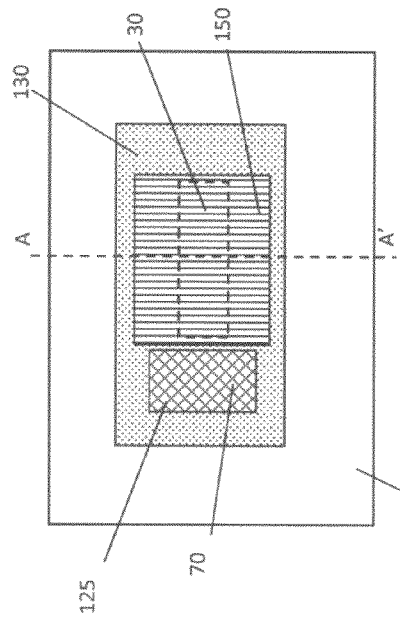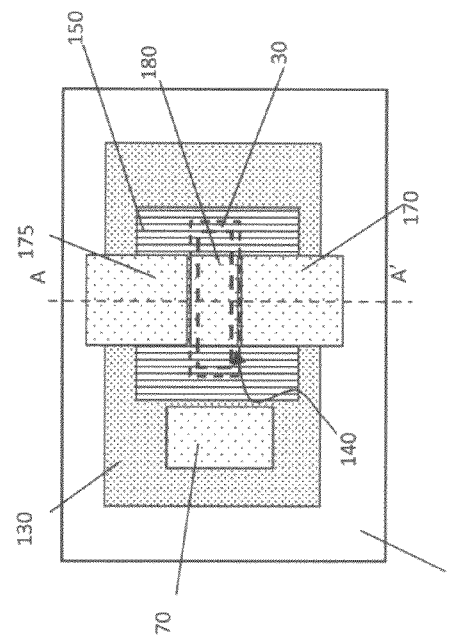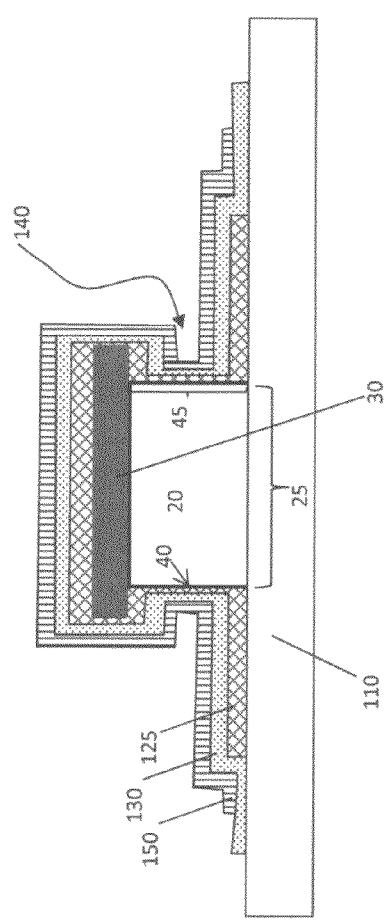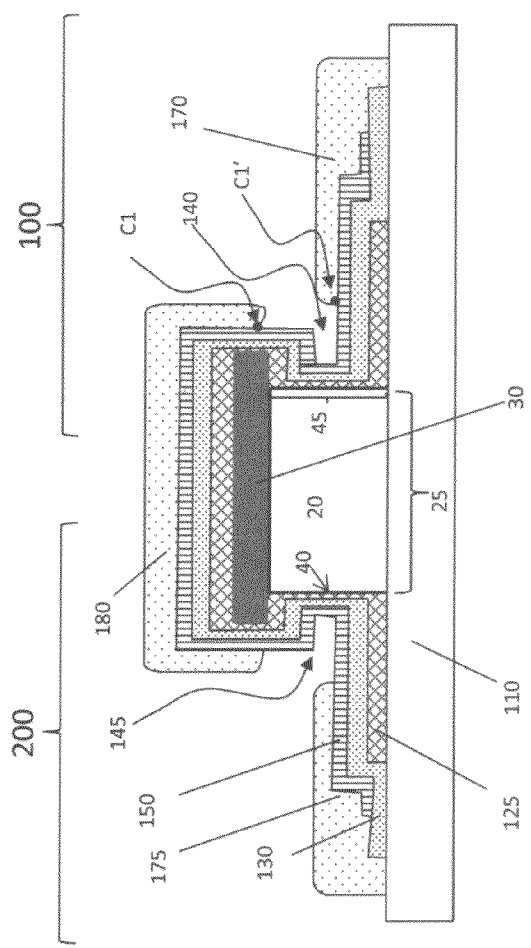
Figure 19a
Figure 19b
Figure 20a
Figure 20b

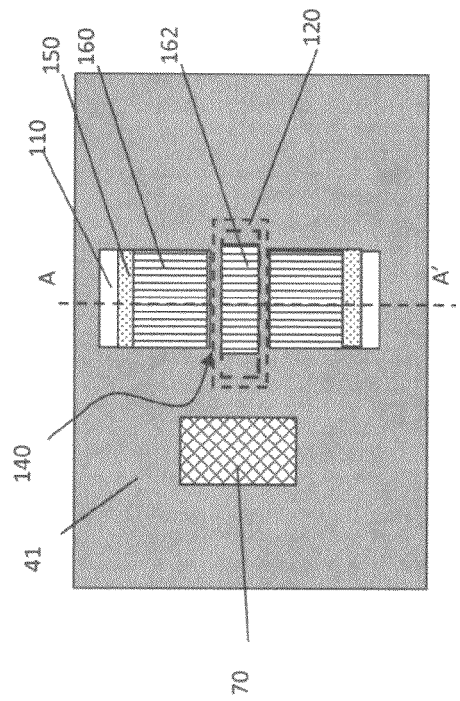
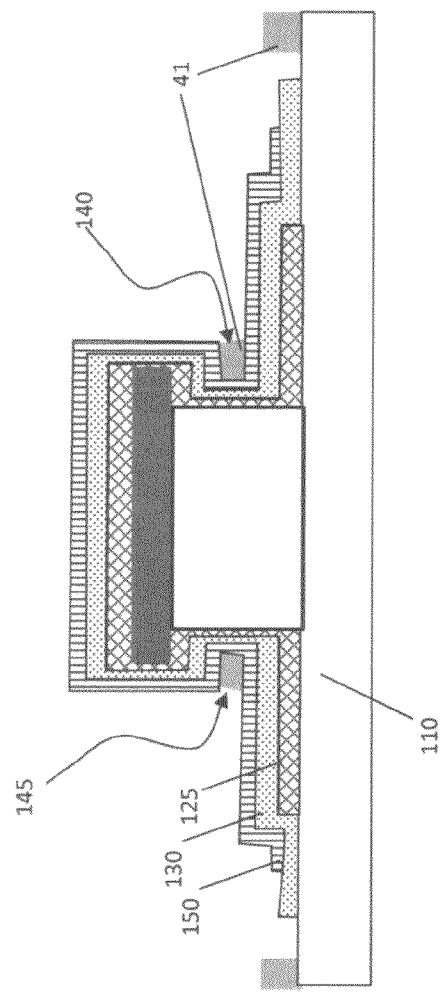
Figure 23b
Figure 23a

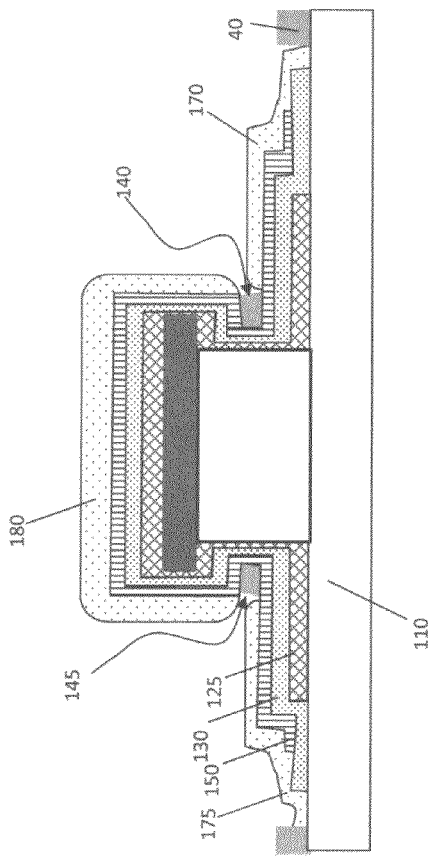
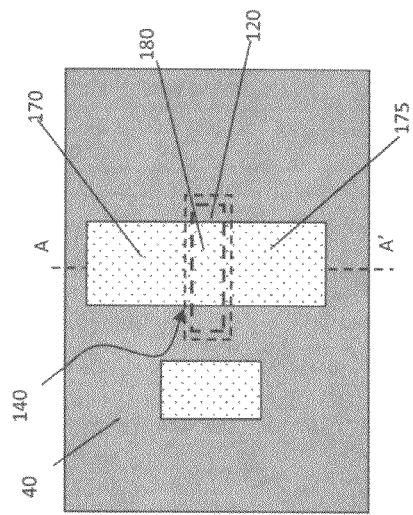
*Figure 24a*
*Figure 24b*
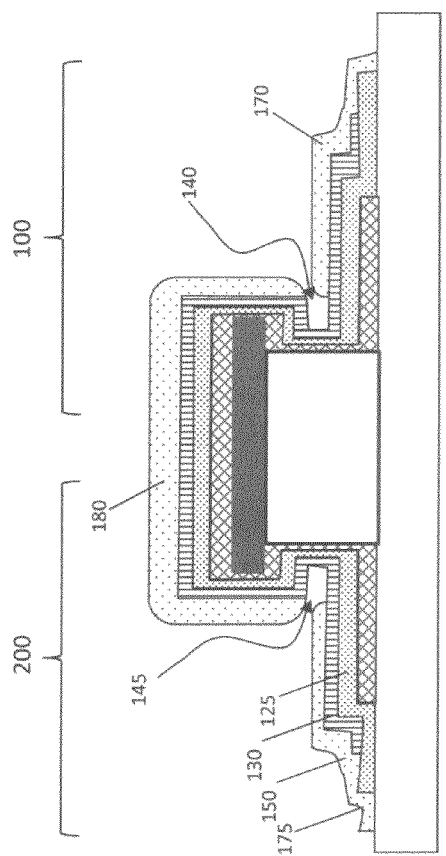
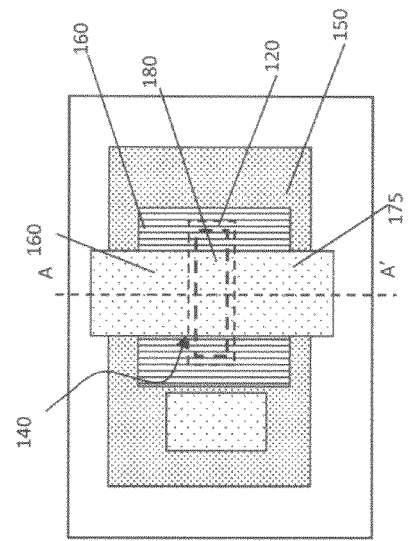
*Figure 25a*
*Figure 25b*

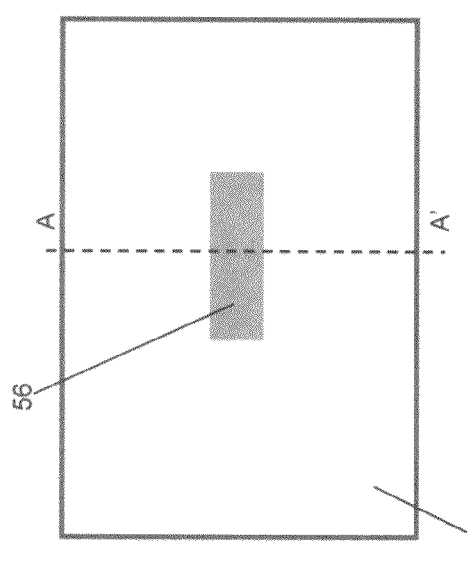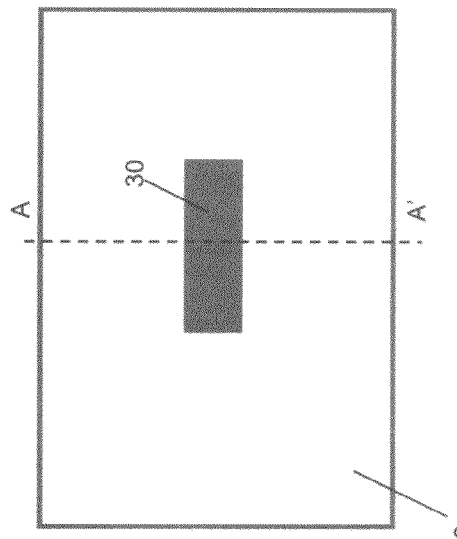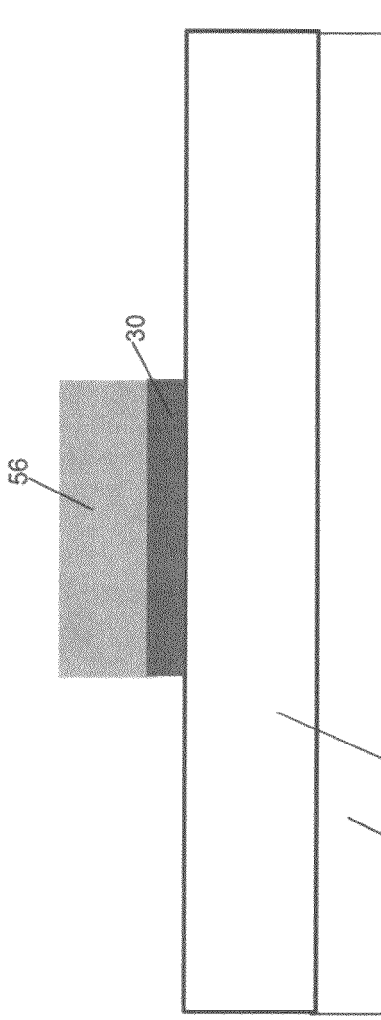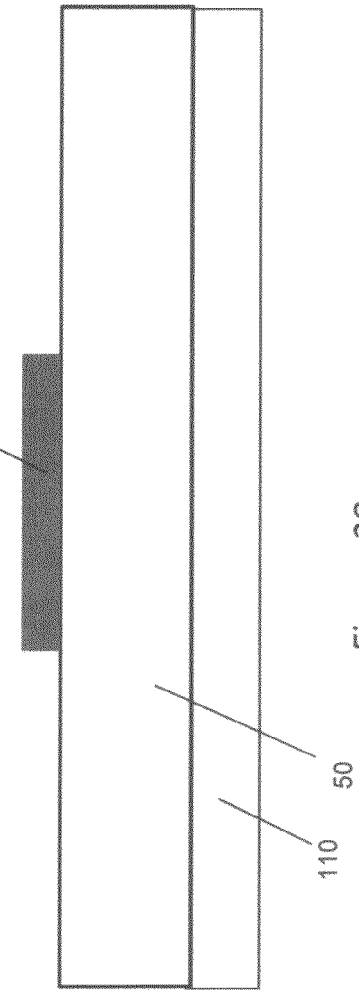

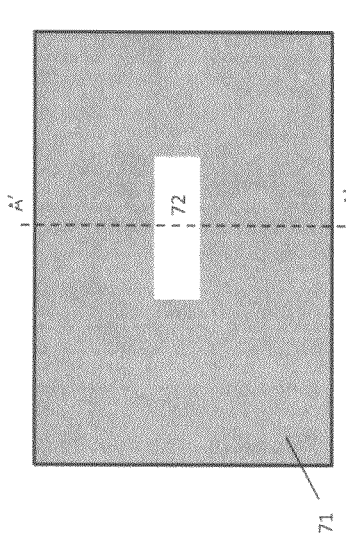
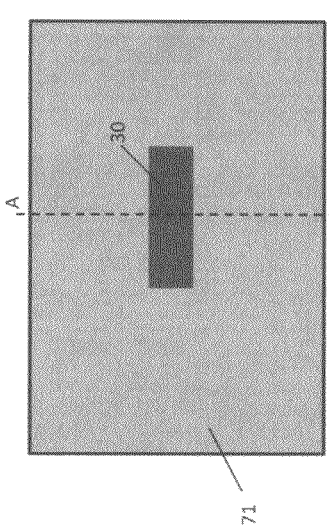
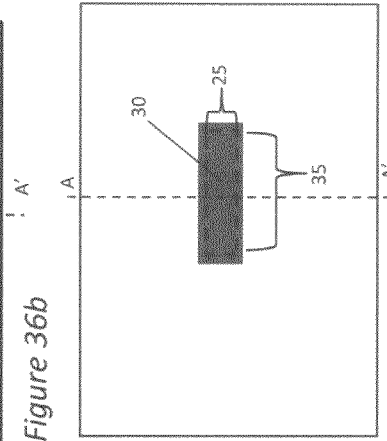
Figure 35b
Figure 36b
Figure 37b
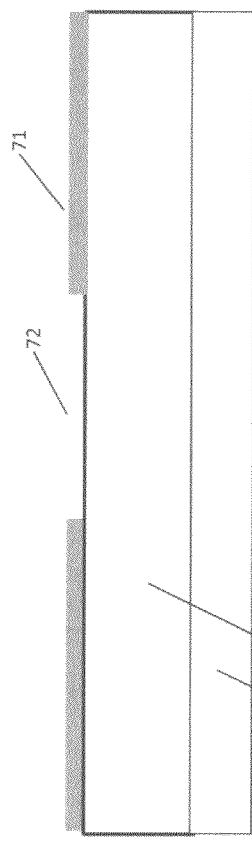
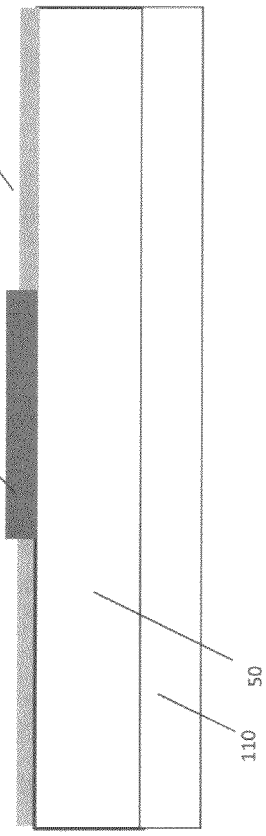
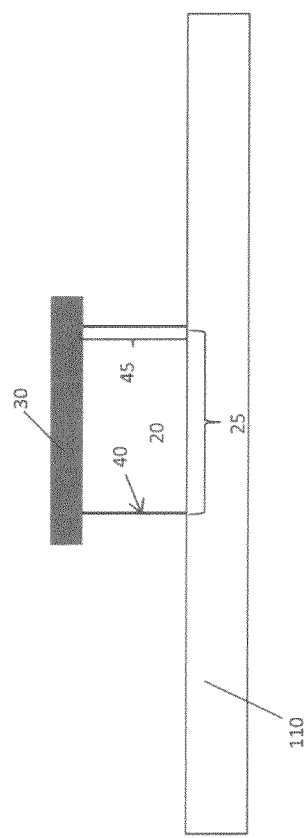
Figure 35a
Figure 36a
Figure 37a

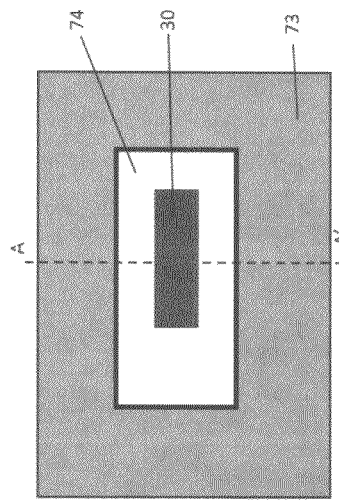
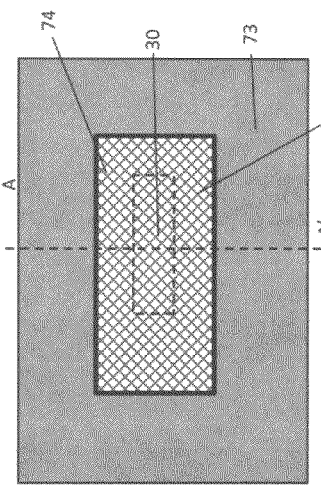
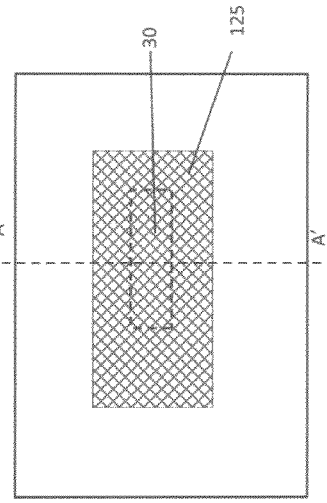
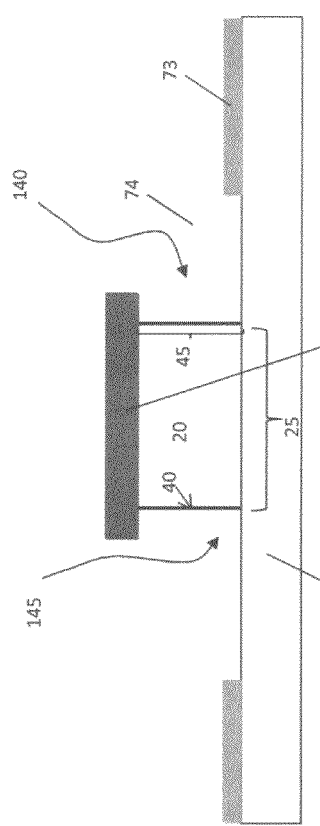
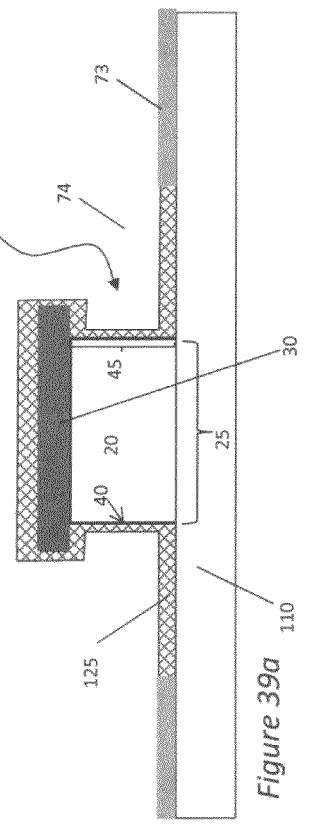
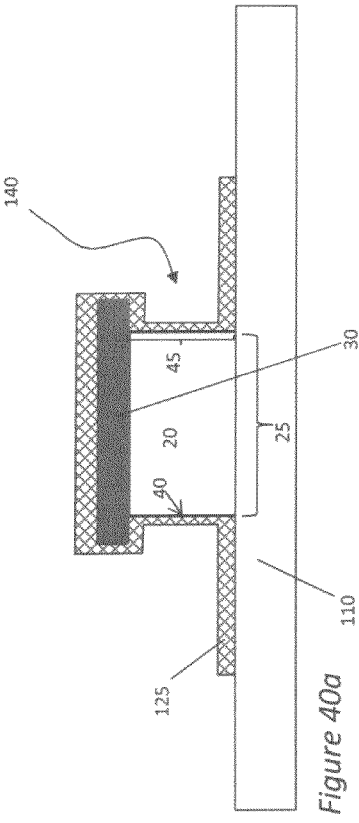

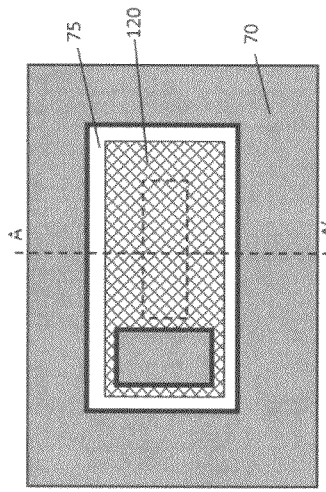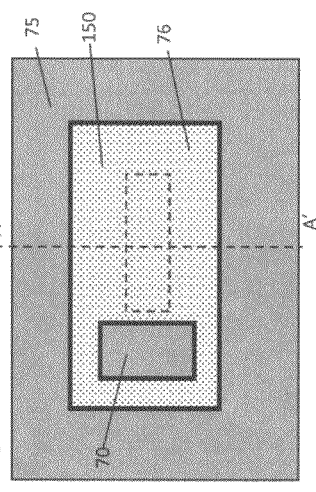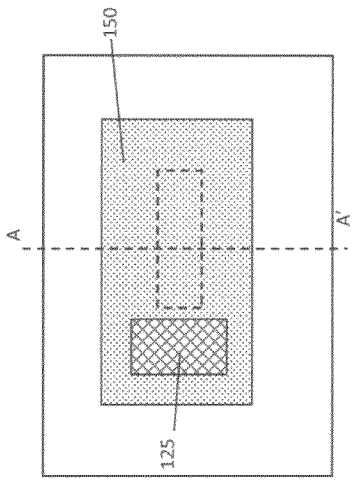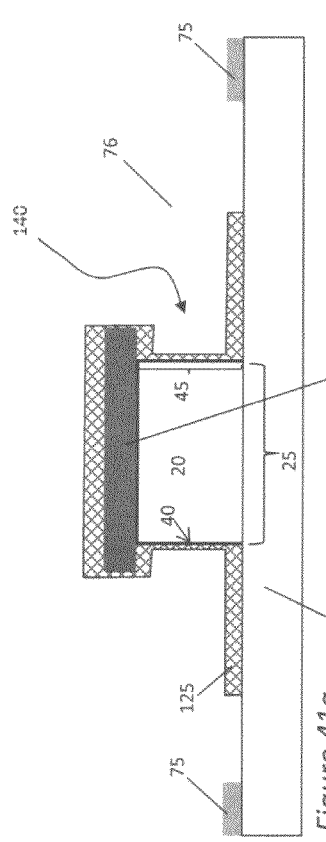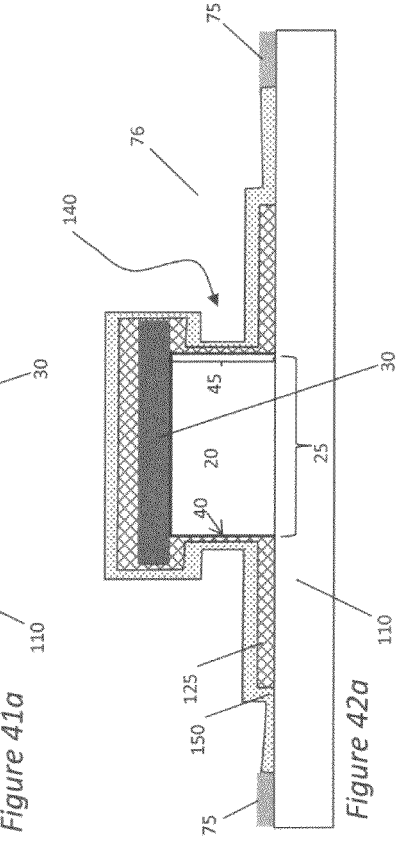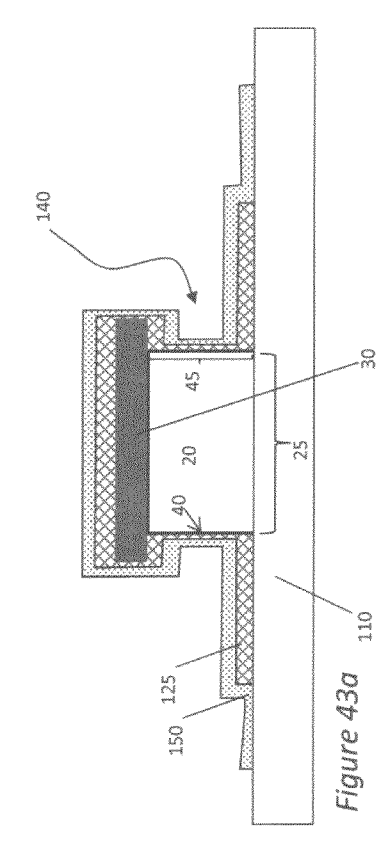

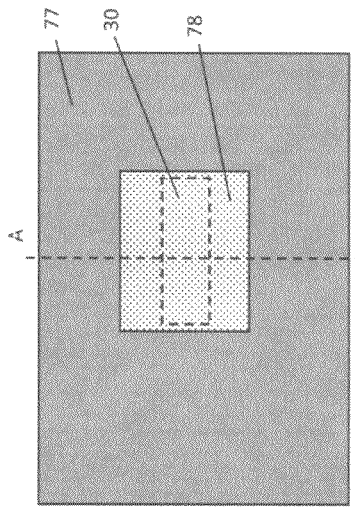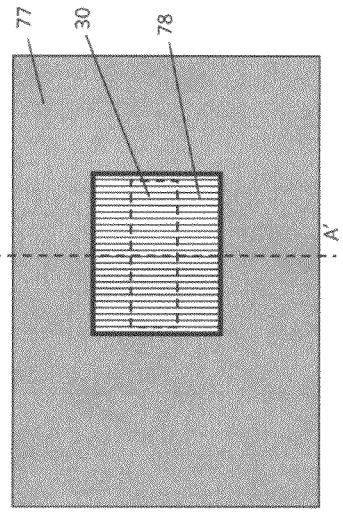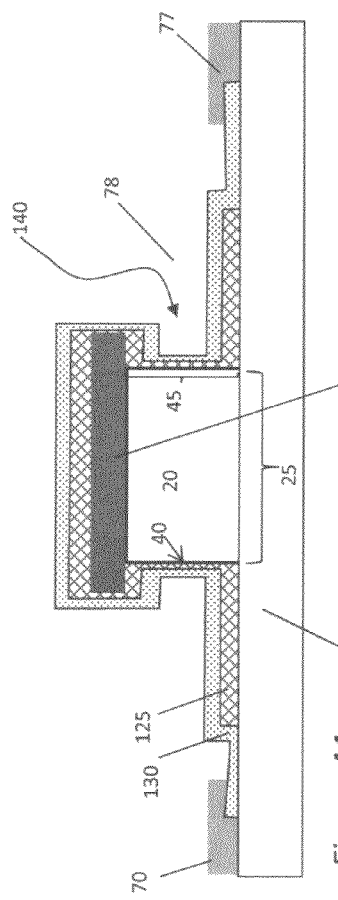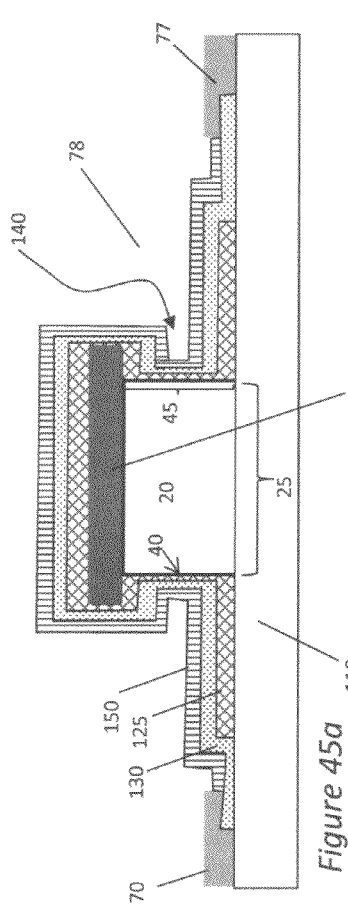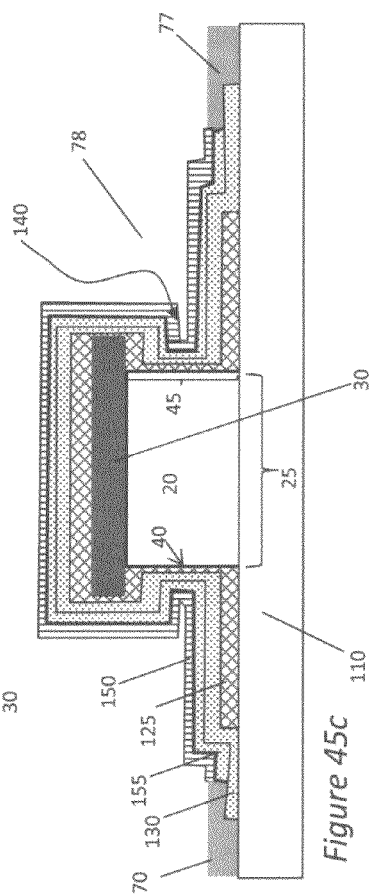

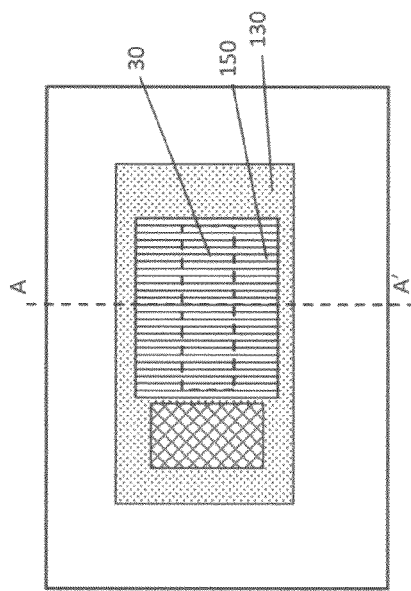
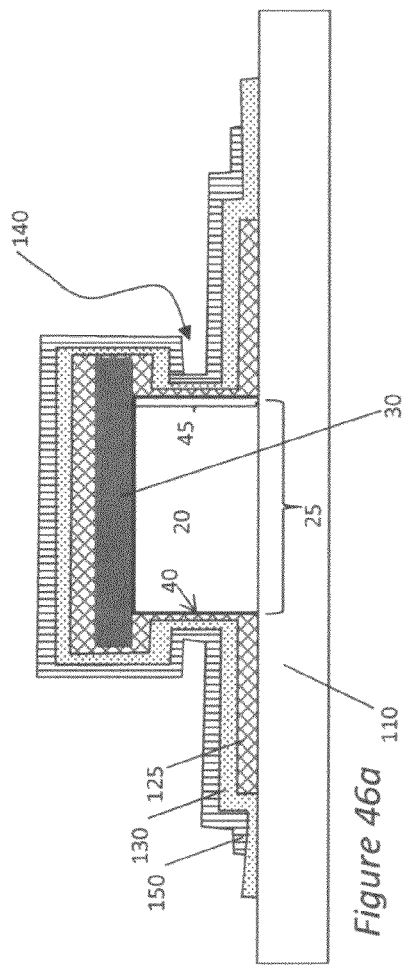

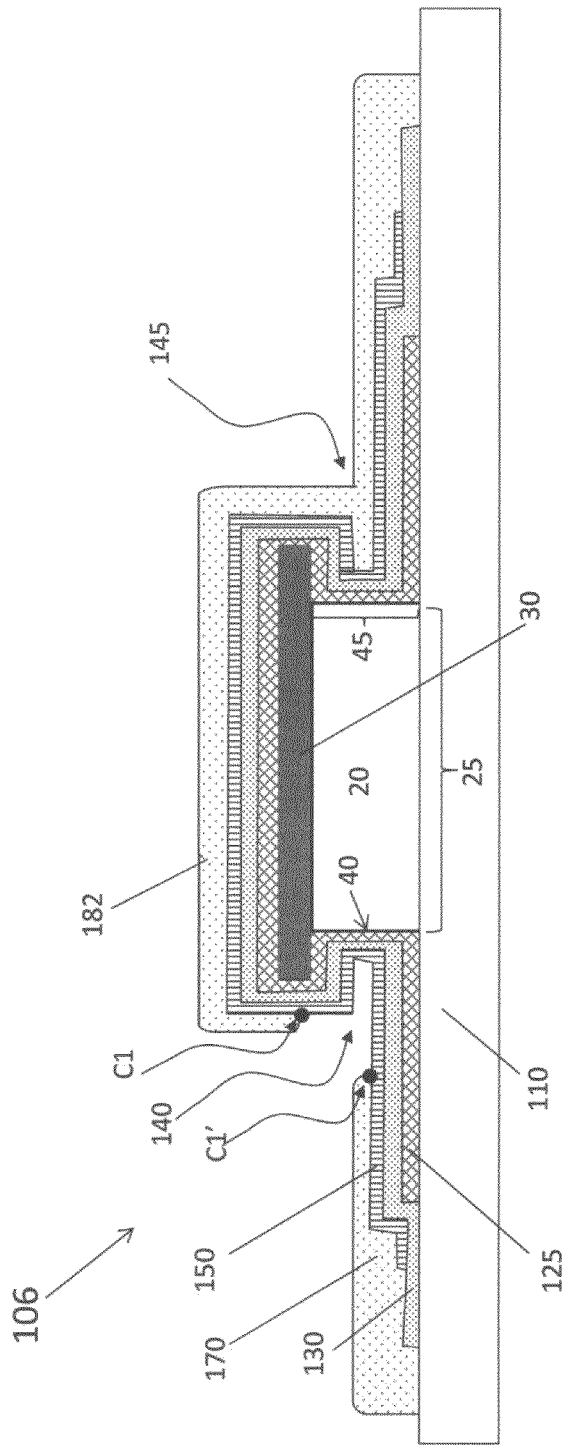
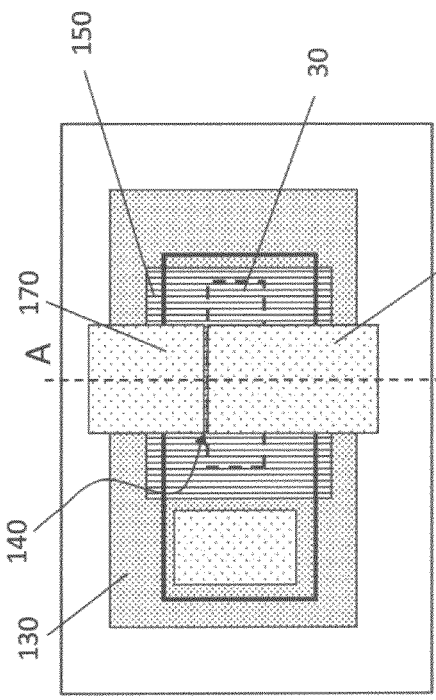
Figure 52a
Figure 52b

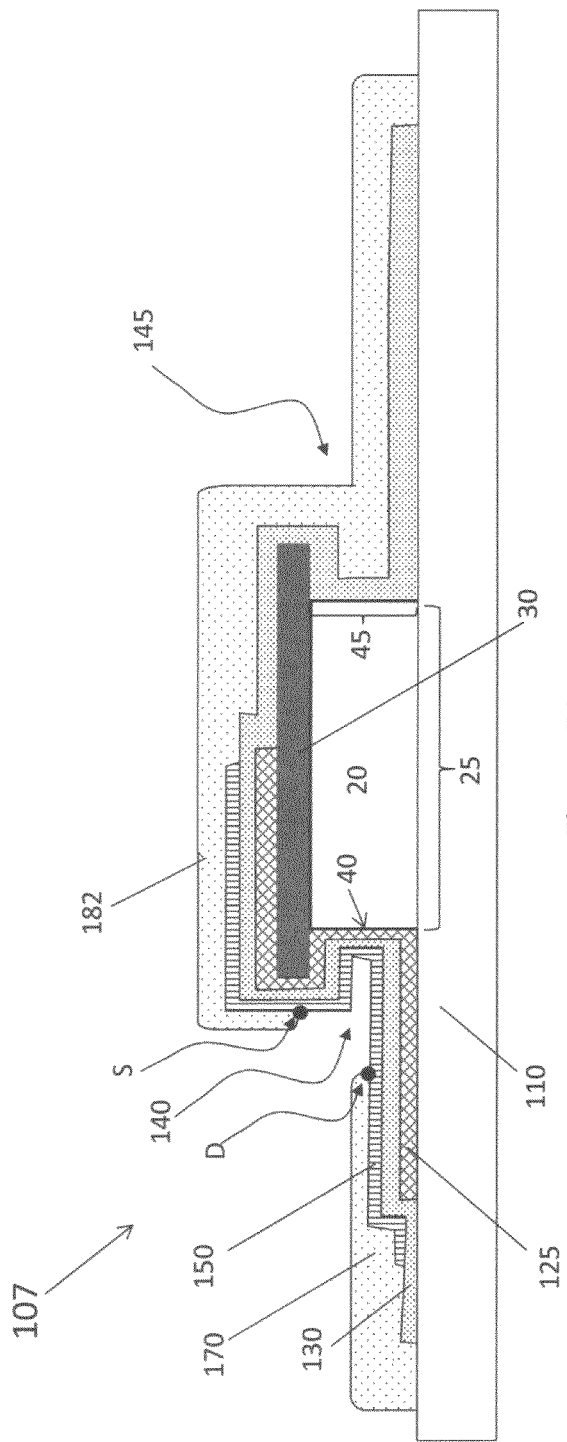
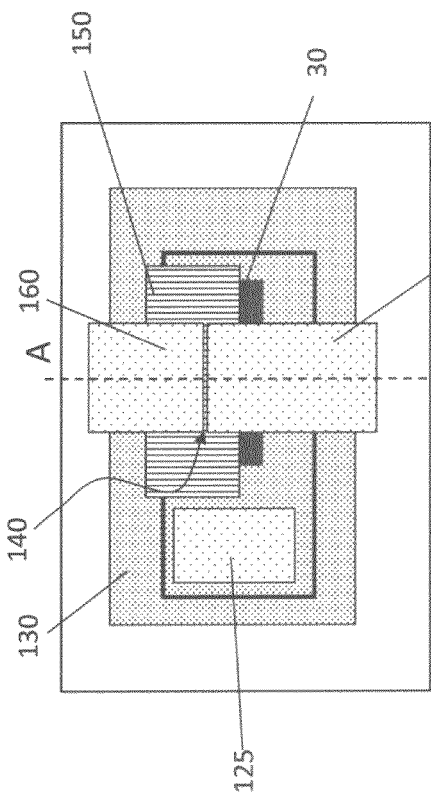
Figure 53a
Figure 53b

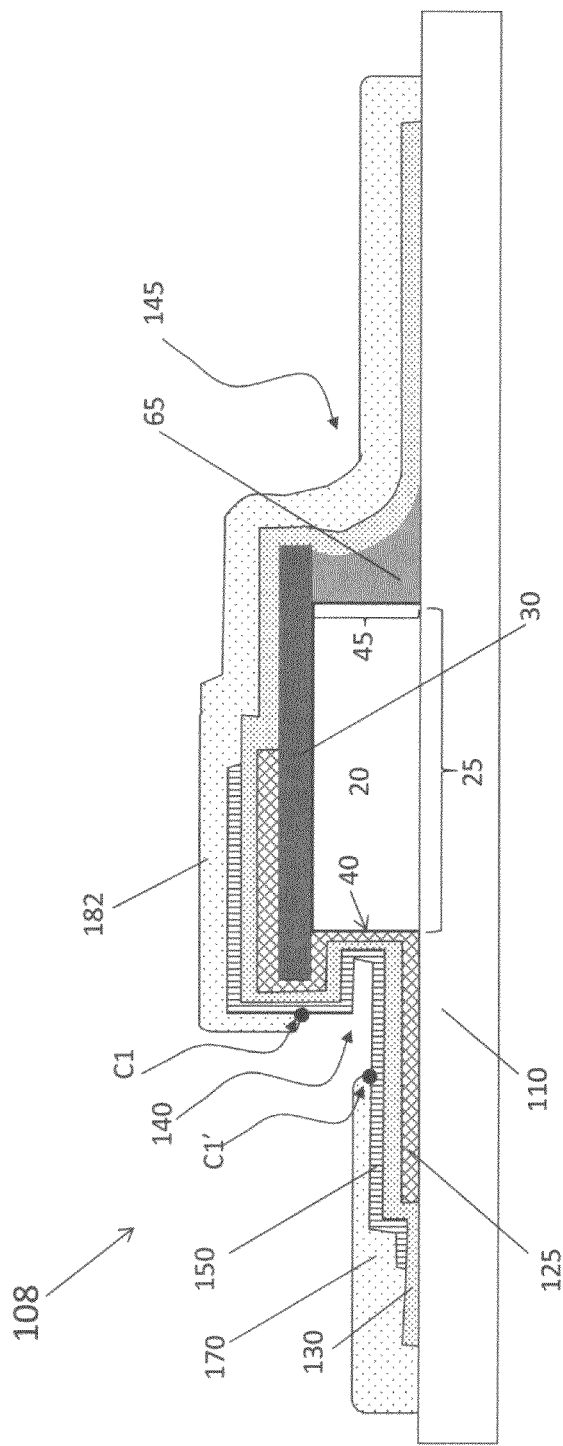
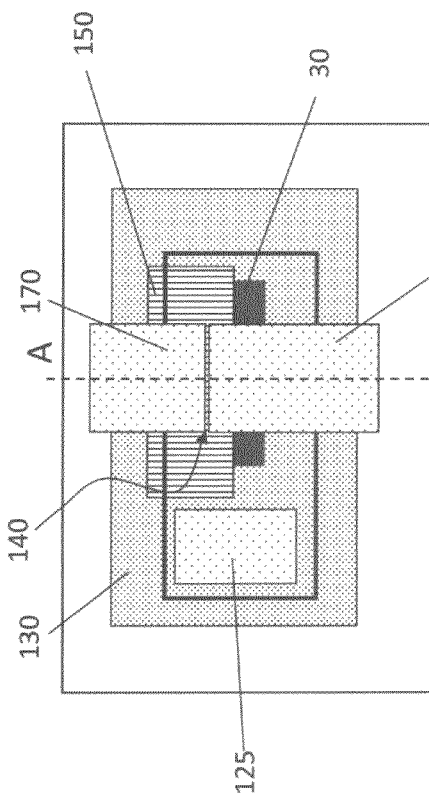
Figure 54a
Figure 54b

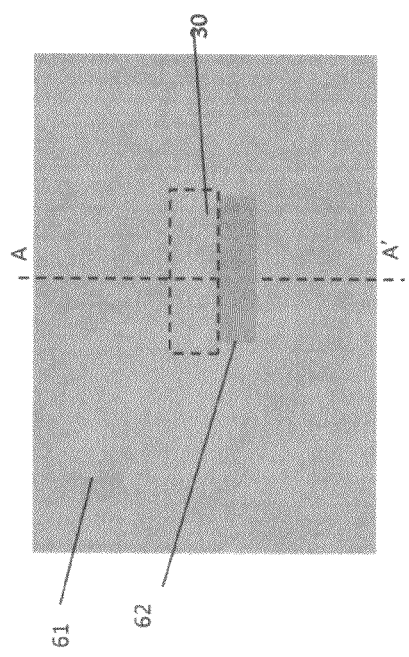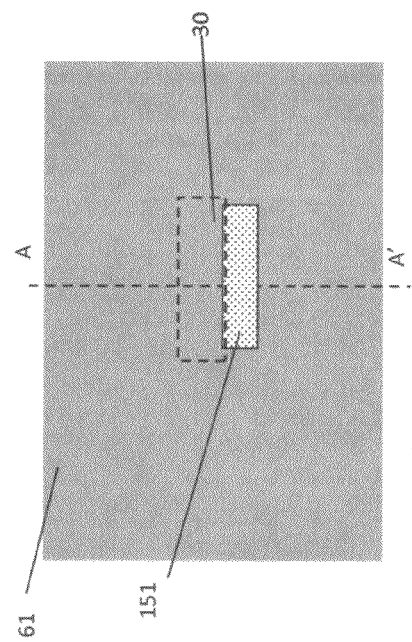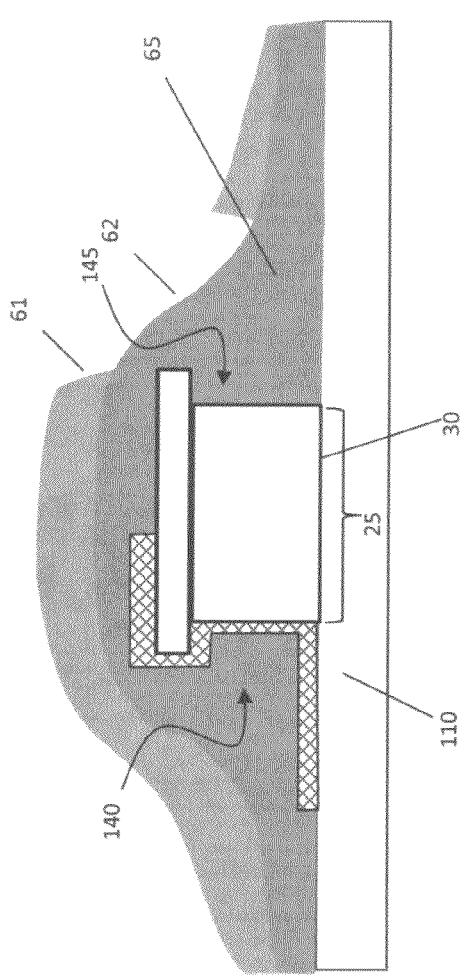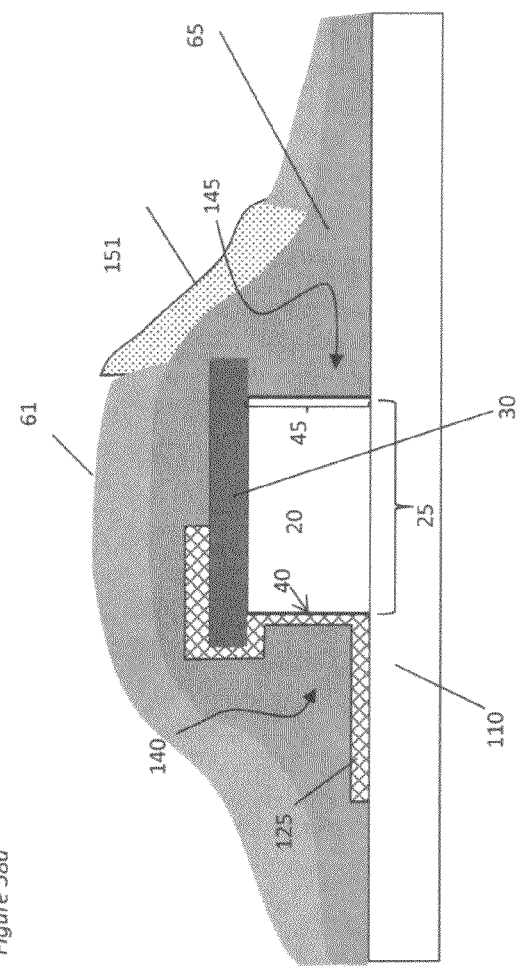
Figure 58a
Figure 58b
Figure 59a
Figure 59b

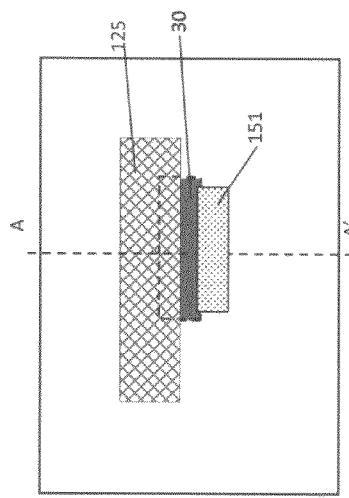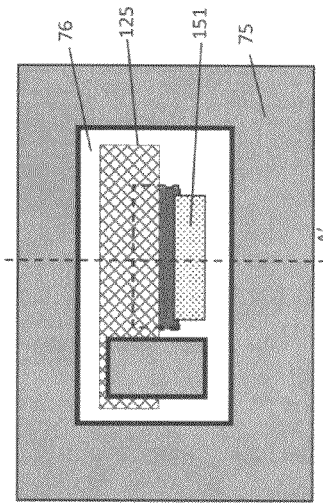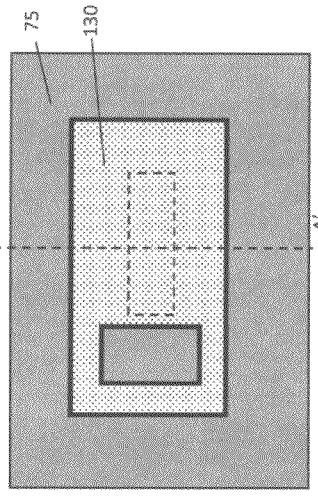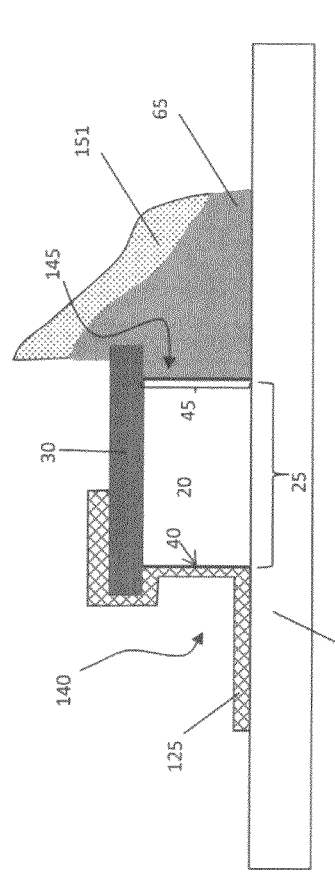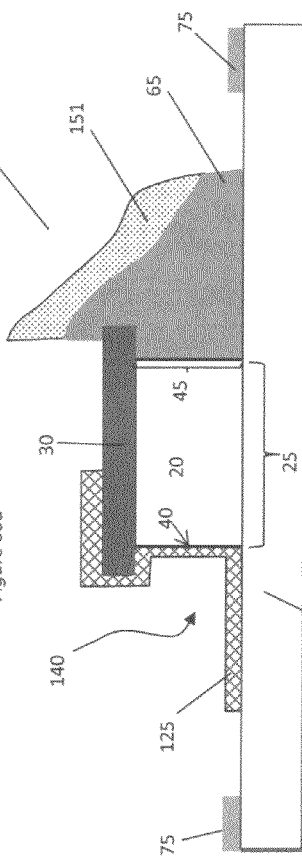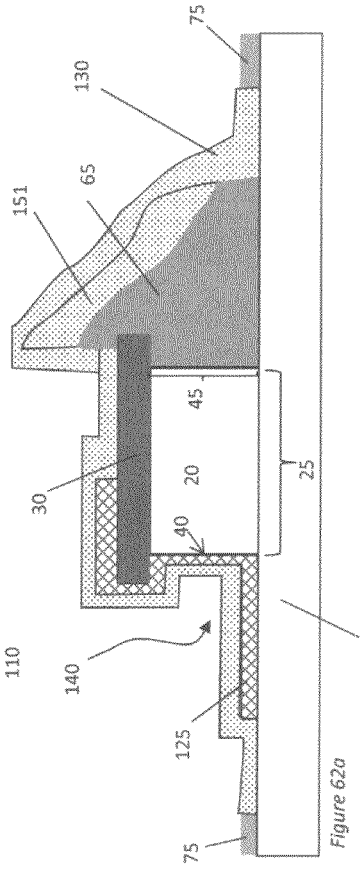
Figure 60b   Figure 61b   Figure 62b
Figure 60a   Figure 61a   Figure 62a

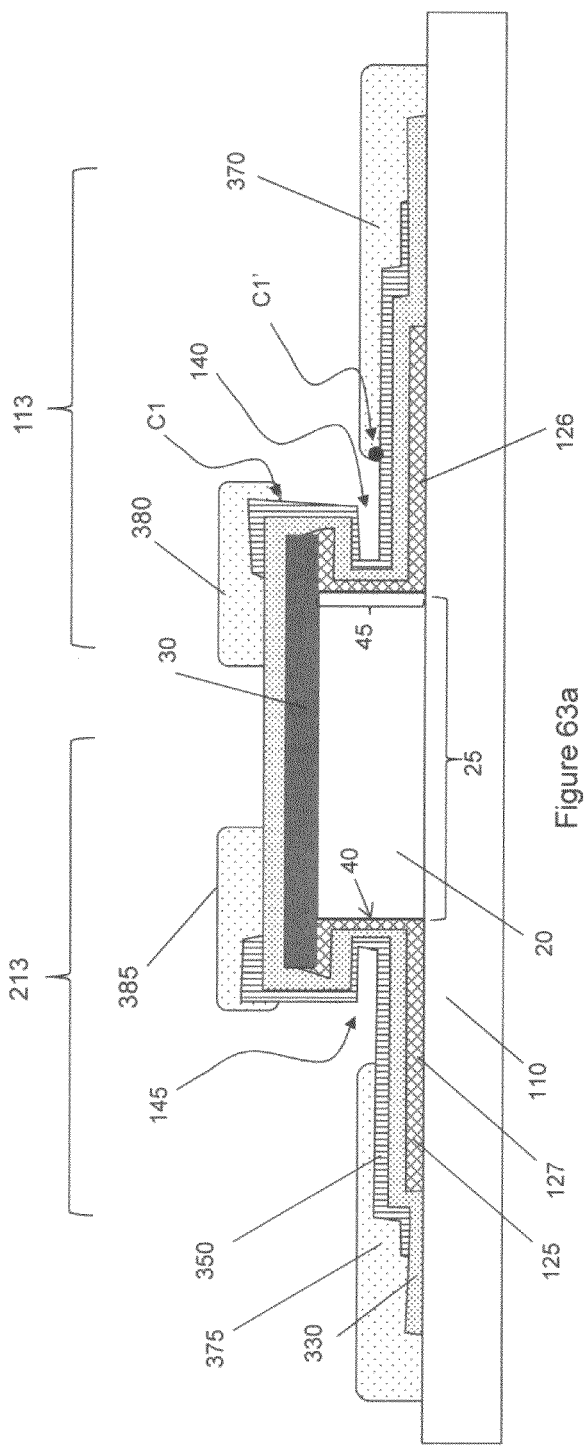
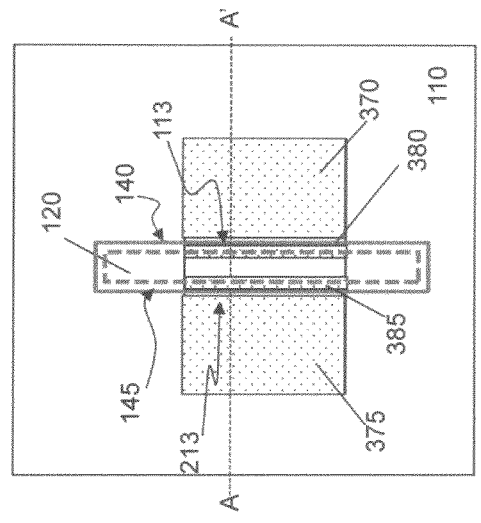
Figure 63a
Figure 63b

VERTICALLY SPACED ELECTRODE STRUCTURE

CROSS REFERENCE TO RELATED APPLICATIONS

Reference is made to commonly-assigned, U.S. patent application Ser. No. 14/198,621 (now granted as U.S. Pat. No. 9,093,470), entitled "VTFT FORMATION USING CAPILLARY ACTION", Ser. No. 14/198,636, entitled "VTFT FORMATION USING SELECTIVE AREA DEPOSITION", Ser. No. 14/198,643, entitled "VTFT INCLUDING OVERLAPPING ELECTRODES", Ser. No. 14/198,623, entitled "VTFTS INCLUDING OFFSET ELECTRODES", Ser. No. 14/198,626 (now abandoned), entitled "PATTERNING A STRUCTURAL POLYMER PATTERNING", Ser. No. 14/198,628, entitled "VTFT WITH POLYMER CORE", Ser. No. 14/198,630, entitled "FABRICATING VTFT WITH POLYMER CORE", Ser. No. 14/198,631, entitled "VTFT WITH EXTENDED ELECTRODE", Ser. No. 14/198,647, entitled "OFFSET INDEPENDENTLY OPERABLE VTFT ELECTRODES", Ser. No. 14/198,652, entitled "FORMING A VTFT USING PRINTING", Ser. No. 14/198,664, entitled "FORMING VERTICALLY SPACED ELECTRODES", all filed Mar. 6, 2014.

FIELD OF THE INVENTION

This invention relates generally to semiconductor devices and in particular to transistor devices.

BACKGROUND OF THE INVENTION

Modern-day electronics systems typically require multiple patterned layers of electrically or optically active materials, sometimes over a relatively large substrate. Electronics, such as radio frequency identification (RFID) tags, photovoltaics, and optical and chemical sensors, require some level of patterning in their electronic circuitry. Flat panel displays, such as liquid crystal displays or electroluminescent displays, rely upon accurately patterned sequential layers to form thin film components of the backplane. These electronic components include capacitors, transistors, and power buses. The usual combination of photolithographic patterning methods and selective etch processes has several shortcomings including high cost, difficulty with large substrates, and complexity of selective etch processes.

The feature size obtainable using traditional processing methods is limited by the resolution of the photolithography tools. Currently the minimum feature size for large area display backplanes is around 0.5 microns, and requires expensive high end equipment. Minimum feature sizes for large area substrates with less expensive equipment can be much larger. High speed circuit operation requires TFTs with high drive current, and many applications additionally require the drive current be obtained with low voltage operation. It is well known that TFT performance is improved by reducing the channel length. To move beyond the exposure limitation of feature size, vertical transistors of various architectures are currently being studied. In a vertical TFT architecture, the channel is formed perpendicular to the substrate, and therefore the channel length (L) can be controlled by the height of a layer in the transistor.

Recent work in the fabrication of VTFT, while yielding short channel length devices, has used otherwise standard photolithographic techniques with complex semiconductor processes. For example, since it is not currently possible to put patterns directly on walls which are vertical with respect to a substrate surface, vertical wall patterning has been accomplished using a suitable temporary filler material to partially fill in a trench. The temporary filler material acts as a mask for the portions of the wall located underneath while allowing for processing of the walls above the temporary filler material. For example, when an oxide is to be deposited exclusively on vertical walls below a temporary filler material, the oxide is first deposited or produced over the entire surface of the relief. The relief or trench is initially completely filled with a suitable temporary filler material. Then, the temporary filler material is recessed back to a depth that just covers the desired oxide. After uncovered sections of the oxide are removed, the remaining temporary filler material is removed.

When it is necessary that an oxide be deposited or produced only in upper regions of a vertical wall, an etching stop layer, for example, a nitride layer, is first provided over the entire surface of the entire relief pattern. A different material, susceptible to directional etching, for example, polycrystalline silicon, is used to fill the relief, and is etched back as far as the desired coverage depth of the final vertical oxide. After the etching stop layer is removed from the unfilled sections of the walls, an oxide is deposited or generated using a thermal technique in the uncovered regions. Next, the oxide is anisotropically etched which removes the deposited oxide from horizontal. This is followed by removal of the filler material and, then, the removal of the etching stop layer.

In light of the complicated existing processes there is an ongoing need to provide semiconductor device architectures that include patterned vertical or inclined device surfaces. There also is an ongoing need to provide simple manufacturing techniques capable of processing small device features of semiconductor devices without requiring high resolution alignments and small gap printing for vertical TFTs. There also is an ongoing need to provide higher current semiconductor devices by improving the series resistance of the device.

To maintain acceptable device performance when shrinking the size of the channel, it is typical to scale the layer thicknesses with the size of the device. For example, in conventional production CMOS with channel lengths of 90 nm and lower often utilize dielectric layer thicknesses of less than 10 nm. While there are many processes to deposit dielectric materials, few result in high quality films at these thicknesses. Atomic layer deposition (ALD) is a process that is both conformal and known to result in high quality thin layers when used with optimized process conditions.

In ALD processes, typically two molecular precursors are introduced into the ALD reactor in separate stages. U.S. Patent Application Publication 2005/0084610 (Selitser) describes an atmospheric pressure atomic layer chemical vapor deposition process that involve separate chambers for each stage of the process and a series of separated injectors are spaced around a rotating circular substrate holder track. A spatially dependent ALD process can be accomplished using one or more of the systems or methods described in more detail in WO 2008/082472 (Cok), U.S. Patent Application Publications 2008/0166880 (Levy), 2009/0130858 (Levy), 2009/0078204 (Kerr et al.), 2009/0051749 (Baker), 2009/0081366 (Kerr et al.), and U.S. Pat. No. 7,413,982 (Levy), U.S. Pat. No. 7,456,429 (Levy), and U.S. Pat. No. 7,789,961 (Nelson et al.), U.S. Pat. No. 7,572,686 (Levy et al.), the disclosures of which are hereby incorporated by reference in their entirety.

There is growing interest in combining ALD with a technology known as selective area deposition (SAD). As the name implies, selective area deposition involves treating portion(s) of a substrate such that a material is deposited only in those areas that are desired, or selected. Sinha et al. (J. Vac. Sci. Technol. B 24 6 2523-2532 (2006)), have remarked that selective area ALD requires that designated areas of a surface be masked or "protected" to prevent ALD reactions in those selected areas, thus ensuring that the ALD film nucleates and grows only on the desired unmasked regions. It is also possible to have SAD processes where the selected areas of the surface area are "activated" or surface modified in such a way that the film is deposited only on the activated areas. There are many potential advantages to selective area deposition techniques, such as eliminating an etch process for film patterning, reduction in the number of cleaning steps required, or patterning of materials which are difficult to etch. One approach to combining patterning and depositing a semiconductor is shown in U.S. Pat. No. 7,160,819 entitled "METHOD TO PERFORM SELECTIVE ATOMIC LAYER DEPOSITION OF ZINC OXIDE" by Conley et al. Conley et al. discuss materials for use in patterning zinc oxide on silicon wafers. No information is provided, however, on the use of other substrates or results for other metal oxides.

SAD work to date has focused on the problem of patterning a single material during deposition. There persists a problem of combining multiple SAD steps to form working devices. Processes for building complete devices need to be able to control the properties of the critical interfaces, particularly in field effect devices like TFTs. As such, there remains a need for novel processes to simplify the manufacture of vertical TFTs. There also is a need for novel processes that use SAD and digital patterning processes to pattern devices, for example, VTFTs, which have critical vertical features.

SUMMARY OF THE INVENTION

According to an aspect of the invention, a vertically separated electrode structure includes a substrate and a polymeric material post on the substrate. The post has a height dimension extending away from the substrate to a top defined by a length dimension and a width dimension over the substrate, and edges along the height dimension. An inorganic material cap is on the top of the post, the cap covering the top of the post in the length dimension and the width dimension of the post, the cap extending beyond the edges of the post in at least the width dimension to define a first reentrant profile. A first electrode is located over the cap. A second electrode is located over the substrate and not over the post and adjacent to the reentrant profile such that a distance between the first electrode and second electrode is greater than zero when measured orthogonally to the substrate surface. The first electrode and second electrode have the same material composition and layer thickness.

BRIEF DESCRIPTION OF THE DRAWINGS

In the detailed description of the example embodiments of the invention presented below, reference is made to the accompanying drawings, in which:

FIGS. 1a and 1b are schematic cross-sectional and plan views, respectively, of an example embodiment of a vertical transistor of the present invention;

FIGS. 2a and 2b are schematic cross-sectional and plan views, respectively, of an example embodiment of a post, cap, and gate layers of a vertical transistor of the present invention;

FIGS. 5a and 5b are schematic cross-sectional and plan views, respectively, of another example embodiment of a vertical transistor of the present invention including an additional dielectric layer;

FIGS. 6 through 11 are schematic cross-sectional views of example embodiments of a post, cap, gate, and other material layers of a vertical transistor of the present invention;

FIGS. 14a and 14b through FIGS. 20a and 20b are schematic views showing vertical transistor formation using the process flow described in FIG. 12 with FIGS. 14a, 15a, 16a, 17a, 18a, 19a, and 20a being cross-sectional views and FIGS. 14b, 15b, 16b, 17b, 18b, 19b, and 20b being plan views;

FIGS. 21a and 21b through FIGS. 25a and 25b are schematic views showing source electrode and drain electrode formation using selective area deposition described in FIG. 13 with FIGS. 21a, 22a, 23a, 24a, and 25a being cross-sectional views and FIGS. 21b, 22b, 23b, 24b, and 25b being plan views;

FIGS. 26a and 26b through FIGS. 29a and 29b are schematic views of one example embodiment of cap formation with FIGS. 26a, 27a, 28a, and 29a being cross-sectional views and FIGS. 26b, 27b, 28b, and 29b being plan views;

FIGS. 30a and 30b through FIGS. 33a and 33b are schematic views of another example embodiment of cap formation in which the cap is aligned to a conductive layer under the post with FIGS. 30a, 31a, 32a, and 33a being cross-sectional views and FIGS. 30b, 31b, 32b, and 33b being plan views;

FIGS. 35a and 35b through FIGS. 51a and 51b are schematic views showing vertical transistor formation using the process flow described in FIG. 34 with FIGS. 35a, 36a, 37a, 38a, 39a, 40a, 41a, 42a, 43a, 44a, 45a, 45c, 46a, 47c, 49a, 49b, 49c, 50a, and 51a being cross-sectional views and FIGS. 35b, 36b, 37b, 38b, 39b, 40b, 41b, 42b, 43b, 44b, 45b, 46b, 47a, 47b, 48a, 48b, 48c, 50b, and 51b being plan views;

FIGS. 52a and 52b are schematic cross-sectional and plan views, respectively, of an example embodiment of a single vertical transistor of the present invention;

FIGS. 53a and 53b are schematic cross-sectional and plan views, respectively, of another example embodiment of a single vertical transistor of the present invention;

FIGS. 54a and 54b are schematic cross-sectional and plan views, respectively, of another example embodiment of a single vertical transistor of the present invention that includes a filler material;

FIGS. 56a and 56b through FIGS. 62a and 62b are schematic views showing vertical transistor formation using the process flow described in FIG. 55 with FIGS. 56a, 57a, 58a, 59a, 60a, 61a, and 62a being cross-sectional views and FIGS. 56b, 57b, 58b, 59b, 60b, 61b, and 62b being plan views;

FIGS. 63a and 63b are schematic cross-sectional and plan views, respectively, of an example embodiment of a vertical transistor of the present invention including two independently operable transistors formed over a single post and cap;

DETAILED DESCRIPTION OF THE INVENTION

Figure 3:
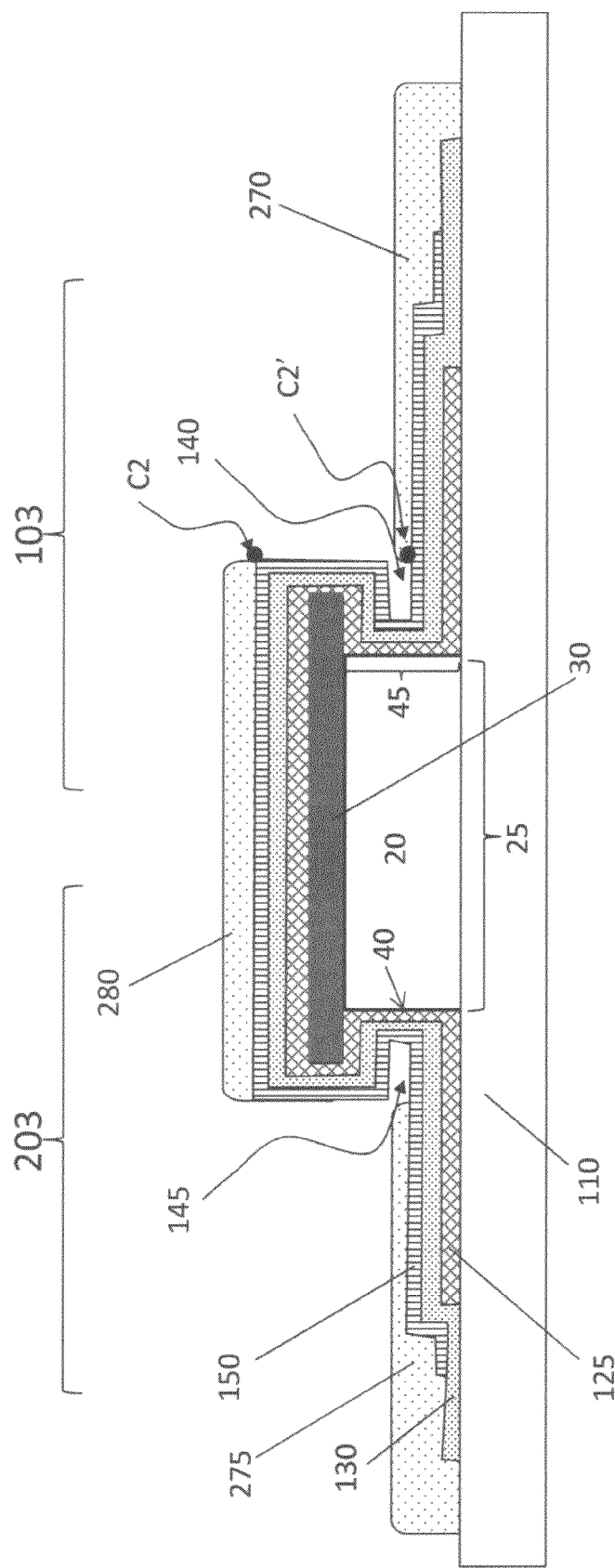
FIG. 3 is a schematic cross-sectional view of another example embodiment of a vertical transistor of the present invention formed using a line of sight deposition process.

The present description will be directed in particular to elements forming part of, or cooperating directly with, vertical transistors in accordance with the present invention. It is to be understood that elements not specifically shown or described may take various forms well known to those skilled in the art. In the following description and drawings, identical reference numerals have been used, where possible, to designate identical elements.

For the description that follows, the term "gas" or "gaseous material" is used in a broad sense to encompass any of a range of vaporized or gaseous elements, compounds, or materials. Other terms used herein including "reactant," "precursor," "vacuum," or "inert gas" have their conventional meanings as would be well understood by those skilled in the materials deposition art. The term "over" refers to the relative position of an element to another and is insensitive to orientation, such that if one element is over another, it is still functionally over if the entire stack is flipped upside down. As such, the terms "over," "under," or "on" are functionally equivalent and do not require the elements to be in contact, and do not prohibit the existence of intervening layers within a structure. The term "adjacent" is used herein in a broad sense to mean an element next to or adjoining another element. The figures provided are not drawn to scale but are intended to show overall function and the structural arrangement of some embodiments of the present invention.

The embodiments of the present invention all relate to short channel vertical thin film transistors (TFTs) which include a patterned structural polymer with an inorganic cap to define the vertical portion of the channel. The term "vertical transistor" as used herein refers to transistors where the source and drain which define a single channel are at two different distances from the substrate surface (as measured orthogonal to the substrate). This arrangement results in vertical transistors where at least a portion of the channel is vertically oriented with respect to the substrate, which is to say not parallel to the top surface of the substrate. Vertical transistors of the present invention include those with portions of their channels in an arrangement that is parallel to the substrate surface, as long as they also have a portion which is not parallel.

The phrase "structural polymer" as used herein refers to the polymeric material used in the formation of the polymer post and additionally useful to distinguish the structural polymer material from other polymeric materials or polymer layers that can be used in the process. The structural polymer is a polymer that is stable in the final application, and a wide variety of structural polymers can be used. Examples of structural polymers include polyesters, polyetheresters, polyamides, polyesteramides, polyurethanes, polyimides, polyetherimides, polyureas, polyamideimides, polyphenyleneoxides, phenoxy resins, epoxy resins, polyolefins, polyacrylates, polyethylene-co-vinyl alcohols (EVOH), and the like, or their combinations or blends. The preferred structural polymers are epoxy resins and polyimides. The structural polymer can be a thermoplastic polymer. The polymer can be a curable composition, including either thermal or radiation curable composition. The polymer does not need to be radiation curable or photosensitive, but photosensitive formulations are useful in the present invention so long as the final cured polymer layer has the structural and mechanical properties required in the final application.

Polyimide is a preferred structural polymer due to the combination of film properties such as low stress, low CTE, low moisture uptake, high modulus or good ductility for microelectronic applications. The rigid rod polyimide structure of Cured PI-2600 products available from Hitachi DuPont MicroSystems, for instance, are well suited for use as a dielectric layer for semiconductor applications. Epoxy resins are also preferred due to their thermal and chemical properties. Radiation curable compositions comprising a highly branched, multifunctional epoxy bisphenol A-novolac resins, such as Epon SU-8 from Momentive Specialty Chemicals Inc. is one example of a useful epoxy resin, although non-radiation curable compositions are more preferred.

The process of making the vertical thin film transistors of the present invention can be carried out below a support temperature of about 300° C., more preferably below 250° C., or even at temperatures around room temperature (about 25° C. to 70° C.). These temperatures are well below traditional integrated circuit and semiconductor processing temperatures, which enable the use of any of a variety of relatively inexpensive supports, such as flexible polymeric supports. Thus, embodiments of the invention enable production of relatively inexpensive devices on flexible substrates without the need for photolithography and enabling rapid pattern changes due to printing the patterns.

The substrates used in the present invention can be any material that acts as a mechanical support for the subsequently coated layers. The substrate can include a rigid material such as glass, silicon, or metals. Particularly useful metals are stainless steel, steel, aluminum, nickel, or molybdenum. The substrate can also include a flexible material such as a polymer film or paper. Useful substrate materials include organic or inorganic materials. For example, the substrate can include inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly (phenylene sulfide) (PPS), or fiber-reinforced plastics (FRP). The thickness of substrate 110 can vary, typically from about 100 μm to about 1 cm.

A flexible support or substrate can be used in the present invention. Using a flexible substrate allows for roll processing, which can be continuous, providing economy of scale and economy of manufacturing over flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils, for example, stainless steel, provided the foils are coated with an electrically insulating material layer to electrically isolate any electric components such as thin film transistors. Nominally rigid materials that are flexible due to their thinness can also be used. These include glass at thicknesses below 200 μm and metals at thicknesses below 500 μm.

In some example embodiments, the substrate can include a temporary support or support material layer, for example, when additional structural support is desired for a temporary purpose, e.g., manufacturing, transport, testing, or storage. In these example embodiments, the substrate can be detachably adhered or mechanically affixed to the temporary support. For example, a flexible polymeric support can be temporarily adhered to a rigid glass support to provide added structural rigidity during the transistor manufacturing process. The glass support can be removed from the flexible polymeric support after completion of the manufacturing process.

The substrate can be bare indicating that it contains no substantial materials on its surface other the material from which it is composed. The substrate can include various layers on the surface. These layers include subbing layers, adhesion layers, release layers, wetting layers, hydrophilic layers, and hydrophobic layers. The substrate surface can be treated in order to promote various properties. These treatments include plasma treatments, corona discharge treatments, or chemical treatments.

The substrate can also include on its surface patterned materials. These patterns can include patterns that modulate light transmission or electrical conductivity within or on the substrate. The patterns can include complete devices, circuits, or active elements existing on the substrate. The patterns can include portions of devices, circuits, or active elements awaiting subsequent processing steps for completion.

In the present invention, the formation of the patterned structural polymer layers is accomplished using patterned thin film inorganic materials. The patterning of the thin film inorganic material on top of the structured polymer layer can be done using standard photolithographic techniques or through the use selective area deposition (SAD) in combination with atomic layer deposition (ALD) to form a patterned thin film inorganic material layer on top of the structural polymer layer. SAD employs a patterned material referred to as a "deposition inhibitor material", "deposition inhibiting material", or simply an "inhibitor" that inhibits the growth of a thin film material on the substrate when the substrate is subjected to an atomic layer deposition. By inhibiting the growth where the deposition inhibitor material is present, the ALD process only deposits material in regions (selective areas) of the substrate where the inhibitor is not present. The phrases "deposition inhibitor material", "inhibitor material" and their equivalents refer herein to any material on the substrate that inhibits the deposition of material during atomic layer deposition (ALD). The "deposition inhibitor material" includes the material applied to the substrate as well as the material resulting from any optionally subsequent crosslinking or other reaction that modifies the material that can occur prior to depositing an inorganic thin film on the substrate by atomic layer deposition. A polymeric deposition inhibitor material can be crosslinked after applying the polymer onto the substrate, before or during the patterning step.

The vertical thin film transistors of the present invention are composed of dielectric, semiconductor and conductor materials. In preferred embodiments of the present invention the dielectric, semiconductor and conductor materials are inorganic thin films. A dielectric material is any material that is a poor conductor of electricity. Such materials typically exhibit a bulk resistivity greater than $10^{10}$ Ω-cm. Examples of dielectrics are $SiO2$, $HfO$, $ZrO$, $Si_xN_y$, or $Al_2O_3$. A semiconductor is a material in which electrical charges can move but in which the concentration of electrical charges can be substantially modulated by external factors such as electrical fields, temperature, or injection of electrical charges from a neighboring material. Examples of semiconductors include silicon, germanium, or gallium arsenide. Particularly preferred semiconductors are zinc oxide, indium zinc oxide, or gallium indium zinc oxide. The semiconductors can be doped to render them n-type or p-type, or to modulated the number of charge carriers present. Conductors of the present invention include metals, such as Al, Ag, Au, Cr, Mo, or In and inorganic conducting oxides, such as indium doped tin oxide (ITO) or aluminum-doped zinc oxide (AZO).

The dielectric and semiconductor inorganic materials layers are conformal, and are preferably deposited using an atomic layer deposition (ALD) process. ALD is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials commonly referred to as precursors, in a vacuum chamber. A first precursor is applied to react with the substrate. The excess of the first precursor is removed from the vacuum chamber. A second precursor is then applied to react with the first precursor on the substrate. The excess of the second precursor is removed from the vacuum chamber and the process is repeated.

Recently, a new ALD process has been developed which negates the need for a vacuum chamber. This process, commonly referred to as S-ALD, is described in at least one of U.S. Pat. No. 7,413,982, U.S. Pat. No. 7,456,429, U.S. Pat. No. 7,789,961, and US 2009/0130858, the disclosures of which are incorporated by reference herein. S-ALD produces coatings with thicknesses that can be considered consistent, uniform, or even exact. S-ALD produces coatings that can be considered conformal or even highly conformal material layers. S-ALD is also compatible with a low temperature coating environment. Additionally, S-ALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, S-ALD is well suited for manufacturing the present invention.

The preferred process of the present invention includes S-ALD, a continuous spatially dependent ALD (as opposed to pulsed or time dependent ALD). The process of the present invention allows operation at atmospheric or near-atmospheric pressures and is capable of operating in an unsealed or open-air environment. The process of the present invention is adapted such that material is deposited only in selected areas of a substrate.

Atomic layer deposition can be used in embodiments of the present invention to deposit a variety of inorganic thin films that are metals or that include a metal-containing compound. Such metal-containing compounds include, for example (with respect to the Periodic Table) a Group V or Group VI anion. Such metal-containing compounds can, for example, include oxides, nitrides, sulfides or phosphides of zinc, aluminum, titanium, hafnium, zirconium or indium, or combinations thereof.

Oxides that can be made using the process of the present invention include, but are not limited to, zinc oxide (ZnO), aluminum oxide (Al2O3), hafnium oxide, zirconium oxide, indium oxide, tin oxide, and the like. Mixed structure oxides that can be made using the process of the present invention can include, for example, InZnO. Doped materials that can be made using the process of the present invention can include, for example, ZnO:Al, MgxZn1-xO, or LiZnO.

Metals that can be made using the process of the present invention include, but are not limited to, copper, tungsten, aluminum, nickel, ruthenium, or rhodium. It will be apparent to the skilled artisan that alloys of two, three, or more metals can be deposited, compounds can be deposited with two, three, or more constituents, and such things as graded films and nano-laminates can be produced as well.

These variations are simply variants using particular embodiments of the invention. There are many other variations within the scope of the invention, so the invention is limited only by the claims that follow. The material chosen for the inorganic thin film layer will depend on the application and function of the desired device. All of the materials detailed above will function as a hard mask for patterning the underlying structural polymer layer and are useful as an inorganic cap. Preferred materials for the inorganic thin film cap include $Al_2O_3$, $SiO_2$, HfO, ZrO, $TiO_2$, $Ta_2O_5$, $Si_xN_y$, ZnO, or a doped-ZnO material. The thickness of the inorganic material layer will also depend on the application; however thicknesses between 5 nm and 100 nm are preferred. As such, depositing the inorganic thin film using an atomic layer deposition process preferably deposits less than 100 nm. Inorganic thin film layers greater than 100 nm are also useful, but may take a long time to deposit. These are only used when dictated by the application. For use in inorganic-with-polymer structures where a portion of the inorganic thin film is unsupported, as in the case for structures having a reentrant profile, it is preferred that the inorganic thin film have a sufficient thickness to be self-supporting, preferably greater than 10 nm.

According to one embodiment of the invention, a thin film transistor structure includes a substrate and a polymeric material post on the substrate. The post has a height dimension extending away from the substrate to a top and an edge along the height dimension. On the top of the post is an inorganic material cap, the cap covering the top of the post, and extending beyond the edge of the post to define a reentrant profile. A conformal conductive material gate layer is over the edge of the post in the reentrant profile. A conformal insulating material layer is on the gate layer in the reentrant profile. A conformal semiconductor material layer is on the insulating material layer in the reentrant profile. A first electrode is located in contact with a first portion of the semiconductor layer over the cap, and a second electrode is located in contact with a second portion of the semiconductor layer over the substrate and not over the post, and adjacent to the reentrant profile. A distance between the first electrode and second electrode is greater than zero when measured orthogonally to the substrate surface, and the first electrode and the second electrode define a transistor having a channel in the semiconductor layer between the first electrode and the second electrode.

Turning now to the Figures, a schematic cross-sectional view of vertical transistors 100 and 200 of the present invention is shown in FIG. 1a, taken along the line A-A' of the plan view shown in FIG. 1b. As shown in FIG. 1a, TFTs 100 and 200 are each a vertical transistor structure, where the vertical portion is defined by a polymer post 20 with and inorganic cap 30. The gate layer 125 is in contact with at least the edges 40 the post 20, the insulating layer 130 is in contact with the gate 125, and the semiconductor layer 150 is in contact with the first electrode 180. The polymer post 20, inorganic cap 30, and gate layer 125 form an electrically conductive gate structure 120 having a first reentrant profile 140 and a second reentrant profile 145.

Vertical transistors 100 and 200 are connected in series and formed over a single post structure. For simplicity, the following description will focus on vertical transistor 100 with the understanding that the descriptions apply equally to vertical transistor 200. Vertical transistor 100 includes a substrate 110. Substrate 110, often referred to as a support, can be rigid or flexible and should be understood from the previous description. A polymeric material post 20 is on substrate 110. The post 20 has a height dimension 45 extending away from the substrate 110 to a top defined by a length dimension and a width dimension 25 over the substrate 110. The post 20 has edges 40 along the height dimension. An inorganic material cap 30 is on top of the post 20. The cap 30 covers the top of the post 20 in the length dimension and the width dimension 25 of the post. The cap 30 extends beyond the edges of the post in at least the width dimension 25. A conformal conductive material is included in the gate layer 125 on the edges 40 of the post 20 and over at least a portion of the substrate 110. As shown in FIG. 1a, the gate layer 125 conformally covers the cap 30, the edges 40 of the post 20, and is also in contact with the substrate 110. The portion of the cap 30 which extends beyond the edges 40 of the post 20 forms a first reentrant profile 140 and a second reentrant profile 145.

Briefly turning to FIGS. 2a and 2b, a schematic cross-sectional view of the electrically conductive gate structure 120, including post 20, cap 30, and gate layer 125, is shown in FIG. 2a, taken along the line A-A' of the plan view shown in FIG. 2b. As shown in FIG. 2b, the post 20 has a length dimension 35 and a width dimension 25. The cap 30 extends beyond the post 20 in the length and width dimensions as shown in FIGS. 2a and 2b. The gate layer 125 conformally covers the post 20 and cap 30, and extends beyond the base of the post 20 to contact substrate 110. In other example embodiments of the invention, the gate layer 125 covers only the edges 40 of the post 20 in the areas of the first reentrant profile 140, and optionally the second reentrant profile 145. The polymeric material post 20 has a height dimension 45 extending away from the substrate 110. The height of the post defines the shortest obtainable channel length for vertical transistor 100 or 200. It is an advantage of the present invention that channel lengths are easily obtainable using the post 20 and cap 30 structure that are not easily obtainable using standard photolithography. It is preferred that the height of the post 20 that is less than or equal to 10 microns. In some example embodiments, the post 20 is less than or equal to 2 microns. In still other example embodiments, the post 20 is less than or equal to 1 micron, and can be as short as 0.3 microns to minimize the vertical transistor channel length. The cap 30 extends beyond the edge of the post 20 and, therefore, should have structural integrity. It is preferred that the cap 30 extends beyond the edge 40 of the post 20 by a distance that is less than the height 45 of the post 20.

Returning now to FIGS. 1a and 1b, insulating layer 130 conforms to the reentrant profiles 140 and 145 of transistors 100 and 200. Insulating layer 130 is in contact with the gate layer 125. As insulating layer 130 is a conformal insulating material layer, it can be said to coat and maintain the reentrant profiles 140 and 145. Insulating layer 130 is often referred to as a dielectric material layer, or simply a dielectric layer, and can be formed of a single material layer or multiple dielectric material layers. Preferably the insulating layer 130 is a thin film inorganic dielectric material layer. Semiconductor material layer 150 is in contact with the insulator layer 130 and also conforms to and maintains the shape of the first reentrant profile 140 and second reentrant profile 145 of transistors 100 and 200. As such, semiconductor material layer 150 is a conformal semiconductor material layer. Preferably the semiconductor layer 150 is a thin film inorganic semiconductor material layer.

The source and drain of transistor 100, 200 have conventionally accepted meanings, and either the first electrode 180 or the second electrode 170 can be designated the source (or drain) as is required by the application or circuit. The first electrode 180, second electrode 170 and third electrode 175 can be a single conductive material, as shown in FIG. 1a, or can include any number of conductive material layers (commonly referred to as a conductive layer stack). The first electrode 180 is located in contact with a first portion of the semiconductor layer over the cap. The second electrode 170 electrode is located in contact with a second portion of the semiconductor layer over the substrate and not over the post, as shown in FIG. 1a. The first electrode 180 and second electrode 170 electrode define a first channel in the semiconductor layer between the first electrode 180 and second electrode 170. The first electrode 180 has an edge into the plane of FIG. 1a along the line defined by point C1. As shown in FIG. 1a, point C1 is above the substrate surface. Similarly, the second electrode 170 has an edge into the plane of FIG. 1a along the line defined by point C1'. As shown in FIG. 1a, the first electrode 180 and second electrode 170 electrodes are different distances from the substrate surface (see points C1 and C1'). Stated another way, the distance between the first electrode 180 and second electrode 170 is greater than zero when measured orthogonal to the substrate surface. Together with the gate structure, insulating layer, and semiconductor layer, this forms the first transistor 100, including a portion of the channel which is vertical with respect to the substrate surface.

As shown in FIG. 1a, the vertical TFT 100 is formed in series with vertical TFT 200. In this configuration there are three electrodes, a second electrode 170 for TFT 100 not over the post 20, the shared first electrode 180 over the cap 30 and post 20, and a third electrode 175 for TFT 200 not over the post 20 (on the side opposite the post 20 from the second electrode 170 electrode of TFT 100. As shown, the post 20 has another edge 40 along the height dimension and the cap 30 extends beyond the other edge 40 of the post to define a second reentrant profile 145. The third electrode 175 is located in contact with a third portion of the semiconductor layer over the substrate 110 and not over the post 20, and adjacent to the second reentrant profile 145. The distance between the first electrode 180 and third electrode 175 is greater than zero when measured orthogonal to the substrate surface. The first electrode 180 and the third electrode 175 define a second transistor 200 having a channel in the semiconductor layer between the first electrode 180 and the third electrode 175.

Accordingly, the first electrode 180 and the second electrode 170 define the channel of the first TFT 100, and the third electrode 175 and the first electrode 180 define the channel of the second TFT 200. The configuration shown in FIGS. 1a and 1b allows contact to the vertical transistors 100 and 200 to be made on the substrate level so the transistors are operated in series, rather than making connection at the top of the electrically conductive gate structure 120. It should be understood that the present invention includes a single vertical transistor where the electrodes are disposed as 170 and 180 in FIG. 1a. As shown, the electrically conductive gate structure 120 functions as the gate for transistors 100 and 200. In some example embodiments of transistor 100, electrode 170 functions as the drain of transistor 100 and electrode 180 functions as the source of transistor 100. In other example embodiments of transistor 100, electrode 170 functions as the source and electrode 180 functions as the drain. The semiconductor device is actuated in the following manner. After transistor 100 is provided, a voltage is applied between the electrode 170 and the electrode 180. A voltage is also applied to the electrically conductive gate structure 120 to electrically connect the electrode 170 and the electrode 180.

Still referring to FIGS. 1a and 1b, vertical transistor 200 is formed at the same time as vertical transistor 100 is formed. Transistor 200 can be actuated in the following manner. A voltage is applied between the electrode 175 and the electrode 180, which is shared with vertical transistor 100. A voltage is applied to the gate layer stack 120, which is shared with vertical transistor 100, to electrically connect the electrode 175 and 180.

Figure 11:
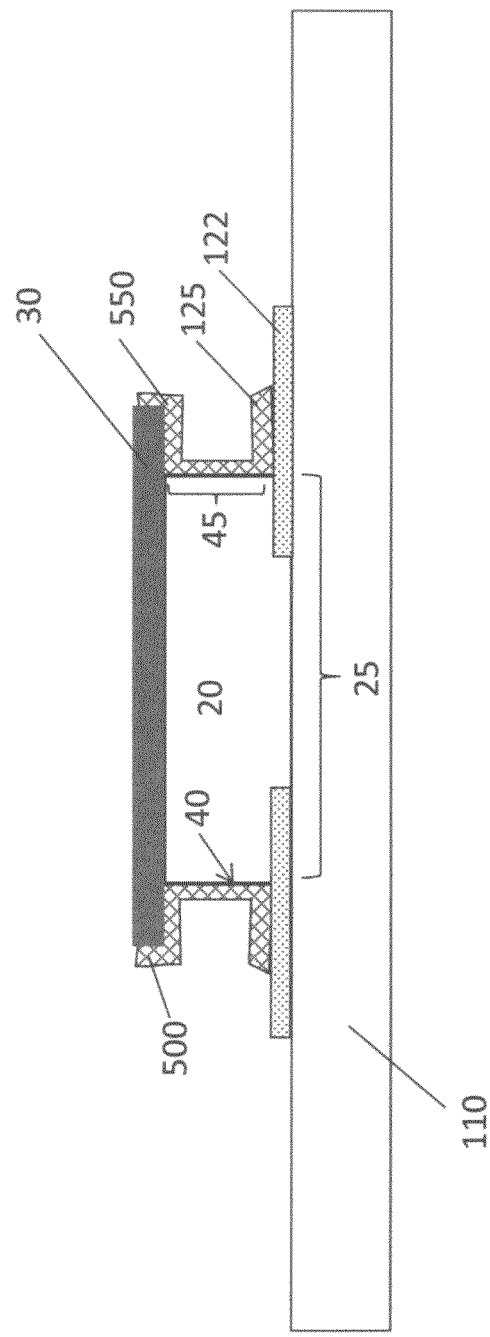

Alternatively, transistor 100 and transistor 200 can be actuated in series by applying a voltage between electrode 170 and electrode 175. A voltage is applied to the gate layer stack 120, which simultaneously electrically connects electrode 180 to electrode 170 and connects electrode 180 to electrode 175. This can be advantageous for circuit applications because external electrical connections do not need to be made to the elevated third electrode 180. In other example embodiments of the invention, the electrically conductive gate structure 120 can independently gate transistor 100 and 200. In these embodiments, the electrically conductive gate structure 120 can be formed as shown in FIGS. 9 through 11.

The reentrant profile 140 of transistor 100 allows a dimension of the semiconductor material channel of the transistor to be associated with the thickness of the electrically conductive gate structure 120, which is defined by the height of the post 20, of transistor 100. Advantageously, this architecture of the present invention reduces reliance on high resolution or very fine alignment features during the manufacture of transistors that include short channels. Furthermore, the separation of the first electrode 180 and second electrode 170 is primarily determined by the reentrant profile 140 in the gate layer stack. Additionally, the first electrode 180, the second electrode 170, and the third electrode 175 are formed simultaneously and have the same material composition and layer thickness.

As shown, the second electrode 170 and the third electrode 175 are located adjacent to the first and second reentrant profiles 140, 145, respectively. The second electrode 170 and the third electrode 175 are vertically spaced from the first electrode 180 due to the height of the electrically conductive gate structure 120. The second electrode 170 and the first electrode 180 defining a first channel having ends of the first transistor 100 and the third electrode 175 and the first electrode 180 define a second channel having ends of the second transistor 200.

The structure shown in FIGS. 1a and 1b can be formed from many different materials. The first electrode 180, the second electrode 170, and the third electrode 175 can be any conductive material, and in some embodiments are transparent conductive oxides. It is one advantage of the present invention that the vertical transistors can be fully transparent. It is also an advantage that all of the materials can be metal oxides that are deposited from a common piece of equipment. For clarity, the inorganic material cap, the conformal conductive material gate layer, the conformal insulating material layer, the conformal semiconductor material layer, the first electrode, the second electrode, and the third electrode can each include a metal oxide. The post 20 includes a polyester, polyetherester, polyamide, polyesteramide, polyurethane, polyimide, polyetherimide, polyurea, polyamideimide, polyphenyleneoxide, phenoxy resin, epoxy resin, polyolefin, polyacrylate, polyethylene-co-vinyl alcohol, or a copolymer thereof, or a mixture thereof. Preferably, the post 20 includes an epoxy resin or polyimide.

The polymer post 20 and cap 30 allow for multiple vertical transistor geometries, depending on the processing tools available. Referring to FIG. 3, a schematic cross-sectional view of vertical transistors 103 and 203 of another example embodiment of the present invention is shown. The vertical transistors 103 and 203 are identical in components and operation to the vertical transistors 100 and 200 shown in FIG. 1a. The embodiment shown in FIG. 3 is representative of vertical transistors 103 and 203 formed by a line-of-sight deposition process for the first electrode 280, the second electrode 270 and the third electrode 275. Line-of-sight deposition processes include evaporation and sputtering. As shown, the first electrode 280 and the second electrode 270 are aligned near vertically. The first electrode 280 has an end (C2) and the second electrode 270 has an end (C2'), the end (C2) of the first electrode 280 and the end (C2') of the second electrode 270 are vertically aligned.

Figure 4:
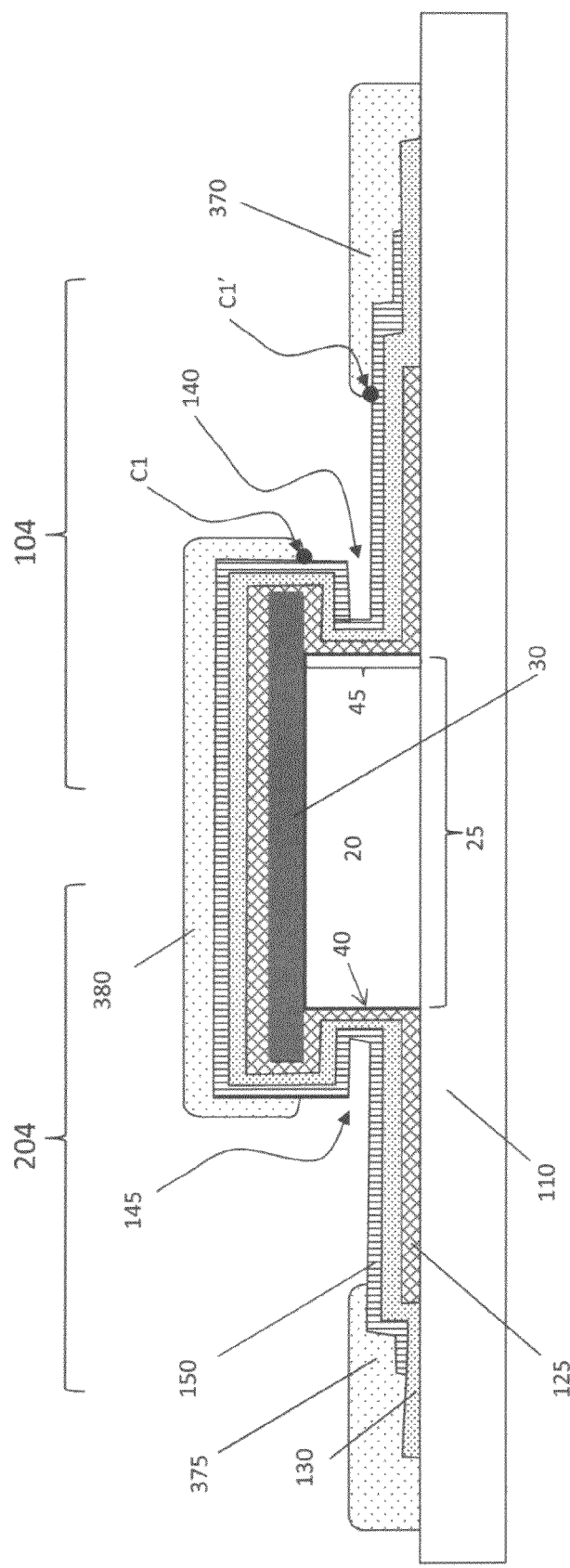
FIG. 4 is a schematic cross-sectional view of another example embodiment of a vertical transistor of the present invention including a longer channel.

Another example embodiment of the present invention is shown in the schematic cross-sectional view of vertical transistors 104 and 204 of FIG. 4. The vertical transistors 104 and 204 are identical in components and operation to the vertical transistors 100 and 102 shown in FIG. 1a. The embodiment shown in FIG. 4 is representative of vertical transistors 104 and 204 formed by a selective area deposition (SAD) process where the first reentrant profile 140 and second reentrant profile 145 are filled with a deposition inhibitor by capillary action, and the first electrode 380, the second electrode 370 and the third electrode 375 are deposited using ALD. As shown, the first electrode 380 and the second electrode 370 are spaced further apart resulting in a longer channel length of the first transistor 104 than seen in the previous embodiments shown in FIG. 1a by transistor 100 and in FIG. 3 by transistor 103. As shown, a SAD process results in vertical transistors where a portion of the channel is vertically oriented with respect to the substrate, which is to say is not parallel to the top surface of the substrate. Vertical transistors 104 and 204 of the present invention have portions of their channels in an arrangement that is parallel to the substrate surface in addition to the portion which is not parallel.

The wicking process used to form vertical transistor 104 of FIG. 4 typically results in the inhibitor wetting out of the reentrant profile onto the substrate. The channel defined by the first electrode 380 and the second electrode 370 preferably has a length dimension that is less than 10 times the height 45 of the post 20. The use of a wicked deposition inhibitor also results in a channel that has a length that varies along the length 35 dimension (into the page) of the post 20, as shown in FIG. 4. The distance between C1 and C1' will vary along the width of the channel of the transistor 104. The channel defined by the first electrode 380 and the second electrode 375 has a width dimension and a length dimension, and the length dimension varies along the width dimension of the transistor 104.

Turning to FIGS. 5a and 5b, a schematic cross-sectional view of another example embodiment of the present invention is shown in FIG. 5a, taken along the line A-A' of the plan view shown in FIG. 5b. As shown in FIGS. 5a and 5b, there is a conformal dielectric material layer 115 on the cap 30, the edges 40 of the post 20, and at least a portion of the substrate 110. The conformal dielectric layer is located at least between the gate layer 125 and the post 20. As shown in FIG. 5a, TFTs 105 and 205 are a vertical transistor structure, where the vertical portion is defined by a polymer post 20 with and inorganic cap 30, which is covered by a conformal dielectric material layer 115. Conformal conductive material gate layer 125 is at least over the edges of the post 20 and in contact with the dielectric material layer 115. The insulating layer 130 is in contact with the gate and the dielectric material layer 115, and the semiconductor layer 150 is in contact with the second electrode 175. With the exception of the conformal dielectric material layer 115, the elements of the vertical thin film transistor 105 and 205 shown in FIGS. 5a and 5b are the same as those for vertical thin film transistors 100 and 200 and should be understood from the descriptions of FIGS. 1a and 1b. The dielectric material layer 115 in this embodiment serves to encapsulate the polymer post, and provides a single material surface for building the vertical transistor of the present invention. In this embodiment, the electrically conductive gate structure 120 includes the post 20, cap 30, dielectric material layer 115 and the conductive material gate layer 125. The addition of dielectric material layer 115 can be used to avoid issues of non-uniform nucleation or thin film growth of the gate layer 125 on the post 20 and substrate surfaces 110. Preferably, the dielectric material layer 115 is an inorganic thin film dielectric material layer. The dielectric material layer 115 is a conformal layer, which is preferably deposed using ALD due to the conformal nature of the ALD process. As shown the dielectric material layer 115 maintains the first and second reentrant profiles, 140 and 145.

FIGS. 2a, 2b and 7 through 12 serve to illustrate various configurations of electrically conductive gate structure 120. It should be understood with respect to the description of FIGS. 1a and 1b how these electrically conductive gate structures 120 are incorporated into a vertical transistor of the present invention. In all example embodiments of gate structure 120, the cap 30 extends beyond the post in at least the width dimension 25, and preferably in both the length dimension 35 and the width dimension 25, as shown in FIGS. 2a and 2b. In FIG. 2a, the gate layer 125 conformally covers the post 20 and cap 30, and extends beyond the base of the post 20 to contact substrate 110. In embodiments where the gate layer 125 contacts the substrate, the area of contact is only limited by fabrication processes, and can be, for example, a small area at the wall 40 of the post 20, or extend along substrate 110.

Figure 6:
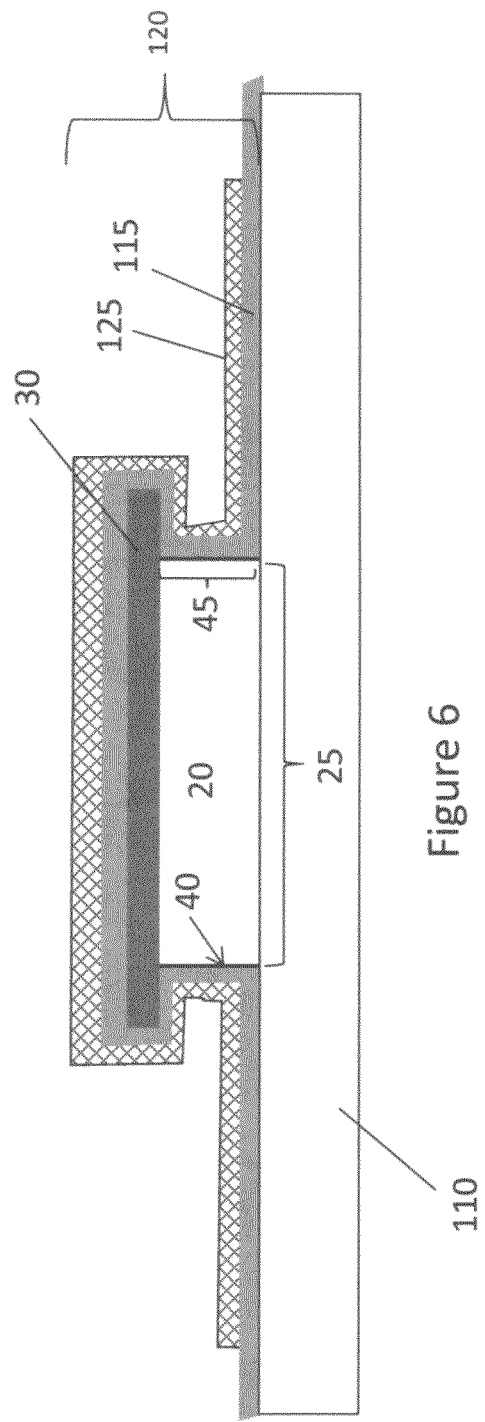

Turning now to FIG. 6, another example embodiment is shown where the post 20, cap 30 and substrate 110 are covered by a conformal dielectric layer 115. In embodiments of the present invention including a conformal dielectric layer 115, the gate layer 125 is not required to, and may not, contact the substrate 110 or the post wall 40 directly. Instead, the gate layer 125 is in contact with the dielectric layer 115 over the wall 40 and substrate 110. This embodiment of the electrically conductive gate structure 120 should be understood from FIG. 6, and FIGS. 5a and 5b.

Figure 7:
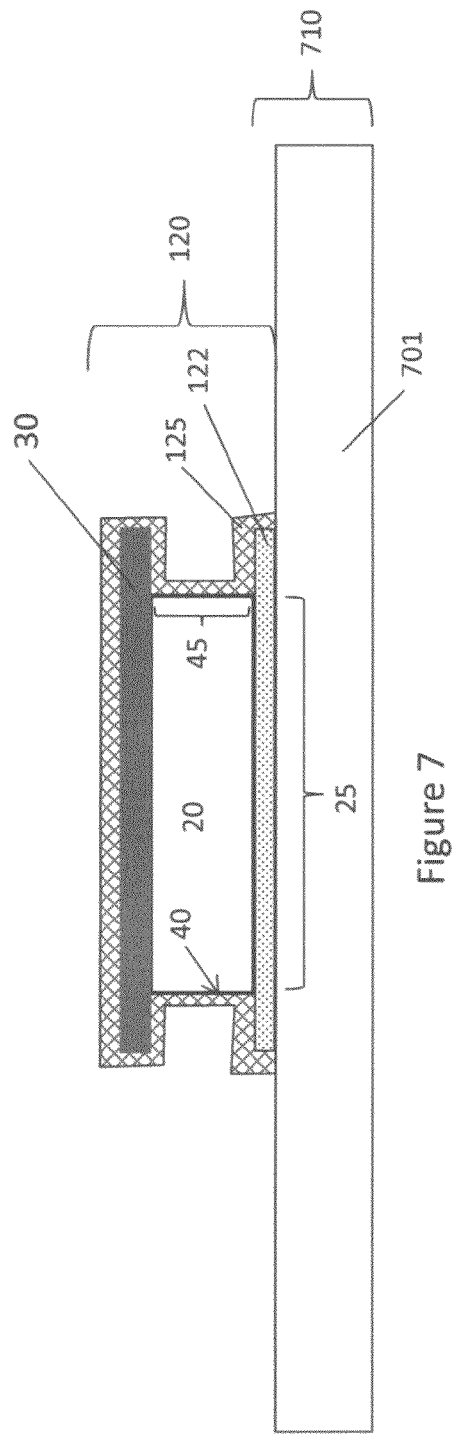

FIG. 7 shows an example embodiment of the present invention where the gate layer 125 is in contact with a conductive layer 122. In FIG. 7, the conductive layer 122 is in contact with the substrate 701, and is under post 20. In this embodiment of the present invention, the electrically conductive gate structure 120 includes a post 20, cap 30, gate layer 125 and a conductive layer 122 under post 20 as shown in FIG. 7. When forming the electrically conductive gate structure 120 with these components, the conductive layer 122 is supplied on the substrate 701 prior to forming the structural polymeric post 20. As such, in this embodiment the substrate 710 includes both the support 701 and the patterned conductive layer 122. As shown in FIG. 7, the conductive material layer 122 and the inorganic material cap 30 are vertically aligned and have the same pattern within the area of the transistor.

Figure 8:
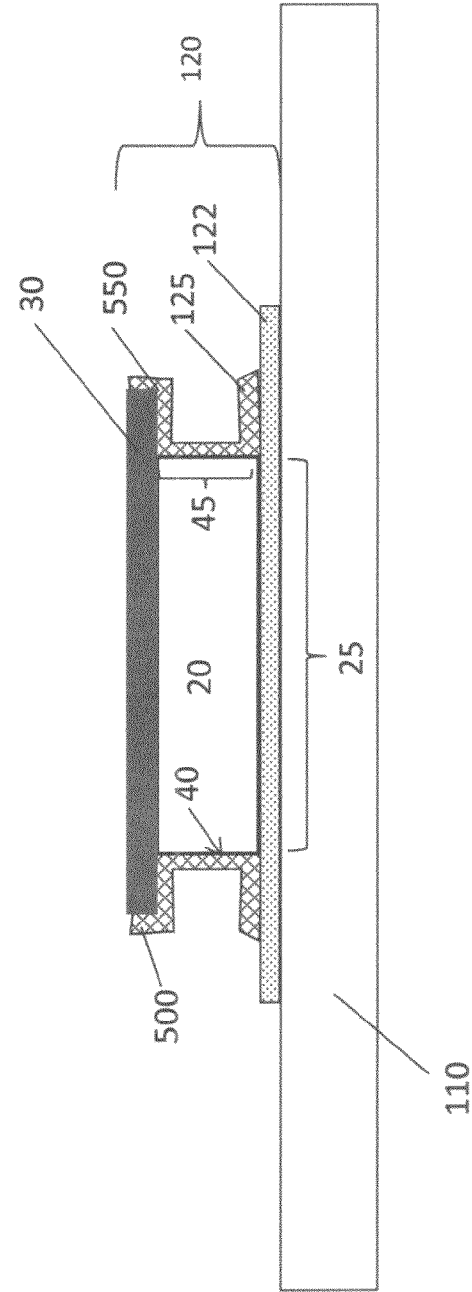

FIG. 8 is another embodiment of the present invention having a conductive layer 122, and reduced capacitance. As in FIG. 7, the electrically conductive gate structure 120 has another conductive material layer 122 positioned at least under a portion of the polymeric material post 20 and in electrical contact with the conformal conductive material gate layer 125. As shown in FIG. 8, however, the gate layer 125 is composed of two sections 500 and 550 which are in contact with conductive layer 122 and are on the side walls 40 of post 20, but do not cover the cap 30. This arrangement of gate layer 125 reduces the capacitance of the vertical transistors when used in the vertical transistor architecture described in relationship to FIGS. 1a and 1b. In this embodiment, conductive layer 122 serves to physically and electrically connect the two portions 500 and 550 of gate layer 125. The vertical transistors having the gate layer 125 of FIG. 8, with two portions 500 and 550, functions in the same manner as the vertical transistors 100 and 200 of FIGS. 1a and 1b.

FIG. 9 is another example embodiment of the present invention having a dielectric layer 115 which is in contact with the cap 30, post 20 and substrate 110. As shown in FIG. 9, the gate layer 125 does not fully cover the cap 30. The space 940 in between the two portions 920 and 925 of the gate layer 125 reduces the capacitance of the vertical transistors when used in the vertical transistor architecture described in relationship to FIGS. 1a and 1b. This allows for faster circuits to be fabricated using these methods. This patterning of the gate layer 125 can be accomplished by standard photolithographic methods or by the use of selective area deposition in combination with ALD.

FIG. 10 is another embodiment of the present invention having reduced capacitance. As shown, the gate layer 125 is composed of two sections 500 and 550 which are in contact with the side walls 40 of post 20 but do not cover the cap 30. In this embodiment, the two sections 500 and 550 are each confined to be within the dimensions of the first and second reentrant profiles 140 and 145, and do not extend beyond the dimensions of the cap 30 on the substrate. Thus, the conformal conductive material gate layer 125 is only located in the first reentrant profile 140 and in the second reentrant profile 145 in the region of the channels. The two sections of the gate layer 125 can be connected to a separate conductive layer 122 which serves to physically and electrically connect the two portions 500 and 550 of gate layer 125 forming two transistors in series as a variation of the embodiment shown in FIG. 8. The vertical transistors having the gate layer 125 of FIG. 10, with two portions 500 and 550, functions in the same manner as the vertical transistors 100 and 200 of FIGS. 1a and 1b.

FIG. 11 is another example embodiment of the present invention of the post 20, cap 30 and gate layer 125 which, when used in place of the elements in FIG. 1, results in two separate vertical transistors on opposite sides of the post 20, separated by the width 25 of post 20. In this embodiment, the conductive layer 122 is patterned to be discontinuous, so that there is no connection under the post 20. When used in vertical transistors of the present invention, the second electrode 170 and third electrode 175 can be located adjacent to the first and second reentrant profiles 140,145 respectively, on either side of post 20 and not over the cap 30, and the first electrode 180 can be common, over the cap 30, and function as the source electrode for both vertical transistors. Alternatively, the two transistors can be completely separate by splitting the first electrode 180, over the cap 30, into two separate electrodes; such that the two separate vertical transistors are formed using a single post 20 and cap 30 (referring to FIG. 63a).

It should be understood that all of the structures of FIGS. 7 through 11 can be used in place of the electrically conductive gate structure 120 shown in FIGS. 1a and 1b, and are considered to be example embodiments of the present invention. As such, the example embodiments of the vertical transistors of the present invention should be understood to work with any electrically conductive gate structure 120 which meets the requirements as defined herein, and is not limited to the ones illustrated. As defined, the electrically conductive gate structure 120 has a first reentrant profile 140 formed by polymer post 20 and inorganic cap 30 which extend beyond the edges of the post 20, and a conformal conductive gate layer 125.

Example embodiments of vertical transistors of the present invention includes a polymer post 20 and inorganic cap 30, which define a reentrant profile 140 and a vertical portion of the device channel. These example embodiments demonstrate the benefits of the inventive architectures over planar devices and other vertical transistor architectures composed of similar materials. One process of the present invention for forming a vertical transistor will be briefly described. The process includes providing a substrate. A structural polymer layer is provided on the substrate. A patterned inorganic thin film is formed on the structural polymer layer, leaving exposed portions of the structural polymer layer not under the inorganic thin film. The exposed portions of the structural polymer layer and portions of the structural polymer layer between the patterned inorganic thin film and the substrate are removed to form a structural polymer post having an inorganic cap that extends beyond an edge of the structural polymer post to define a reentrant profile. A conformal conductive gate layer is formed in the reentrant profile. A conformal dielectric layer is formed on the gate layer in the reentrant profile. The conformal semiconductor layer is formed on the dielectric layer. A first electrode is formed in contact with a first portion of the semiconductor layer located over the cap and a second electrode located in contact with a second portion of the semiconductor layer over the substrate and not over the post.

Figure 12:
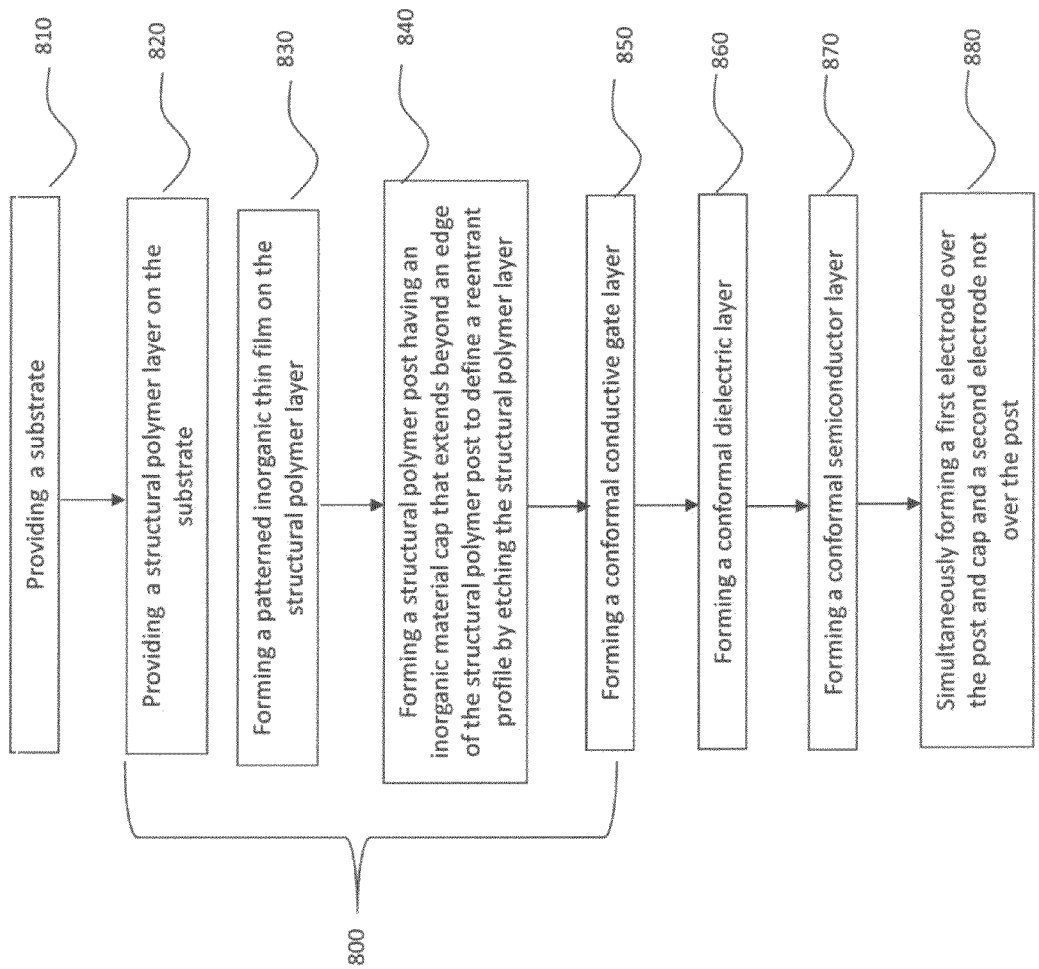
FIG. 12 is a flow chart describing an example embodiment of a process of forming a vertical thin film transistor having a polymer post according to the present invention.

A step diagram describing a process of fabricating example vertical transistors of the present invention is shown in FIG. 12. In Step 810, a substrate is provided into the system. The substrate can be any substrate as discussed that is suitable for use with the vertical transistors of the present invention. The provided substrate can have patterned layers. Providing the substrate can include providing a patterned conductive layer on the substrate prior to providing the structural polymer layer in Step 820. In Step 820, a structural polymer layer is provided on the substrate surface. The structural polymer can be any polymer that is stable in the final vertical transistor structure and should be understood from the previous descriptions. In this step, the structural polymer layer can cover only a portion of the substrate in some example embodiments. In some embodiments the structural polymer is deposited in a polymer layer having a thickness between 0.2 and 2 microns.

In Step 830, a patterned inorganic thin film layer is formed on the structural polymer layer. This step is preferably done using ALD, more preferably using spatial ALD. It is preferred that the inorganic thin film be a dielectric material. Prior to depositing the inorganic thin film in Step 830, the surface of the structural polymer layer can be optionally treated (not shown). The treatment can be done to activate the surface of the structural polymer layer to facilitate the growth of the inorganic thin film on the surface of the structural polymer layer. The treatment should be understood from the previous discussion and can include using UV-ozone or plasma processes. The inorganic thin film layer can be patterned as deposited in Step 830 by using the combination of selective area deposition and ALD. Alternatively, the inorganic thin film layer can be deposited uniformly and patterned using any method known in the art, including using a photolithographic process. The patterned inorganic thin film layer at least includes the pattern of the inorganic thin film cap.

In Step 840, the polymer post having an inorganic material cap is formed by etching the structural polymer layer. Specifically, Step 840 removes the portions of the structural polymer layer not covered by the patterned inorganic thin film, and portions of the structural polymer layer that are under the inorganic thin film to create a post 20 with an inorganic cap 30 that extends beyond the edges of the post. This arrangement of the post and inorganic cap defines a reentrant profile. This step can be done using two different processes, or preferably in a single process. In some embodiments using selective area deposition, the patterned inhibitor layer can be removed prior to the removal of the portions of the structural polymer layer by a liquid process using a solvent or a detergent or by vapor process. In some embodiments using SAD, the patterned inhibitor layer can be removed by the same etching process that removes portions of the structural polymer layer.

Processes for etching the structural polymer layer include exposing the substrate to a vapor reactant that causes removal of the structural polymer. The removal can happen spontaneously upon reaction with the vapor, resulting in the conversion of the inhibitor to a volatile species. Alternatively, the vapor exposure can react with the structural polymer converting it to another species or morphology that is then more easily removable with another process, such as a liquid process. The vapor exposure can include forms of energy to promote the process. These include light exposure, arcs or plasmas. Particularly desired light exposures include UV exposure, especially in the presence of oxygen to produce ozone. Plasmas include plasmas of various species including oxygen, chlorine, and fluorine. Plasmas created with these materials or with precursors that produce these materials are included in the present invention. The removal portions of the structural polymer layer can be accomplished by a single exposure to a highly reactive oxygen processes including a UV-ozone process (UVO) or O2 plasma. The highly reactive oxygen processes can be a batch process using a chamber based tool or continuous process using web process tools. The highly reactive oxygen processes can be at sub-atmospheric (vacuum) pressure or atmospheric pressure.

After the post and cap structure has been formed, the substrate, the post, and the cap optionally can be coated with a dielectric material (not shown). In these embodiments, another conformal dielectric layer is deposited on the cap and the edges of the post prior to forming the conformal conductive gate layer. The conformal dielectric layer is preferably unpatterned in the region of the post and cap structure, and provides a uniform material surface on which to deposit the remaining layers of the device.

After the post and cap structure has been formed, a conformal conductive gate layer is formed in Step 850. The gate layer is a conformal conductive layer that is preferably deposited using an ALD process, and more preferably by a spatial ALD process. The gate layer can be a uniform layer or a patterned layer. A patterned gate layer can be patterned at the time of deposition using a selective area deposition process or can be deposited uniformly and patterned using standard photolithographic techniques. The gate layer covers at least some portion of the edges of the post in the reentrant profile formed in Step 840.

A conformal dielectric layer is formed over and in contact with the gate layer in Step 860. The conformal dielectric layer is a conformal insulating layer that is preferably deposited using an ALD process, and more preferably by a spatial ALD process. Preferably the insulating layer is an inorganic thin film dielectric layer. The conformal dielectric layer is in contact with the gate layer in the reentrant profile. The insulating layer can be patterned at the time of deposition using a selective area deposition process or can be deposited uniformly and patterned using standard photolithographic techniques, either after this step or after subsequent process steps. Typically, the conformal insulating layer includes vias, or holes, to the gate layer for making contact in future processing steps. The conformal dielectric layer can be a single layer, or be a multilayer stack.

The conformal semiconductor layer is formed in Step 870. The semiconductor is preferably a thin film inorganic material layer, for example, ZnO or doped ZnO. The patterned semiconductor layer can be patterned at the time of deposition using a selective area deposition process or can be deposited uniformly and patterned using standard photolithographic techniques. Preferably, semiconductor layer is the deposited using an ALD process or, more preferably, by a spatial ALD process. The semiconductor layer is in contact with the insulating layer at least over the portion of the edge of the post in the reentrant profile which is covered by the patterned gate layer material.

To complete the vertical transistor, the first and second electrodes are simultaneously formed in Step 880. In this step, a first electrode is formed over the post and cap and a second electrode is formed which is not over the post. This can be accomplished by using a line-of-sight deposition process such as a metal evaporation process. In this embodiment, the portion of the cap which overhangs the walls of the post cap prevents the metal from depositing on the walls of the post within the reentrant profile. The metal can be further patterned after deposition using standard photolithographic techniques. Alternative line-of-sight deposition techniques include sputtering and reactive sputtering in order to deposit a film of metal, of alloy, or of conductive metal oxide. In other example embodiments, Step 880 includes using selective area deposition in combination with ALD to simultaneously form the first and second electrodes. In these embodiments, an inhibitor is used to pattern a conductive thin film layer. The inhibitor is present in at least a portion of the reentrant profile defined by the cap and post structure, preventing the conductive thin film from depositing over the walls of the post in the reentrant profile. In some embodiments, where the inhibitor is present only within the reentrant profile, the conductive material is further patterned using standard photolithographic techniques. When using selective area deposition to define the first and second electrodes it is preferred to use ALD, and most preferred to use spatial ALD. It is preferred to use a polymeric inhibitor as the deposition inhibitor material when using selective area deposition process to define the first and second electrodes.

The formation of the first and second electrodes defines the channel of the vertical transistor which includes the portion of the semiconductor over the wall of the post. In these example embodiments, the simultaneous formation of the first and second electrodes results in a structure where the first electrode is located in contact with a first portion of the semiconductor layer over the cap and the second electrode located in contact with a second portion of the semiconductor layer over the substrate and not over the post. As such, the first and second electrodes are different distances from the substrate surface and the distance between the first and second electrodes is greater than zero when measured orthogonal to the substrate surface.

As shown in FIG. 12, Steps 820 through 850 can be grouped into single Step 800 in which an electrically conductive gate structure is formed having a polymer post, inorganic cap and conformal conductive gate layer.

Figure 13:
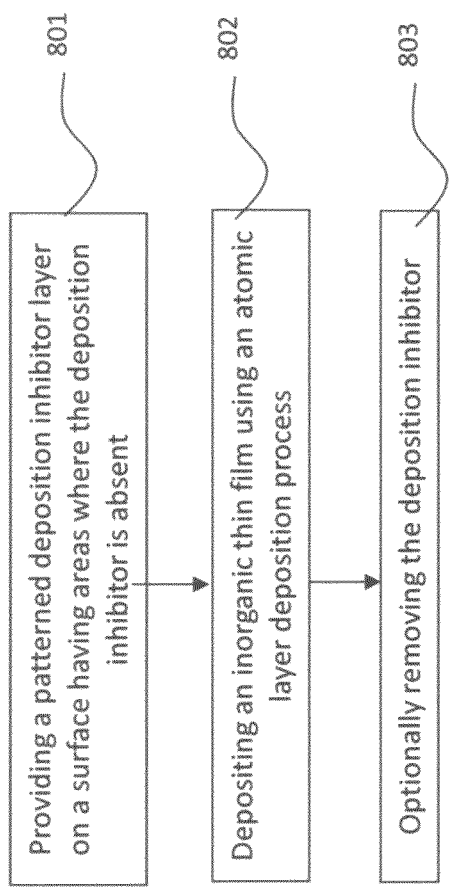
FIG. 13 is a flow chart describing an example embodiment of selective area deposition for use in the present invention.

In FIG. 13, the process steps associated with selective area deposition (SAD) are shown. First in Step 801, a patterned deposition inhibitor layer on a surface having areas where the deposition inhibitor is absent is provided. This step can be completed using printing techniques, or by uniformly coating the deposition inhibitor and then patterning. Next, in Step 802 an inorganic thin film is deposited using an atomic layer deposition. In this step, at least the area of the substrate having the patterned deposition inhibitor is exposed to the ALD process. The inorganic material only deposits on the areas of the substrate where the deposition inhibitor is absent. The areas of the substrate having deposition inhibitor are protected by the deposition inhibitor, and are not coated with the inorganic thin film material. After the depositing the inorganic material, the deposition inhibitor can be optionally removed as shown in Step 803 leaving only the patterned inorganic thin film.

The process flow described in FIG. 12 can be further understood through the descriptive process build shown in FIGS. 14a and 14b through 20a and 20b. In FIGS. 14a and 14b, a cross-sectional view and a plan view, respectively, a structural polymer layer 50 is provided on the substrate 110 as in Step 820 of FIG. 12. The structural polymer layer 50 can be any polymer that is stable in the final vertical transistor structure and should be understood from the previous descriptions. In this step, the structural polymer layer 50 can cover only a portion of the substrate.

In Step 830, a patterned inorganic thin film 57 is formed on the structural polymer layer. As shown in FIGS. 15a and 15b, the patterned inorganic thin film 57 includes the pattern of the inorganic cap 30. This can be accomplished using any method known in the art, and should be understood with respect to the description of Step 830.

In FIGS. 16a and 16b, a the polymer post 20 having an inorganic material cap 30 is formed by etching the structural polymer layer 50 as in Step 840 of FIG. 12. Removing the portions structural polymer layer 50 not covered by the patterned inorganic thin film 57, and portions of the structural polymer layer 50 that are under the inorganic thin film 57 results in the polymer post 20 and inorganic cap 30 shown in FIGS. 16a and 16b. The structure has a first reentrant profile 140 defined by the portion of the inorganic thin film cap 30 overhanging the wall 40 of the polymer post 20. The resultant post 20 has the same height 45 as the thickness of the structural polymer layer 50, and a width 25 that is less than the width of the inorganic cap 30.

FIGS. 17a and 17b illustrate the result of Step 850 in FIG. 12, forming a patterned conformal gate layer 125 over the post 20 and inorganic cap 30. The patterned conformal gate layer 125 can be formed using a selective area deposition process, or in other embodiments of Step 850, the gate material can be deposited uniformly and patterned using standard photolithographic techniques, resulting in the electrically conductive gate structure 120 in FIGS. 17a and 17b.

FIGS. 18a and 18b illustrate the result of Step 860 in FIG. 12, forming a patterned insulating layer 130. The patterned insulating layer 130 can be formed using a selective area deposition process, or in other embodiments of Step 860, the insulating material can be deposited uniformly and patterned using standard photolithographic techniques, resulting in a conformal patterned insulating layer 130 coating the electrically conductive gate structure 120 and maintaining the reentrant profile 140 as shown in FIGS. 18a and 18b. As shown, an optional via 70 is present in the conformal insulating layer 130 down to a portion of conformal gate layer 125.

FIGS. 19a and 19b show the result of Step 870 of FIG. 12, forming a conformal semiconductor layer 150 on the conformal insulating layer 130. The conformal semiconductor layer 150 is at least present in the first reentrant profile 140 of the electrically conductive gate structure 120, and can be said to maintain this profile. Forming the conformal semiconductor layer 150 is preferably done using an ALD process, more preferably using a spatial ALD process. As shown in FIGS. 19a and 19b, the conformal semiconductor layer 150 can be patterned. Patterning the conformal semiconductor layer 150 can be done using any method known in the art, including photolithography or selected area deposition. As shown, the semiconductor pattern forms a rectangle of conformal semiconductor layer 150 over the gate structure but not over the area of via 70.

FIGS. 20a and 20b show the result of Step 880 of FIG. 12, simultaneously forming a first electrode 180 over the post 20 and cap 30 and a second electrode 170 not over the post. As shown, the second electrode 170 is adjacent to the first reentrant profile 140, and the second electrode 170 and first electrode 180 form the channel of the first transistor 100. Since the first electrode 180 and the second electrode 170 are formed simultaneously they have the same material composition. In a preferred embodiment, the first electrode 180 and the second electrode 170 also have the same material thickness. The simultaneous formation of the first electrode 180 and the second electrode 170 can be accomplished using a line-of-sight deposition process or a selective area deposition process as described in relation to Step 880 of FIG. 12. The completed vertical transistors 100 and 200 shown in FIGS. 20a and 20b are equivalent (and identical) to the vertical transistors of FIGS. 1a and 1b.

Figure 21A:
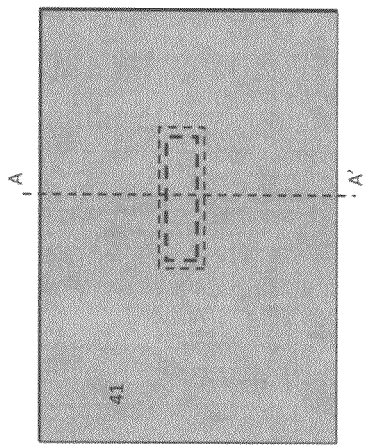
Figure 21B:
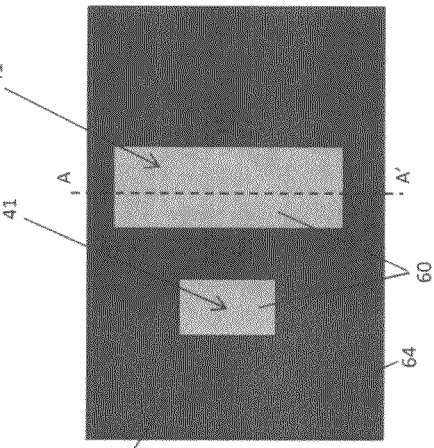
Figure 22A:
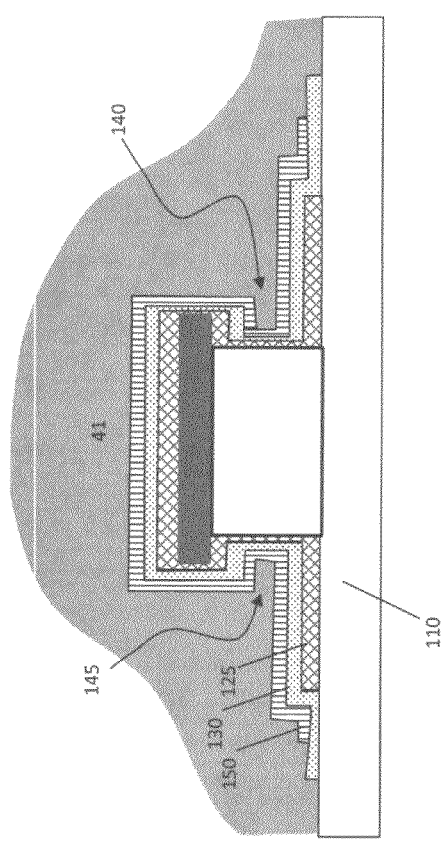
Figure 22B:
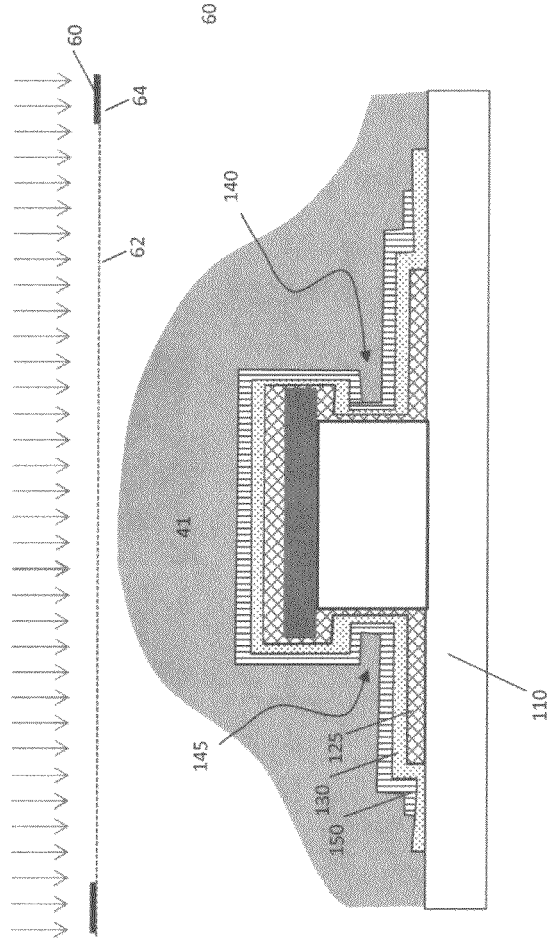

One example embodiment of using selective area deposition to complete Step 880 of FIG. 12 can be better understood through the descriptive process build shown in FIGS. 21a and 21b through 25a and 25b. As shown in FIGS. 21a and 21b, a deposition inhibiting material 41 is deposited on a portion of the substrate and on the electrically conductive gate structure 120 including filling the reentrant profile 140. The deposition method can include, but is not limited to, spray-coating, spin-coating, ink jet coating, or slot-die coating. The uniformity of thickness of the layer of deposition inhibiting material 41 is not critical. Next, a portion of the deposition inhibiting material 41 is removed without removing all of the deposition inhibiting material 41 from the reentrant profile. As shown in FIGS. 22a and 22b, the deposition inhibiting material 41 is photo-patternable, and the patterning uses an optional low resolution optical mask 60. Optical mask 60 has open areas 62 which allow light to pass, and dark areas (typically chrome) 64 which block light. The deposition inhibiting material 41 is exposed to light through the mask as shown in FIG. 22a. By exposing the top surface of the deposition inhibiting material to the appropriate wavelengths of light for the positive resist (deposition inhibiting material 41), portions of the deposition inhibiting material 41 under the open areas 62 of the mask 60 are exposed while the other portions of the deposition inhibiting material 41 within the reentrant profile are shielded by the top portion of cap 30.

After exposure, the deposition inhibiting material 41 is developed, and a schematic representation of the resultant structure is shown in FIGS. 23a and 23b. As shown in FIG. 23a, the deposition inhibiting material 41 is removed from locations not within the reentrant profile 140, and deposition inhibiting material 41 remains in at least a portion of the reentrant profile 140. As shown in FIG. 23b, the deposition inhibitor 41 was also removed over via 70 in order to contact a portion of the gate layer 125. One preferred deposition-inhibiting material for this example embodiment is PMMA, poly(methyl methacrylate). In example embodiments of this type, the cap 30 can be chosen to block UV light, as is the case when the cap material is AZO or a metal. The conformal conductive gate layer can also serve as the UV-blocking material for the deposition inhibitor in the reentrant profile. In other example embodiments, the deposition-inhibiting material can be either photo-patternable or not photo-patternable, but is removed selectively by an energetic oxygen-containing process such that the reentrant profile 140 retains some deposition inhibitor.

Next, a patterned electrically conductive material layer is deposited such that the electrically conductive material layer is not deposited on the deposition inhibitor, as shown in FIGS. 24a and 24b. This is accomplished by a selective area deposition, in which the substrate with deposition inhibitor, as shown in FIGS. 23a and 23b, is subjected to the conditions for uniform deposition and the conductive material only deposits where the deposition inhibitor 41 is not present. The electrically conductive material is preferably deposited using an ALD process, and more preferably using a spatial ALD process. As shown, the first electrode 180, the second electrode 170 and the third electrode 175 are formed simultaneously. Additionally, the first electrode 180, the second electrode 170 and the third electrode 175 are in conformal contact with the semiconductor layer 150.

The deposition inhibitor is optionally removed, and the resultant structure is shown in FIGS. 25a and 25b. As shown, the structure is equivalent to the structure shown in FIGS. 1a through 1c and should be understood from the previous description.

Figure 26B:
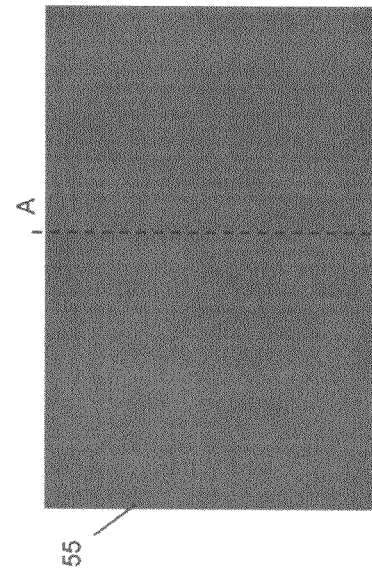
Figure 27B:
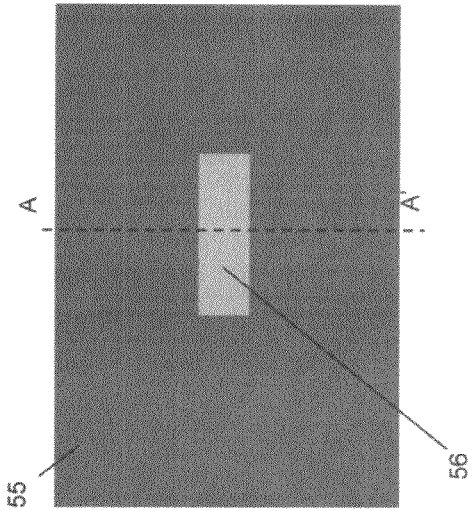
Figure 26A:
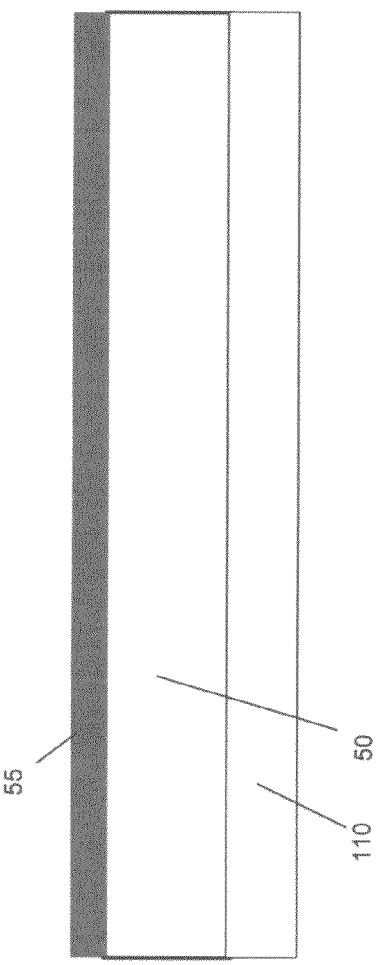
Figure 27A:
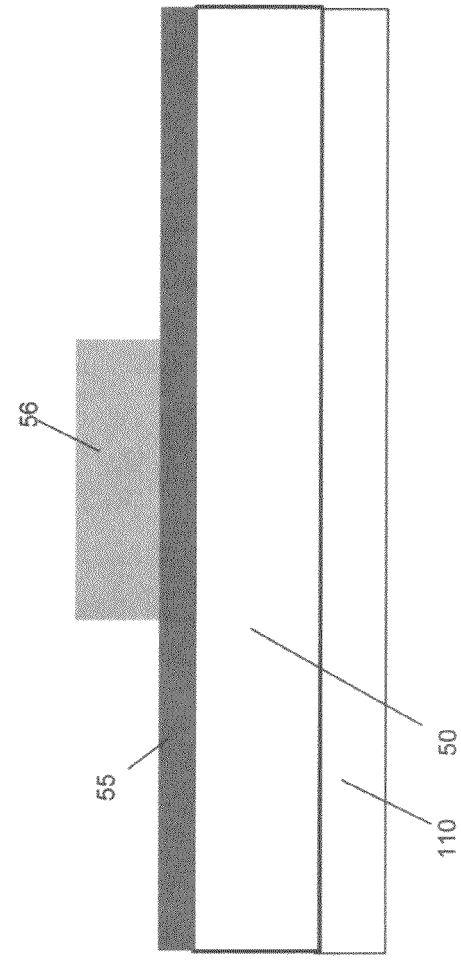

There are number of processes included in the present invention for providing a patterned inorganic thin film on the structural polymer layer, as discussed with respect to Step 830 of FIG. 12. In one example embodiment, the patterned inorganic thin film is provided using photolithography. This embodiment can be better understood from FIGS. 26a and 26b through 29a and 29b. As shown in FIGS. 26a and 26b, a uniform inorganic thin film 55 is provided on the structural polymer layer. The inorganic thin film 55 can be any inorganic material, including metals and oxides. Inorganic thin film 55 can be deposited using any method, including evaporation, sputtering, coating, vapor processes including chemical vapor deposition and atomic layer deposition. Inorganic thin film 55 is preferably deposited using atomic layer deposition, and more preferably using spatial atomic layer deposition. Next, a patterned resist layer 56 is formed on the inorganic thin film layer 55. The pattern resist layer can be formed using photolithography or using additive print methods, such as inkjet printing or flexography.

Next, the inorganic thin film layer 55 is etched to form the inorganic cap 30 for the electrically conductive gate structure 120, as shown in FIGS. 28a and 28b. After etching the inorganic thin film layer 55, the resist 56 can be optionally removed as shown in FIGS. 29a and 29b. In alternative example embodiments, the resist 56 can be removed during the formation of the polymeric post 20. The structure shown in FIGS. 29a and 29b is equivalent to the structure shown in FIG. 15a.

As previously described, the present invention can include a conductive layer 122 between the post 20 and the substrate 110 as shown in FIG. 7. In one example embodiment of the present invention, the patterned conductive layer 122 can be used to form the inorganic cap 30 of the electrically conductive gate structure 120. Using the conductive layer 122 to pattern the inorganic cap 30 results in a structure, as shown in FIG. 7, where the cap 30 and conductive layer 122 have the same pattern and are aligned. In this example embodiment, the substrate and the structural polymer layer are transparent to the wavelengths of light used to expose a photo-patternable resist. The inorganic thin film is also transparent, and is deposited on the structural polymer layer. The photo-patternable resist is deposited over the transparent inorganic thin film layer and is exposed through the substrate, structural polymer layer and the transparent inorganic thin film layer to transfer the pattern of the (not transparent) patterned conductive layer to the photo-patternable resist. The transparent inorganic thin film layer is then etched to form the patterned inorganic cap 30.

Figure 30B:
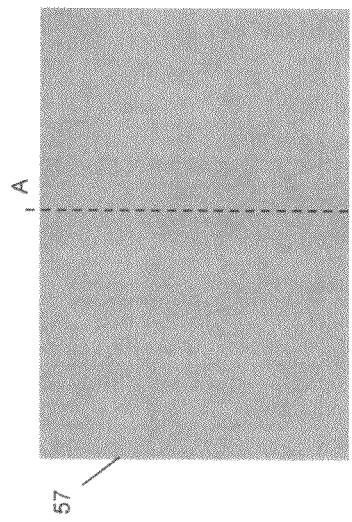
Figure 30A:
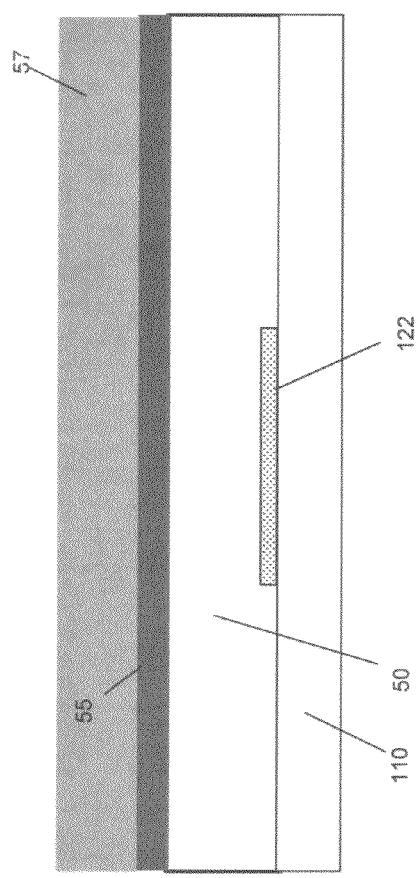

This process is better understood through the descriptive build shown in FIGS. 30a and 30b through 33a and 33b. As shown in FIGS. 30a and 30b, there is a patterned conductive layer 122 on the substrate 110 surface, under the structural polymer layer 50, and the uniform inorganic film 55 is coated with a photo-patternable resist layer 57. The resist 57 is exposed through the substrate 110, and the patterned conductive layer 122 acts as a photomask such that the resist 57 is only exposed where the pattern conductive layer 122 does not block the light. In this embodiment, the substrate 110 and the structural polymer layer 50 do not block the wavelength of light used to expose the resist 57, and are preferably transparent. The structure shown in FIGS. 31a and 31b is the result of developing the exposed photo-patternable resist 57, resulting in resist pattern 56 that is in alignment with the conductive layer 122.

Figure 32B:
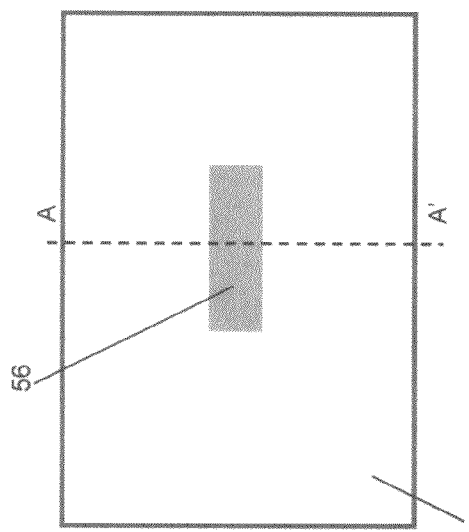
Figure 33B:
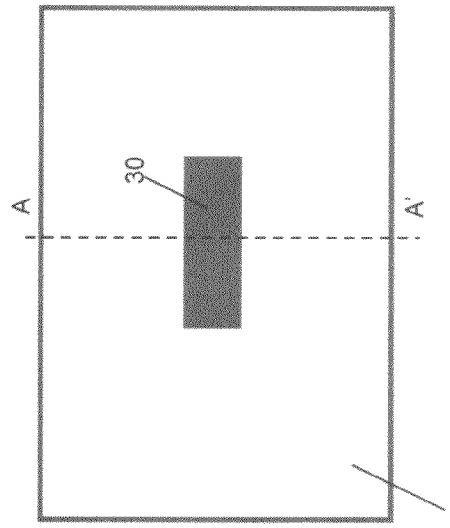
Figure 32A:
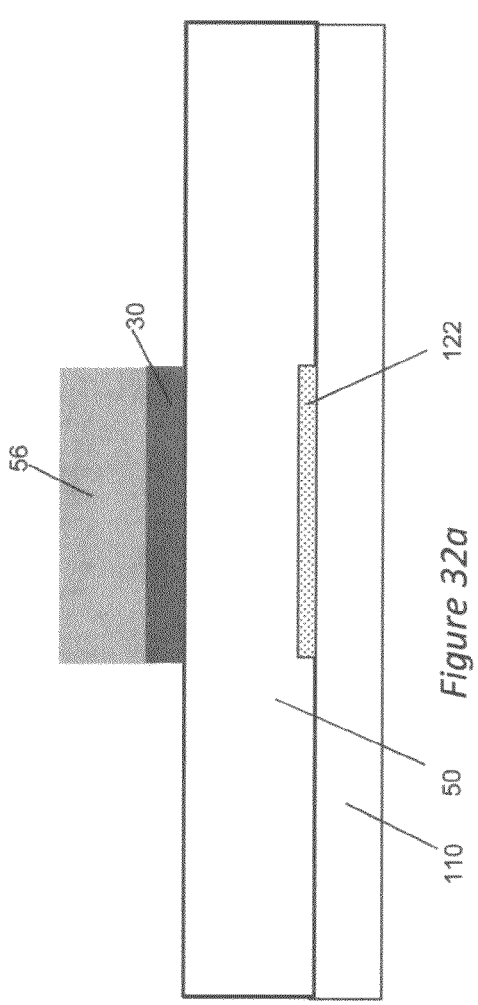
Figure 33A:
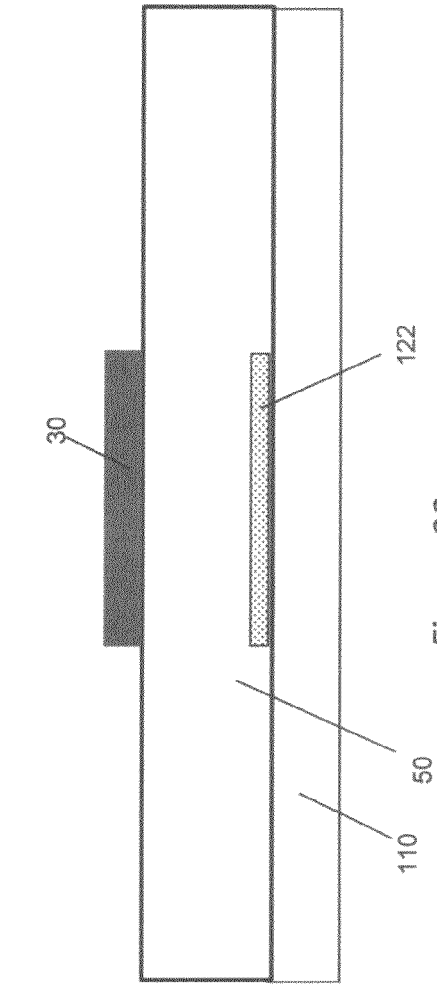

As previously described, the uniform inorganic thin film layer is etched to form the inorganic cap 30, as shown in FIGS. 32a and 32b. In this embodiment, the cap 30 is in alignment with the conductive layer 122. As shown in FIGS. 33a and 33b, the resist pattern 56 is removed prior to forming the post. In alternative embodiments, the resist 56 can be removed during the formation of the polymeric post 20. The structure shown in FIG. 33a is equivalent to the structure shown in FIG. 15a, with the additional element conductive layer 122.

One of the advantages of the present invention is that all of the functional layers optionally can be patterned using selective area deposition. In a preferred example embodiment, all of the functional layers is patterned by printing a deposition inhibitor. A method of fabricating a vertical thin film transistor by printing can be accomplished by completing the following steps in order. First, a substrate is provided. A structural polymer layer is provided on the substrate, and then a polymeric inhibitor is printed in a cap pattern on the structural polymer layer. An inorganic thin film is deposited on the structural polymer layer in areas where the polymeric inhibitor is absent using an atomic layer deposition (ALD) process to form a patterned inorganic layer having the cap pattern. Next, the polymeric inhibitor, portions of the structural polymer layer between the polymeric inhibitor and the substrate, and portions of the structural polymer layer between the patterned inorganic layer and the substrate are removed to form a structural polymer post having an inorganic cap that extends beyond an edge of the structural polymer post to define a reentrant profile. A polymeric inhibitor is printed in a gate pattern on the substrate, and a first conductive thin film is deposited on the substrate in areas where the polymeric inhibitor is absent using an atomic layer deposition (ALD) process to form a patterned conformal conductive gate layer having the gate pattern including in the reentrant profile, and then the polymeric inhibitor is removed. Next, a polymeric inhibitor is printed in a dielectric pattern on the substrate, a dielectric thin film is deposited on the substrate in areas where the polymeric inhibitor is absent using an atomic layer deposition (ALD) process to form a patterned conformal dielectric layer having the dielectric pattern on the gate layer, and then the polymeric inhibitor is removed. Next, a polymeric inhibitor is printed in a semiconductor pattern on the patterned conformal dielectric layer, a semiconductor thin film is deposited on the substrate in areas where the polymeric inhibitor is absent using an atomic layer deposition (ALD) process to form a patterned conformal semiconductor layer having the semiconductor pattern on the patterned conformal dielectric layer, and then the polymeric inhibitor is removed. A polymeric inhibitor then is printed in an electrode pattern, the electrode pattern having an open area over a portion of the reentrant profile allowing the polymeric inhibitor to wick along the reentrant profile in the open area. A second conductive thin film is deposited using an atomic layer deposition (ALD) process in areas where the printed and wicked polymeric inhibitor is absent to form a first electrode in contact with a first portion of the semiconductor layer located over the cap and a second electrode in contact with a second portion of the semiconductor layer over the substrate adjacent to the edge of the structural polymer post in the reentrant profile and not over the post. This process is preferably accomplished using a spatial atomic layer deposition process, and preferably using an atmospheric pressure atomic layer deposition process. By using an atmospheric pressure atomic layer deposition process to deposit the layers, a printing process to define the pattern, and a coating process to provide the structural polymer, vertical transistors of the present invention can be formed without the use of vacuum processing steps.

Figure 34:
FIG. 34 is a flow chart describing an example embodiment of a process of forming a vertical thin film transistor having a polymer post including printing of an inhibitor.

A step diagram for a process using a printed deposition inhibitor to form the vertical transistors of the present invention is shown in FIG. 34. As shown in FIG. 34, Step 810 and Step 820 are the same as shown in FIG. 12. Namely, in Step 810 a substrate is provided into the system followed by providing a structural polymer layer on the substrate surface in Step 820. The provided substrate can have patterned layers. Providing the substrate can include providing a patterned conductive layer on the substrate prior to providing the structural polymer layer in Step 820. In one example embodiment, the patterned conductive layer can be formed using the same printing and ALD process as is used to form the other layers of the vertical transistor. This can be done by printing a polymeric inhibitor in a pattern that overlaps the gate pattern on the substrate, depositing a third conductive thin film on the substrate in areas where the polymeric inhibitor is absent using an atomic layer deposition (ALD) process to form the patterned conductive layer on the substrate, and removing the polymeric inhibitor prior to depositing the structural polymer layer.

Next, a patterned polymeric inhibitor layer is printed in a cap pattern on the structural polymer layer in Step 832. Printing methods include, but are not limited to, inkjet, gravure, microcontact, or flexography. The polymeric inhibitor layer is preferably printed as an ink that is dried to form the polymeric inhibitor layer. A preferred polymeric inhibitor is polyvinyl pyrrolidone. The patterned polymeric inhibitor layer contains open areas where the inhibitor is absent; the cap pattern is defined by an open area having no polymeric inhibitor.

In Step 834, an inorganic thin film is deposited using an atomic layer deposition (ALD) process in areas where the polymeric inhibitor is absent. In this step, the open areas which define the cap pattern are coated with the inorganic thin film, while the areas covered by the polymeric inhibitor receive little or no deposition. This step is preferably completed using spatial ALD. It is preferred that the inorganic thin film be a dielectric material. Prior to depositing the inorganic thin film in Step 834, the surface of the structural polymer layer can be optionally treated (not shown). The treatment is used to activate the surface of the polymer to facilitate inorganic thin film growth using an atomic layer deposition process, and is preferably done before printing the polymeric inhibitor. Treatment processes should be understood from the previous discussion and can include using UV-ozone or plasma processes. The presence of the polymeric inhibitor causes the inorganic thin film layer to be deposited in a patterned manner, forming a patterned inorganic layer having the cap pattern during deposition Step 834.

In Step 842, the polymer post having an inorganic material cap is formed. Specifically, Step 842 forms the polymeric material post having the inorganic material cap by removing the polymeric inhibitor, portions of the structural polymer layer between the polymeric inhibitor and the substrate, and portions of the structural polymer layer between the patterned inorganic layer and the substrate to form a structural polymer post having an inorganic cap that extends beyond an edge of the structural polymer post to define a reentrant profile. In some embodiments, the cap extends beyond another edge of the post forming another reentrant profile opposite the reentrant profile. The step of removing the structural polymer preferably removes the polymeric inhibitor and the structural polymer using a single process. Since both materials are polymeric, common etching processes can be used, including exposing the substrate to a vapor reactant that causes removal of the polymer layers. This removal can happen spontaneously upon reaction with the vapor, resulting in the conversion of the inhibitor to a volatile species. Alternatively, the vapor exposure can react with the polymers converting to another species or morphology that is then more easily removable with another process, such as a liquid process. The vapor exposure can include forms of energy to promote the process. These include light exposure, or arcs, or plasmas. Plasmas include plasmas of various species including oxygen, chlorine, or fluorine. Plasmas created with these materials or with precursors that produce these materials are included in the present invention. The removal of portions of the polymeric inhibitor and the structural polymer layer can be accomplished by a single exposure to highly reactive oxygen processes including a UV-ozone process (UVO) or O2 plasma. The highly reactive oxygen processes can be a batch process using a chamber based tool or continuous process using web process tools. The highly reactive oxygen processes can be at sub-atmospheric (vacuum) pressure or atmospheric pressure.

After the post and cap structure has been formed, a patterned gate layer is formed in Steps 852, 853 and 855. In Step 852, a polymeric inhibitor is printed in a gate pattern. The gate pattern includes open areas where the gate layer will be deposited. The open areas of the gate pattern are at least over a portion of the post and cap. Next, a first conductive thin film is deposited using ALD in Step 853. The open areas of the gate pattern are coated with the first conductive thin film, while the areas covered by the polymeric inhibitor receive little or no deposition. The presence of the polymeric inhibitor causes the first conductive thin film layer to be deposited in a patterned manner, and forms a patterned conformal conductive gate layer having the gate pattern, including in the reentrant profile during deposition Step 853. Since the open area of the gate pattern is over the post and cap, the reentrant profile is free of polymeric inhibitor and is conformally coated with the conductive thin film during the ALD process. As patterned, the gate layer covers at least some portion of the edges of the post formed in Step 842. Prior to forming the gate layer, the post and cap structure, as well as portions of the substrate, can optionally be covered with a another conformal dielectric layer (not shown). The conformal dielectric layer is deposited at least on the cap and on the edges of the post before forming the patterned conformal conductive gate layer, and is preferably deposited uniformly. After forming the conformal conductive gate layer, the polymeric inhibitor is removed in Step 855. Specifically, Step 855 removes the polymeric inhibitor that was printed in the gate pattern during Step 852.

A patterned conformal dielectric layer is formed over and in contact with the gate layer in Steps 862 and 863. In Step 862, a polymeric inhibitor is printed in a dielectric pattern. The dielectric pattern includes open areas where the dielectric layer will be deposited. The open areas of the dielectric pattern are at least over a portion of the post and cap, over the gate layer. Next, a dielectric thin film is deposited using ALD in Step 863. The open areas of the dielectric pattern are coated with the dielectric thin film, while the areas covered by the polymeric inhibitor receive little or no deposition. The presence of the polymeric inhibitor causes the dielectric thin film to be deposited in a patterned manner, and forms a patterned conformal dielectric layer having the dielectric pattern on the gate layer. Since the open areas of the dielectric pattern are over the post and cap, the gate layer within the reentrant profile is free of polymeric inhibitor and is conformally coated with the dielectric thin film during the ALD process. Preferably the dielectric layer is an inorganic thin film dielectric layer. Typically, the dielectric pattern additionally contains areas having the polymer inhibitor over the gate layer not within the reentrant profile to provide vias to the gate layer for making contact in future processing steps. After forming the conformal patterned dielectric layer, the polymeric inhibitor is removed in Step 865. Specifically Step 865 removes the polymeric inhibitor that was printed in the gate pattern during Step 862. The patterned conformal dielectric layer can be a single layer, or be a multilayer stack. In embodiments where the patterned conformal dielectric layer is a multilayer stack, the layers of the multilayer stack can be deposited using a single printed polymeric material layer, or alternatively the Steps 862, 863 and 865 can be repeated to build up the patterned conformal dielectric layer having multiple dielectric thin film layers.

Next, the patterned semiconductor layer is formed in Steps 872 and 873. In Step 872, a polymeric inhibitor is printed in a semiconductor pattern. The semiconductor pattern includes open areas where the semiconductor layer will be deposited. The open areas of the semiconductor pattern are at least over a portion of the post and cap, over the gate layer, and over the dielectric layer. Next, a semiconductor thin film is deposited using ALD in Step 873. The open areas of the semiconductor pattern are coated with the semiconductor thin film, while the areas covered by the polymeric inhibitor receive little or no deposition. The presence of the polymeric inhibitor causes the semiconductor thin film to be deposited in a patterned manner, and forms a patterned conformal semiconductor layer having the semiconductor pattern on the dielectric layer over the gate layer. Since the open areas of the semiconductor pattern are over the post, cap, gate layer, and dielectric layer within the reentrant profile, the area is free of polymeric inhibitor and is conformally coated with the semiconductor thin film during the ALD process. Preferably, the semiconductor layer is an inorganic semiconductor thin film layer, for instance ZnO or doped ZnO. The semiconductor layer is in contact with the dielectric layer at least over a portion of the edge of the post in the reentrant profile having the patterned gate layer. After deposition of the semiconductor thin film, the polymeric inhibitor can be removed, if necessary, as shown in Step 875.

To complete the vertical transistor, the source and drain electrodes are deposited simultaneously. To accomplish this via a printing process, a deposition inhibiting material is formulated into an inhibitor ink for printing which will wick into the reentrant profile due to capillary action. The first and second electrodes of the vertical transistor of the present invention are formed as described in Steps 882 and 884. In Step 882, a polymeric inhibitor is printed in an electrode pattern. The electrode pattern includes open areas where the conductive thin film layer will be deposited. The open area of the electrode pattern is over a portion of the reentrant profile, allowing the polymeric inhibitor to wick along the reentrant profile in the open area. The open area of the electrode pattern is over a portion of the post, cap, gate, and dielectric layer.

A patterned polymeric inhibitor is printed such that the inhibitor wicks along the reentrant profile as shown in Step 882. The inhibitor ink has a surface tension and a viscosity associated with it. The inhibitor ink is deposited in a patterned way, adjacent to the reentrant profiles of the electrically conductive gate structure such that the inhibitor ink is drawn into the reentrant profiles by capillary action, also known as wicking. Printing methods include, but are not limited to, inkjet, gravure, microcontact, or flexography. The uniformity of thickness of the inhibitor layer is not critical.

The distance that a liquid is moved by capillary action depends on multiple factors, including the chemical nature and wetting properties of the substrate surface, the surface tension and viscosity of the moving liquid, and the drying rate of the liquid. Conditions and patterns are chosen in Step 882 such that the inhibitor ink fills the reentrant profiles of the electrically conductive gate structure over a distance sufficient to separate the second electrode from the first electrode and define the width of the channel of the vertical transistor. The electrode pattern preferably has portions where the polymeric inhibitor is printed over the post and cap. In a preferred example embodiment, the electrode pattern chosen consists of an open area sized to be the desired width of the channel, which can be centered over the electrically conductive gate structure (post, cap and gate layer). The polymeric inhibitor ink from the edges of the open area of the electrode wick into the reentrant profile from each side and meet in the center region to fill the reentrant profile that lies within the open area of the pattern. The ink is then dried to leave deposition inhibitor in the reentrant profile.

Next, a second conductive thin film is deposited using ALD in Step 884. The polymeric inhibitor that wicked into the reentrant profile within the open area of the electrode pattern prevents deposition within the reentrant profile but allows deposition in the other portions of the open area which are free of polymeric inhibitor. The open areas which are free of polymeric inhibitor of the electrode pattern are coated with the conductive thin film (areas where the printed and wicked polymeric inhibitor is absent), while the areas covered by the polymeric inhibitor receive little or no deposition. The presence of the polymeric inhibitor causes the conductive thin film to be deposited in a patterned manner, and forms a first electrode in contact with a first portion of the semiconductor layer located over the cap and a second electrode in contact with a second portion of the semiconductor layer over the substrate adjacent to the edge of the structural polymer post in the reentrant profile and not over the post.

The process flow described in FIG. 34 can be better understood through the descriptive process build shown in FIGS. 35a and 35b through 51a and 51b. Steps 810 and 820 should be understood from previous descriptions where a structural polymer 50 is provided on a substrate 110. As shown in FIGS. 35a and 35b, a patterned inhibitor layer 70 then is printed on the surface of the structural polymer layer 50 in a cap pattern as described in Step 832 of FIG. 34. As discussed above, the surface of the structural polymer layer 50 can be treated prior to printing the patterned inhibitor layer 70. Patterned inhibitor layer 70 contains regions 72 where the inhibitor material is not present.

Next, FIGS. 36a and 36b show the result of Step 834, where an inorganic thin film has been deposited by an Atomic Layer Deposition (ALD) process in an area of the polymeric inhibitor layer having the cap pattern where the polymeric inhibitor is absent 72. As shown, this results in patterned deposition of the inorganic thin film to form a patterned inorganic layer having the cap (cap 30) and little to no deposition of the inorganic thin film in areas covered by the printed polymeric inhibitor 71.

In Step 842 of FIG. 34, the polymer post 20 having an inorganic material cap 30 is formed. As noted above, forming the polymeric material post having the inorganic material cap is done by removing the polymeric inhibitor, portions of the structural polymer layer between the polymeric inhibitor and the substrate, and portions of the structural polymer layer between the patterned inorganic layer and the substrate to form a structural polymer post having an inorganic cap that extends beyond an edge of the structural polymer post to define a reentrant profile. FIGS. 37a and 37b show the result of Step 842. When forming the post, portions of the structural polymer layer 50 not under the inorganic thin film material cap 30 are removed, typically, using an etching process. When forming the post 20 from the structure shown in FIGS. 37a and 37b, it is preferred that removal of the structural polymer layer 50 occurs in the same process as the removal of deposition inhibitor 71. The structural polymer 50 is additionally removed from underneath the edges of the inorganic cap 30, forming a reentrant profile 140. The resultant post has the same height 45 as the thickness of the structural polymer layer 50, and a width 25 that is less than the width of the inorganic cap 30.

FIGS. 38a and 38b through FIGS. 40a and 40b illustrate one example embodiment of Steps 852, 853 and 855 of FIG. 34 for forming a patterned conformal conductive gate layer at least on the edges of the post and a portion over the substrate not over the post using a printed deposition inhibitor. In FIGS. 38a and 38b, a printed polymeric inhibitor layer 73 is printed over the substrate. The printed polymeric inhibitor is in a gate pattern layer 73 which contains regions 74 where the polymeric inhibitor is not present. Regions 74 of the gate pattern are arranged so that at least a portion of the post and cap are within the open regions 74. FIGS. 39a and 39b show the result Step 853, after the first conductive inorganic thin film gate is deposited by an Atomic Layer Deposition (ALD) process on the substrate which results in patterned deposition of the patterned gate layer 125 and little to no deposition of the inorganic thin film in areas covered by printed polymeric inhibitor 73. The structure shown in FIGS. 40a and 40b depicts the result of Step 855 after the printed polymeric inhibitor 73 is removed. In some example embodiments, it is desirable to add an additional conformal dielectric layer into the VTFT structure. This can be accomplished by depositing another dielectric thin film on the patterned conformal gate layer in areas where the printed polymeric inhibitor is absent using ALD after depositing the first conductive thin film and before removing the polymeric inhibitor having the gate pattern. In this optional step, another patterned conformal dielectric layer is formed on the patterned conformal gate layer having the gate pattern (not shown).

FIGS. 41a and 41b through FIGS. 43a and 43b illustrate one example embodiment of Steps 862, 863 and 865 described in FIG. 34 for forming a patterned insulating layer. As used herein, the patterned insulating layer 130 is an alternative equivalent phrase to indicate a patterned conformal dielectric layer. In FIGS. 41a and 41b, a printed polymeric inhibitor layer 75 is printed having a dielectric pattern. The printed polymeric inhibitor layer 75 contains regions 76 where the inhibitor material is not present. Regions 76 of the dielectric pattern are arranged so that the post and cap are within the open regions 76. FIGS. 42a and 42b show the structure of Step 863 after the inorganic thin film insulating layer 130 is deposited by an Atomic Layer Deposition (ALD) process on the substrate, resulting in patterned deposition of the patterned insulating layer 130 and with little to no deposition of the inorganic thin film in areas covered by deposition inhibitor 75. The structure shown in FIGS. 43a and 43b depicts the result of Step 863 after the polymeric inhibitor layer 75 is removed. The process shown in FIGS. 41a and 41b through 43a and 43b can be repeated multiple times to create a multilayer dielectric stack for the formation of a patterned insulating layer 130 as described above. As shown, a via is left through the dielectric down to the conductive gate material layer, by region 70 of the dielectric pattern of the printed polymeric inhibitor layer 75.

FIGS. 44a and 44b through FIGS. 46a and 46b illustrate one embodiment of Steps 872, 873 and 875 in FIG. 34, forming a patterned conformal semiconductor material layer on the insulating layer. In FIGS. 44a and 44b, a polymeric inhibitor is printed in a semiconductor pattern to form the printed patterned inhibitor layer 77 shown. The printed polymeric inhibitor layer 77 contains regions 78 where the inhibitor material is not present. Regions 78 of the semiconductor pattern are arranged so that at least a portion of the post and cap are within the open regions 78. FIGS. 45a and 45b show the result of Step 873 after the semiconductor thin film layer is deposited by an Atomic Layer Deposition (ALD) process on the substrate, resulting in patterned deposition of the patterned conformal semiconductor layer 150 and little to no deposition of the inorganic thin film in areas covered by deposition inhibitor 77. The structure shown in FIGS. 46a and 46b depicts the result of Step 875 after the printed polymeric inhibitor layer 77 is removed.

In some example embodiments, it is desirable to control the interface between the dielectric layer 130 and the semiconductor layer 150 by using a buffer layer 155. The buffer layer 155 is an optional dielectric layer which has the same pattern as the semiconductor layer, and is located between the dielectric layer and the semiconductor layer. The buffer layer 155 can be formed after printing the polymeric inhibitor in the semiconductor pattern and before depositing the semiconductor thin film, by depositing another dielectric thin film on the patterned conformal dielectric layer in areas where the polymeric inhibitor is absent using an atomic layer deposition (ALD) process to form another patterned conformal dielectric layer on the patterned conformal dielectric layer and having the semiconductor pattern. The result of forming the optional buffer layer 155 prior to depositing the semiconductor thin film is shown in FIG. 45*c*.

Figure 47B:
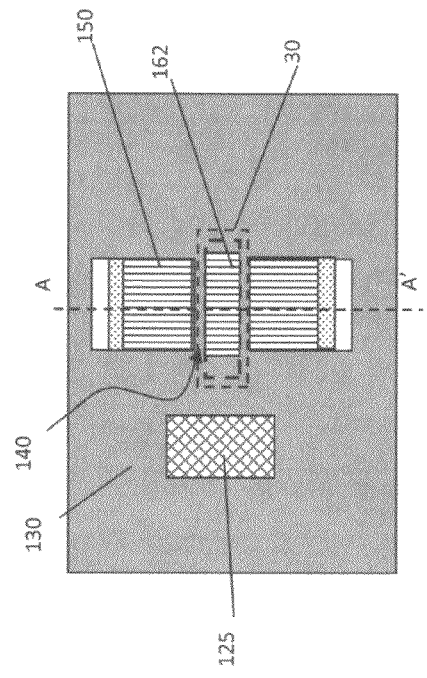
Figure 47A:
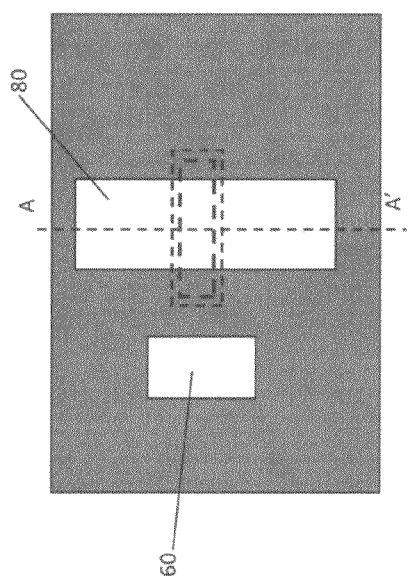
Figure 47C:
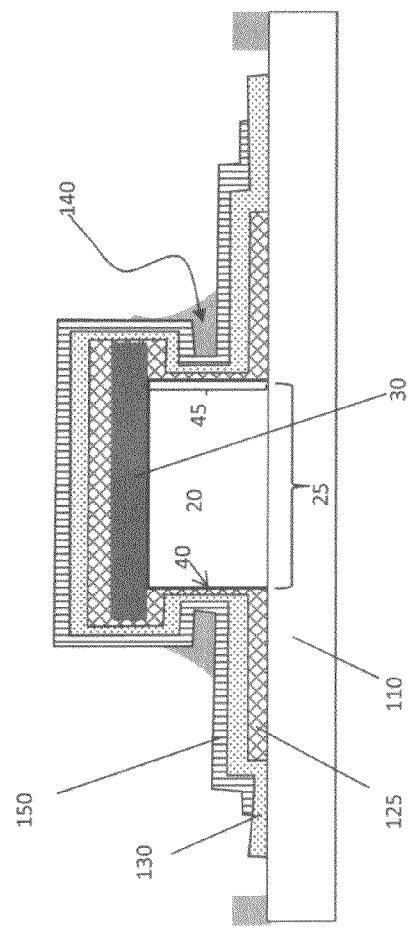

FIGS. 47*a* through 47*c* illustrate the use of a printed polymeric inhibitor to form the source and drain of transistor 100. Here a polymeric inhibitor is printed in an electrode pattern such that the inhibitor wicks along the reentrant profile as described in Step 882 of FIG. 34. FIG. 47*a* shows the electrode patterned to be printed, having two open areas 80 and 60. Typically, area 60 is used to add access to the conductive gate layer 125 and corresponds to the optional via 70 of FIG. 42*b*, and is optional. Open area 80 crosses over the electrically conductive gate structure 120 pattern, including post 20 and cap 30. As designed, open area 80 contains no printed inhibitor regions. FIGS. 47*b* and 47*c* show the result of printing the polymeric inhibitor in the electrode pattern over a structure with reentrant profile 140. FIG. 47*c* is a cross-sectional view of FIG. 47*b* taken along the line A-A'. Although the open area 80 is uniform and free of directly printed inhibitor, the liquid inhibitor ink wicks, or moves through capillary forces, into the reentrant profile 140. The open area 80 is shown to equally cross both sides of the post and cap structure so that ink wicks into both reentrant profiles. Alternatively open area 80 of the electrode pattern can be designed so that ink will wick into only one reentrant profile, and can be designed such that the first electrode is formed to extend beyond the other reentrant profile.

The fluid properties of the deposition inhibitor ink will determine the width of transistor channel that can be fabricated. Additionally, these properties in combination with the surface properties of the underlying layer(s) will determine the channel length as the liquid will also spread out on to the substrate surface. The method of the present invention has a benefit of forming channels whose length is shorter than what is possible by simply printing the inhibitor ink on to a planar gate structure to define a channel. Stated another way, the vertical transistors formed by wicking the printed ink into the reentrant profile will have a channel length which is shorter than the printed feature size of the electrode pattern. The channel length is also preferably shorter than the smallest obtainable feature size of the printing technology used to print the polymeric inhibitor in the electrode pattern.

Figure 48A:
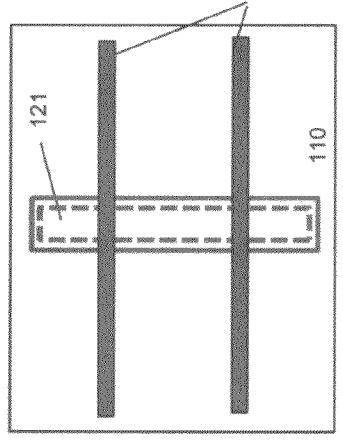
Figure 48B:
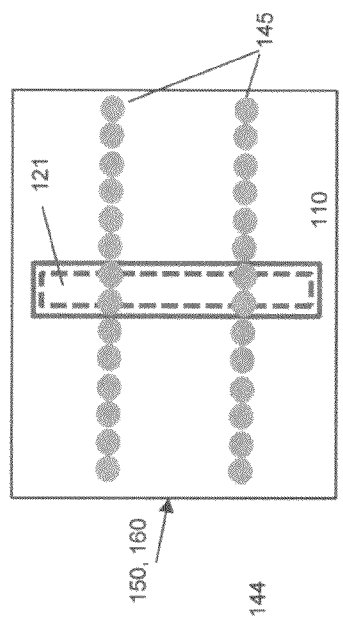
Figure 48C:
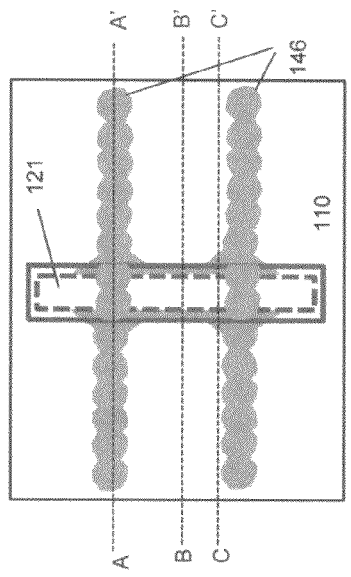
Figure 49A:
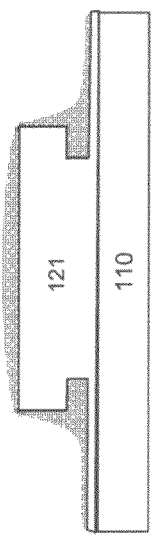
Figure 49B:
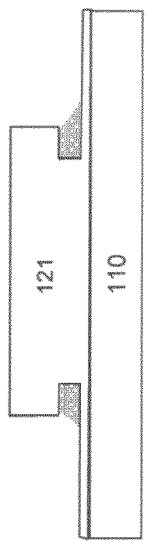
Figure 49C:
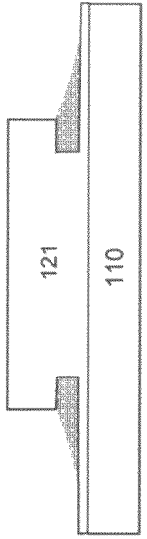

FIGS. 48*a*, 48*b*, 48*c* and 49*a*, 49*b*, 49*c* further serve to explain how the electrodes are formed from a pattern with a single open area. FIG. 48*a* shows a simple two line pattern 144. FIG. 48*b* shows schematically the placement of individual drops 145 using the pattern of FIG. 48*a* with an inkjet printer. FIG. 48*c* illustrates the pattern of FIG. 48*a* printed with using an inkjet printer where the printed inhibitor has interacted with the substrate. The result shown can be obtained when, for example, the surface of the substrate 110 and electrically conductive gate structure 121 are hydrophilic, and the ink is aqueous based. The relative surface energy of the structure and ink interface results in the ink traveling along the three sided capillary formed by the electrically conductive gate structure 121. FIGS. 49*a* through 49*c* are cross-sectional views taken along the lines A-A', B-B' and C-C' of FIG. 48*c*, respectively.

Figure 50A:
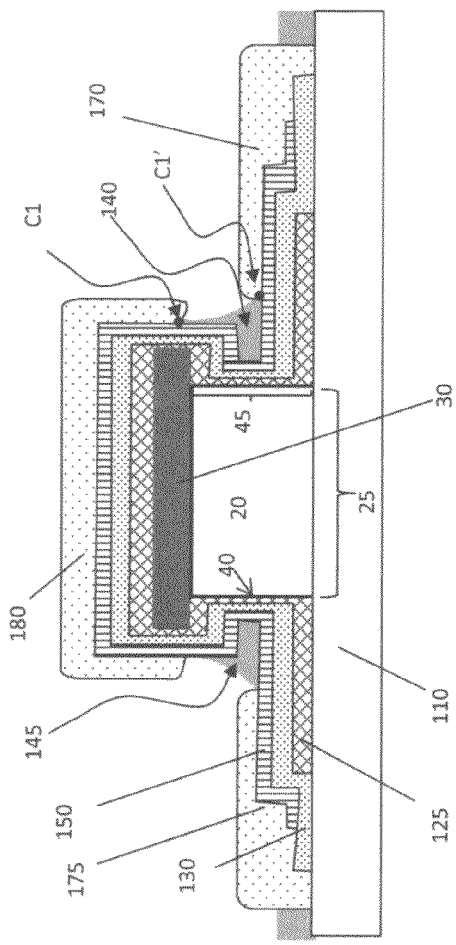
Figure 50B:
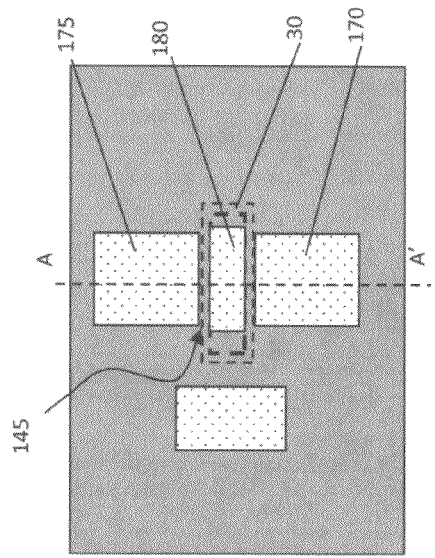
Figure 51A:
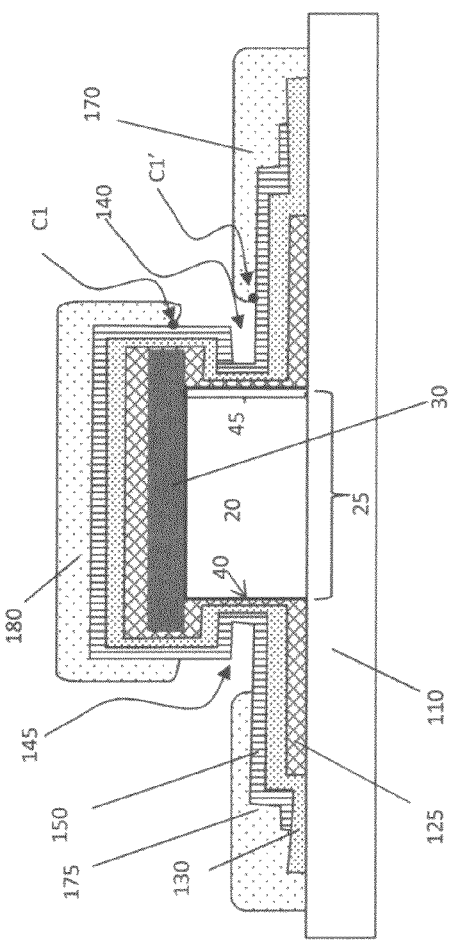
Figure 51B:
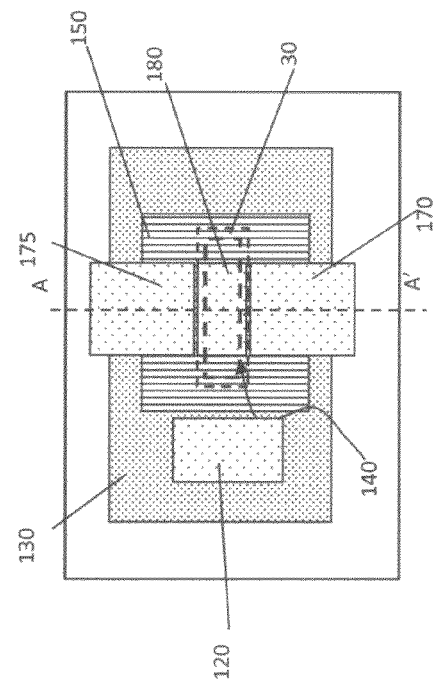

FIGS. 50*a* and 50*b* show the results of one example embodiment of Step 884 in which a second conductive inorganic thin film is deposited using an atomic layer deposition process where the patterned polymeric inhibitor is absent. The inorganic thin film conductive layer is deposited by an Atomic Layer Deposition (ALD) process on the substrate shown in FIGS. 47*b* and 47*c*, resulting in patterned deposition of the first electrode 180, the second electrode 170 and the third electrode 175. The structure shown in FIGS. 51*a* and 51*b* depicts the result of Step 884 after the deposition inhibitor material has been optionally removed. The resultant vertical transistors 100 and 200 are equivalent in structure and operation to those in FIGS. 1*a* and 1*b*.

As described, any of the steps of printing the polymeric inhibitor can be completed by printing with an inkjet printing process or a flexographic printing process. In a preferred embodiment, all of the steps of printing the polymeric inhibitor are accomplished using the same printing process. In some example embodiments, the polymeric inhibitor printed can be a water soluble polymer. A preferred water soluble inhibitor is polyvinyl pyrrolidone. In a preferred example embodiment, the same polymeric inhibitor is used as an ink for all of the printing steps of the present method. It is also preferred that the ALD process be a spatial ALD process.

The process of the present invention can be used to form two vertical transistors over an electrically conductive gate structure, or a single vertical transistor over an electrically conductive gate structure. A single vertical transistor of the present invention includes a substrate and a polymeric material post on the substrate. The post has a height dimension extending away from the substrate to a top and a first edge and a second edge along the height dimension. An inorganic material cap is on the top of the post, the cap covering the top of the post and extending beyond the first edge and the second edge of the post to define a first reentrant profile and a second reentrant profile, respectively. A conformal conductive material gate layer is over the edge of the post in the first reentrant profile. A conformal insulating material layer is on the gate layer in the first reentrant profile. A conformal semiconductor material layer is on the insulating material layer in the first reentrant profile. A first electrode located is in contact with a first portion of the semiconductor layer over the cap, the first electrode extending continuously to a location adjacent to the second reentrant profile. A second electrode is located in contact with a second portion of the semiconductor layer over the substrate and not over the post, and adjacent to the first reentrant profile such that a distance between the edge of the first electrode and the closest edge of the second electrode is greater than zero when measured orthogonally to the substrate surface. The first electrode and the second electrode define a transistor having a channel in the semiconductor layer between the first electrode and the second electrode.

For clarity and referring to FIGS. 52*a* and 52*b*, an example embodiment of a single vertical transistor 106 formed over a polymer post 20 and inorganic cap 30 is shown. The elements of the vertical thin film transistor 106 shown in FIG. 52*a* are the same as those for vertical thin film transistors 100 and 200 and should be understood from the descriptions of FIGS. 1*a* and 1*b*. The vertical thin film transistor 106 shown in FIG. 52*a* is a single transistor formed over a post 20, such that the first electrode 182 is over the cap 30, the post 20 and in contact with the portion of the semiconductor layer on the substrate on the side opposite the post 20 from the second electrode 170. The semiconductor channel as defined by the first electrode 182 and the second electrode 170 contains a portion of the semiconductor layer including the portion in the reentrant profile 140, and the distance between the portion of the first electrode 182 and the second electrode 170 which define the channel of transistor 106 is greater than zero when measured orthogonal to the substrate surface. As shown, the first electrode 182 is located in contact with a first portion of the semiconductor layer 150 over the cap 30 and extends to conformally cover the second reentrant 145 profile. The distance that the first electrode 182 extends beyond the second reentrant profile 145 is limited only by what is practically useful. In some embodiments, a conformal dielectric material layer is located on the cap 30, the edges 40 of the post 20, and at least a portion of the substrate 110, the conformal dielectric layer being located at least between the gate layer 125 and the post 20. This embodiment should be understood from the vertical transistor description discussed above.

Single vertical transistor embodiments, for example, including the one shown in FIGS. 52a and 52b, can be formed using any of the previously discussed polymeric material post 20 and inorganic cap 30 structures, and as discussed, it is preferred that the height of the post 20 is less than or equal to 10 microns. The first electrode 182 and the second electrode 170 are formed simultaneously and have the same material composition and have primarily the same layer thickness. In some embodiments, the first electrode 182 and second electrode 170 are transparent conductive oxides. In other embodiments, the first electrode 182 and second electrode 170 are formed by a line-of-sight deposition resulting in a structure where the first electrode 182 and the second electrode 170 are vertically aligned. The first electrode 182 and the second electrode can be formed using a wicked deposition inhibitor and the length of the channel of transistor 106 varies along the width of the channel.

In some example embodiments of single vertical transistors, it is preferable to only form the conductive gate layer 125 in regions close to the first reentrant profile in order to reduce or avoid parasitic capacitance issues between the gate layer 125 and the first electrode 182. As shown in FIGS. 53a and 53b, the conductive gate layer 125 can be patterned to provide a gate for the first reentrant profile 140, but not the second reentrant profile. Similarly, the semiconductor layer can be patterned so that it is only present within the first reentrant profile 140, and not the second reentrant profile. The process of forming the vertical transistor 106 of FIGS. 52a and 52b, and vertical transistor 107 of FIGS. 53a and 53b is the same as those processes previously discussed. The patterns for each layer are chosen appropriately to form the desired structures. In some embodiments of single vertical transistors, there is another conductive material layer positioned at least under a portion of the polymeric material post 20 in the region of the first reentrant profile 140 and in electrical contact with the conformal conductive material gate layer 125.

In other example embodiments of single vertical transistors, it is preferable to fill in the second reentrant profile 145 formed by the post 20 and cap 30 to more easily form vertical transistor 107. As shown in FIGS. 54a and 54b, a filler material 65 can be added in the second reentrant profile of vertical transistor 108 to increase the likelihood that that the first electrode 182 will be continuously connected from the region over the cap to the region adjacent to the reentrant profile and not over the cap. In some embodiments, the filler material 65 is a structural polymer. In other example embodiments, filler material 65 can include multiple materials such as, for example, polymers and inorganic materials. The filler material can be an inorganic material, or an inorganic-organic composite material. In some embodiments, the filler material is formed from multiple materials which are present in distinct layers of polymer material and inorganic material. One example of this structure includes a filler material 65 of structural polymer patterned using an inorganic hard mask, which results in a filler material having a polymer layer under an inorganic layer. In other example embodiments, the filler material 65 and the post 20 and cap 30 are covered with a conformal dielectric material layer. In these embodiments, the conformal dielectric material layer is on the cap 30, on the edges 40 of the post 20, and on the filler material 65; the conformal dielectric layer is located at least between the gate layer 125 and the post 20 and between the filler material 65 and the first electrode 182.

Figure 55:
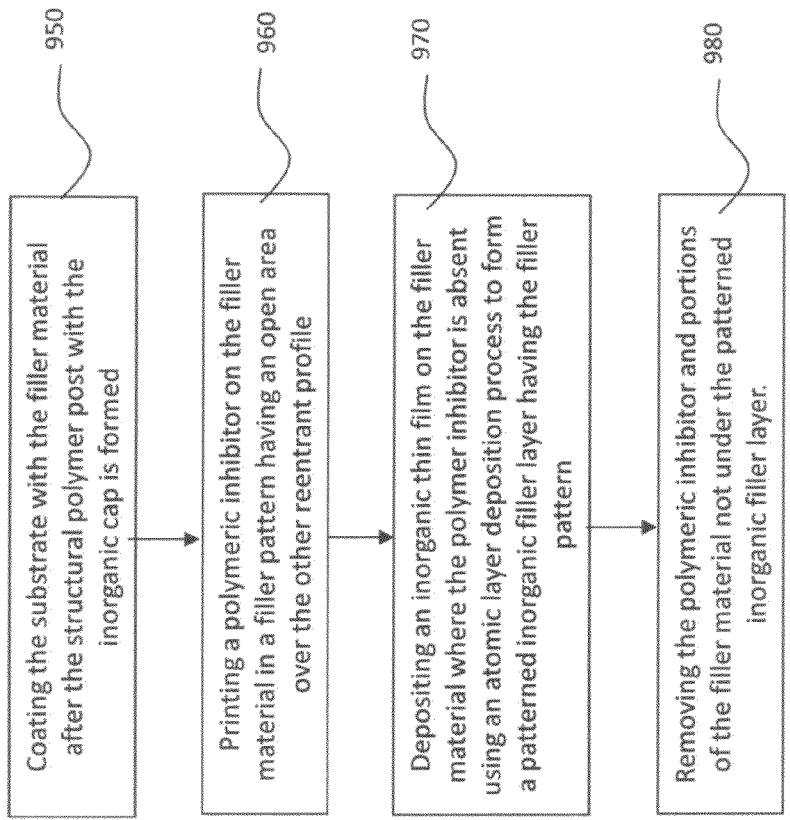
FIG. 55 is a flow chart describing an example embodiment of a process of forming a multilayer filler material for use in present invention.

Forming a single vertical transistor, such as VTFT 106 of FIGS. 52a and 52b, or VTFT 107 as shown in FIGS. 53a and 53b, can be done using the process flow describe in FIG. 12 or FIG. 34 by choosing the appropriate patterns for each of the layers—the gate layer, the dielectric layer, the semiconductor layer and the electrode layer, where the electrode layer pattern extends beyond the second reentrant profile. Depositing the filler into the second reentrant profile can be done using a number of processes, including uniform coating and then patterning and printing to allow a filler material to wick into the reentrant profile. FIG. 55 describes the steps of one embodiment of the present invention using a structural polymeric material filler which is patterned using an inorganic thin film layer as a hard mask to form a single vertical transistor where the filler material includes multiple materials. The multiple materials include distinct layers of polymer material and inorganic material as the filler material of the vertical transistor. As shown in FIG. 55, in Step 950 the substrate is coated with a filler material after the structural polymer post with the inorganic cap has been formed. This step can occur either before or after forming the conductive gate layer. Next, in Step 960, a polymeric inhibitor is printed on the filler material in a filler pattern having an open area over the other reentrant profile. In Step 970, an inorganic thin film is deposited on the filler material where the polymer inhibitor is absent using an atomic layer deposition process to form a patterned inorganic filler layer having the filler pattern. In Step 980, the polymeric inhibitor and portions of the filler material not under the patterned inorganic filler layer are removed. Removing the polymeric inhibitor and portions of the filler material preferably occurs simultaneously.

Figure 56B:
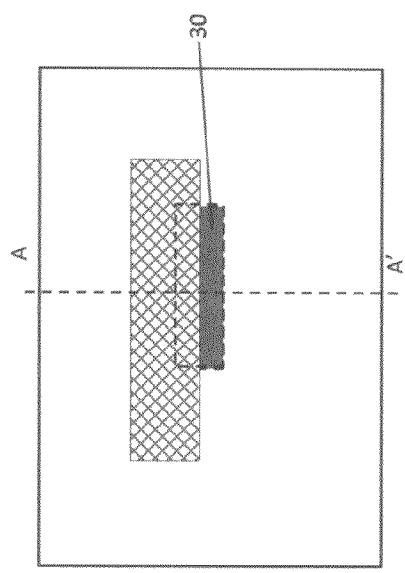
Figure 57B:
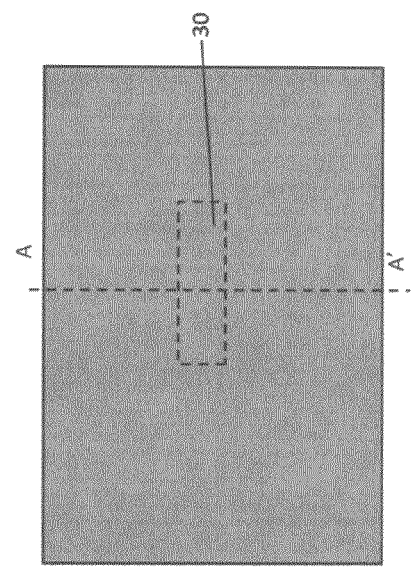
Figure 56A:
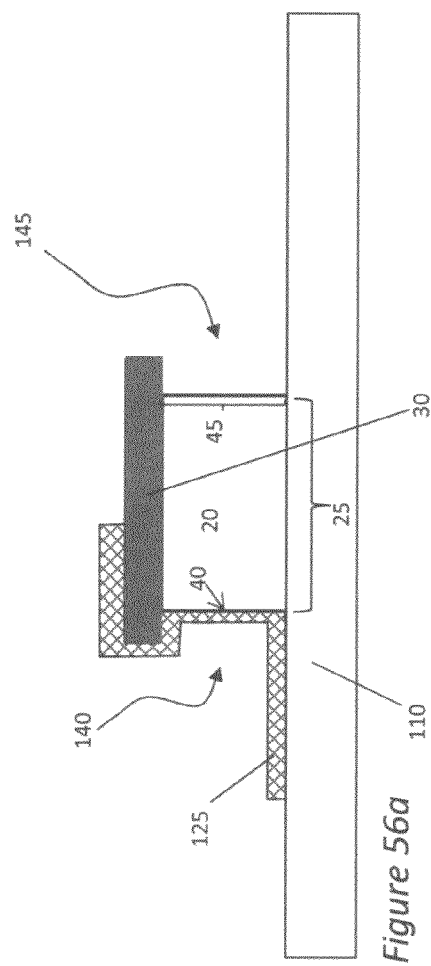
Figure 57A:
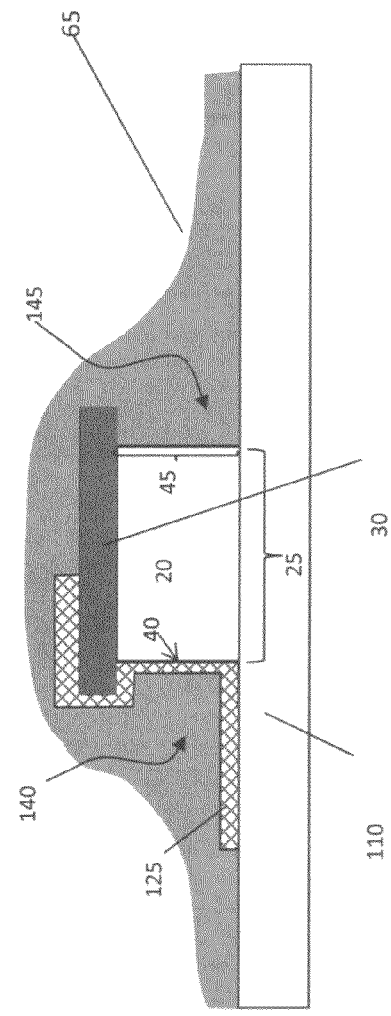

The formation of a patterned fill material for a single vertical transistor formed using the process flow of FIG. 55 can be understood through the partial descriptive process build shown in FIGS. 56a and 56b through 62a and 62b. In FIGS. 56a and 56b a substrate having the post 20, cap 30, and patterned conformal conductive material gate layer 125 on at least one edge of the post and over a portion of the substrate t are provided. In one embodiment, this structure is formed using Steps 810 through 855 of FIG. 34. In FIGS. 57a and 57b, a filler material 65 is coated as described in Step 950. The deposition method can include, but is not limited to, spray-coating, spin-coating, ink-jet coating, or slot-die coating. The uniformity of thickness of the layer is not critical. The filler material 65 fills the reentrant profile 145 opposite the reentrant profile 140 having the conformal conductive gate layer 125. The results of Step 960 in which a polymeric inhibitor is printed in a filler pattern, are shown in FIGS. 58a and 58b. The polymeric inhibitor layer 61 is printed in a filler pattern, and contains regions 62 where the inhibitor material is not present. As shown, the filler pattern is arranged so that at least a portion of the second reentrant profile is within the open regions 62 and preferably such that the first reentrant profile 140 is covered with the printed patterned inhibitor.

FIGS. 59a and 59b show the result of Step 970, after the inorganic thin film layer 151 is deposited by an Atomic Layer Deposition (ALD) process, to form a patterned inorganic filler layer 151 having the filler pattern. There is little to no deposition of the inorganic thin film in areas covered by deposition inhibitor 61. The patterned inorganic filler layer 151 is preferably a dielectric thin film. Next, the polymeric inhibitor 61 and the filler material 65 not protected by the inorganic filler layer 151 are removed. The processes useful for removing the polymeric inhibitor and the filler layer are the same as those described above for forming the post and cap. The structure shown in FIGS. 60a and 60b depicts the result of Step 980 after both the polymeric inhibitor layer 61 and the unprotected filler material 65 are removed.

To further aid in understanding how the filler material can be integrated into a full vertical transistor, the steps for forming the insulating layer 150 are shown. In FIGS. 61a and 61b, an inhibitor layer 75 is printed in a dielectric patterned as described in Step 862 of FIG. 34. The dielectric pattern includes open areas where the dielectric layer will be deposited. The open areas of the dielectric pattern are at least over a portion of the post and cap, over the gate layer. Next, a dielectric thin film is deposited using ALD as described in Step 863. The open areas of the dielectric pattern are coated with the dielectric thin film, while the areas covered by the polymeric inhibitor receive little or no deposition. The presence of the polymeric inhibitor causes the dielectric thin film to be deposited in a patterned manner, and forms a patterned conformal dielectric layer having the dielectric pattern on the gate layer. As shown in FIGS. 62a and 62b, the dielectric layer 150 also serves to encapsulate the filler material, covering the second reentrant profile so that, when forming the first electrode in later steps, it is easier to ensure that the first electrode can extend beyond the second reentrant profile 145 without being broken.

The remainder of the steps for forming a vertical transistor using the process of FIG. 55 can be understood from previous descriptions of the process of FIG. 34. In some embodiments, the first electrode 182 is formed to extend beyond the second reentrant profile. The extension of the first electrode allows for contact to be made to both the source and drain of the transistor at the level of the substrate. Alternative embodiments of the present invention include depositing the filler material 65 in the first reentrant profile prior to depositing the conformal conductive gate material layer 125. In one embodiment where the filler 65 is deposited prior to forming gate layer 125, the dielectric layer 151 is conformally coated over the post 20, cap 30 and filler material 65. Using filler material 65 to form the single vertical transistor with a polymeric post 20 and cap 30 prevents the deposition inhibitor from wicking into the filled reentrant profile, allowing the formation of an electrode that spans the cap and connects down to the level of substrate.

The post and cap structure also can be used to form two independent transistors over a common post and cap. Each transistor formed over the post and cap will have its own gate, source, drain and semiconductor portion. Using the post and cap structure to form two independent transistors has an advantage in circuit design and layout. Generally described, a device of the present invention including two independently operable vertical transistors includes a substrate and a polymeric material post on the substrate. The post has a height dimension extending away from the substrate to a top, the post having a first edge and a second edge located opposite the first edge along the height dimension. An inorganic material cap is on the top of the post, the cap covering the top of the post, the cap extending beyond the first edge to define a first reentrant profile and extending beyond the second edge to define a second reentrant profile. A conformal conductive gate layer has two portions. A first portion of the conformal conductive gate layer defining a first gate is located in at least the first reentrant profile. A second portion of the conformal conductive gate layer defines a second gate that is electrically independent from the first gate and is located in at least the second reentrant profile. A conformal electrically insulating layer maintains the first and second reentrant profiles and is in contact with the first gate and the second gate and at least a portion of the substrate. A conformal semiconductor layer includes a first portion and a second portion. The first portion of the semiconductor layer maintains the first reentrant profile and is in contact with the conformal electrically insulating layer that is in contact with the first gate, and the second portion of the semiconductor layer maintains the second reentrant profile and is in contact with the conformal electrically insulating layer that is in contact with the second gate. The first portion of the semiconductor layer and the second portion of the semiconductor layer are electrically independent from each other. A first electrode and a second electrode are associated with the first gate. The first electrode is in contact with the first portion of the semiconductor layer and located adjacent to the first reentrant profile. A second electrode is over the inorganic material cap and in contact with the first portion of the semiconductor layer. The first electrode and the second electrode define a first channel associated with the first gate of a first transistor. A third electrode and a fourth electrode are associated with the second gate. The third electrode is in contact with the second portion of the semiconductor layer and located adjacent to the second reentrant profile. A fourth electrode is over the inorganic material cap and in contact with the second portion of the semiconductor layer. The third electrode and the fourth electrode define a second channel associated with the second gate of a second transistor.

Referring to FIGS. 63a and 63b, a device of the present invention including two independently operable vertical transistors is shown. A schematic cross-sectional view of a vertical transistors 113 and 213 of the present invention is shown FIG. 63a, taken along the line A-A' of the plan view shown in FIG. 63b. As shown in FIG. 63a, TFTs 113 and 213 are each a vertical transistor structure, where the vertical portion is defined by the reentrant profiles 140,145 respectively formed by the post 20 and cap 30. The electrically conductive gate layer 125 is divided to have two portions so that vertical transistors 113 and 213 can be independently gated. The electrically conductive gate structure shown in FIG. 63a functions the same as the electrically conductive gate structures 120 shown in FIGS. 9 through 11 where there are two portions of the conductive gate layer 125, and should be understood from previous descriptions. The first and second portions of the gate layer 125 define first and second gates 126,127 that are within the first and second reentrant profiles 140,145 respectively. There is an insulating layer 330 in contact with the electrically conductive gate layer 125 and the substrate 110, and a semiconductor layer 350 is in contact with the insulating layer 330. As shown, the semiconductor layer 350 has been patterned so that it does not extend between the first and second reentrant profiles 140,145 over the cap, so that transistor 113 can remain electrically isolated from transistor 213.

A first electrode 370 and the third electrode 375 are located adjacent to the first and second reentrant profiles 340, 345, respectively. The vertical transistors 113 and 213 do not share a common electrode over the cap; instead, there is a second electrode 380 and a fourth electrode 385 in conformal contact with a third portion and a fourth portion of the semiconductor layer 350 on the top of the electrically conductive gate structure. The first electrode 370 and the second electrode 380 are vertically spaced due to the height of the post 20, and similarly the third electrode 375 and fourth electrode 385 are also spaced vertically. As shown, the first electrode 370 and the second electrode 380 define the ends of a first channel of a first transistor 113, while the third electrode 375 and the fourth electrode 385 define the ends of a second channel of a second transistor 213. The operation of vertical transistors 113 and 213 is identical to the individual operation of vertical transistors 100 and 200 and should be understood from the previous description. Preferably, the first electrode, the second electrode, the third electrode, and the fourth electrode are formed simultaneously and have the same material composition and layer thickness, and in some embodiments are transparent conductive oxides.

Figure 63C:
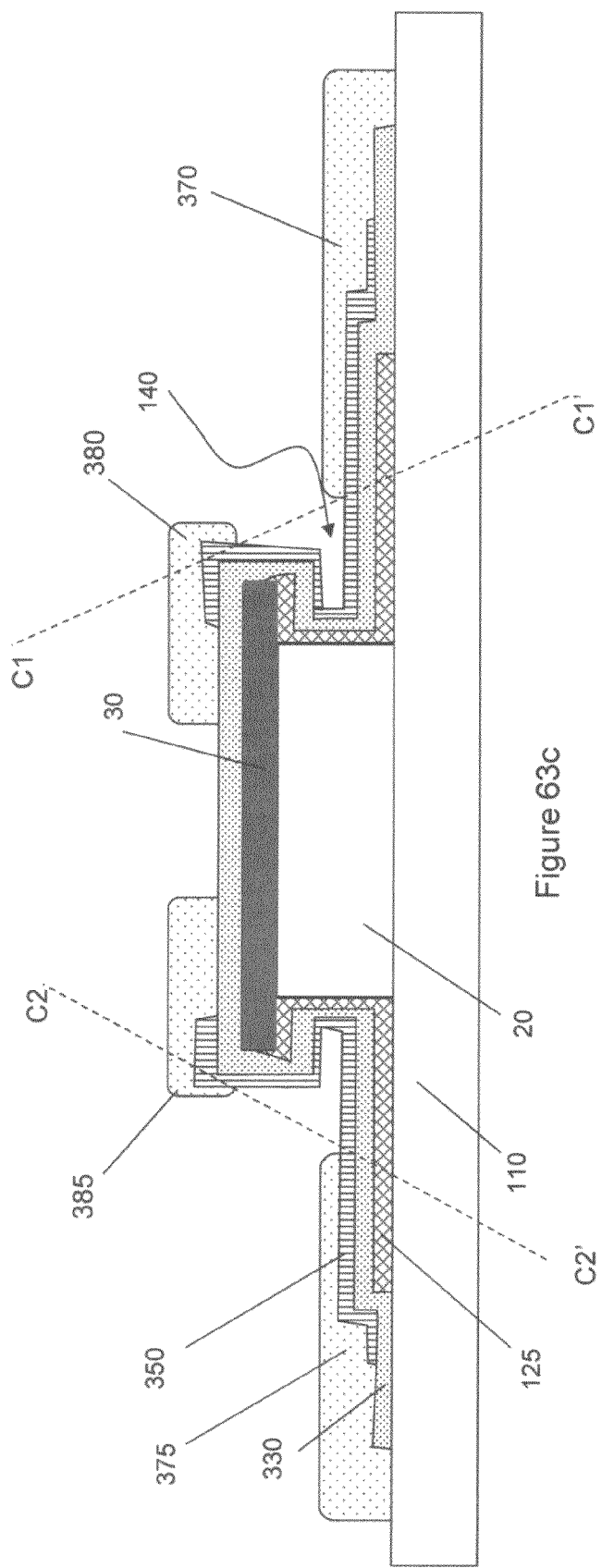
FIG. 63c is a schematic cross-sectional view highlighting the relationship between the electrodes of the vertical transistor shown in FIGS. 63a and 63b.

The structure shown in FIGS. 63a and 63b can be formed using a selective area deposition process to pattern the first, second, third and fourth electrodes 370, 380, 375, 385. A first line extending between the ends of the first channel is shown in FIG. 63c by line C1-C1'. A second line extending between the ends of the second channel is shown in FIG. 63c by line C2-C2'. As is clearly evident in FIG. 63c, the first line C1-C1' is not parallel to the second line C2-C2'. As such, in one embodiment of the present invention the first electrode 370 and the second electrode 380 define ends of the first channel, and the third electrode 375 and the fourth electrode 385 define ends of the second channel. A first line extending between the ends of the first channel is not parallel to a second line extending between the ends of the second channel. Vertical transistors having this relationship between their channels cannot be formed over a broad area by line-of-sight deposition techniques such as thermal evaporation of metals.

In some embodiments, the electrically insulating material layer 330 has a uniform thickness. In other embodiments, the first portion of the semiconductor material layer 350 and the second portion of the semiconductor material layer 350 have a uniform thickness. Substrate 110 can be flexible as described above. In some example embodiments, there is a conformal dielectric material layer on the cap 30, the edges 40 of the post 20, and at least a portion of the substrate 110. The conformal dielectric layer is located at least between the first gate 126 and the post 20, and the second gate 127 and the 20 post. As shown in FIG. 11, the two independently operable transistors can have another conductive material layer 122 positioned at least under a portion of the polymeric material post 20 and in electrical contact with the first gate 126, and not in contact with the second gate 127. As previously discussed, the conductive layer 122 is patterned to be discontinuous, so that there is no connection under the post 20, and so that the conductive layer has a first and second portion associated with the first and second gates. In this structure, the gates remain separate, and each transistor 113 and 213 can be independently operated.

The use of polymeric post 20 and cap 30 enables the formation of novel vertical transistor from novel processes. The post 20 and cap 30 also more generally provide a structure which allows for the formation of electrodes that are vertically separated due to the height of the post 20. According to an aspect of the invention, a vertically separated electrode structure includes a substrate and a polymeric material post on the substrate. The post has a height dimension extending away from the substrate to a top defined by a length dimension and a width dimension over the substrate, and edges along the height dimension. An inorganic material cap is on the top of the post, the cap covering the top of the post in the length dimension and the width dimension of the post, the cap extending beyond the edges of the post in at least the width dimension to define a first reentrant profile. A first electrode is located over the cap. A second electrode is located over the substrate and not over the post and adjacent to the reentrant profile such that a distance between the first electrode and second electrode is greater than zero when measured orthogonally to the substrate surface. The first electrode and second electrode have the same material composition and layer thickness.

As discussed previously, the simultaneous formation of the source and drain electrodes of the vertical transistors of the present invention is one use of the formation of vertically separated electrodes. This helps to reduce the number of steps involved in manufacturing vertical transistors. In other applications, it can be desirable to form conductive coatings with a minimum of separation in the x-y plane. Using the post 20 and cap 30 to vertically separate electrodes, allows for them to be in close proximity in a plane parallel to the plane of the substrate.

Figure 64:
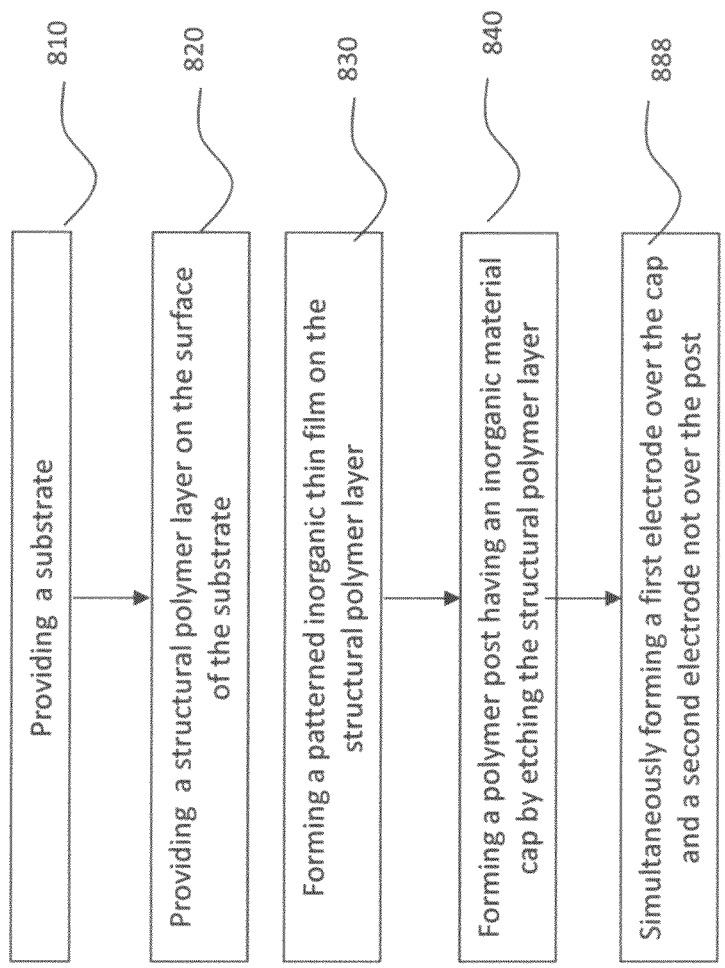
FIG. 64 is a flow chart describing an example embodiment of a process of forming vertically separated electrodes for use in the present invention.

A process flow for forming the two vertically spaced electrodes is shown in FIG. 64. The first four steps are the same as those steps described with reference to FIG. 12. In Step 810, a substrate is provided into the system followed by providing a structural polymer layer on the substrate surface in Step 820. Next, a patterned inorganic thin film is formed on the structural polymer layer in Step 830, followed by the formation of a post and cap structure by etching the structural polymer layer in Step 840. In FIG. 64, the Step 888 is functionally equivalent to Step 880 of FIG. 12. In Step 888, a first electrode is formed over the cap simultaneously with a second electrode being formed not over the post. This can be accomplished by using a line-of-sight deposition process such as a metal evaporation process. In this embodiment, the portion of the cap which overhangs the walls of the post cap prevents the metal from depositing within the reentrant profile. The metal can be further patterned after deposition using standard photolithographic techniques. Alternative line-of-sight deposition techniques include sputtering and reactive sputtering in order to deposit metals, alloys or conductive metal oxides. In other example embodiments, Step 888 includes using selective area deposition in combination with ALD to simultaneously form the first and second electrodes. In these embodiments, an inhibitor is used to pattern a conductive thin film layer. The inhibitor is present in at least the reentrant profile defined by the cap and post structure, preventing the conductive thin film from depositing in the reentrant profile and specifically over the walls of the post. In some embodiments, where the inhibitor is present only within the reentrant profile, the conductive material is further patterned using standard photolithographic techniques. When using selective area deposition to define the first and second electrodes it is preferred to use ALD, and most preferred to use spatial ALD. The formation of the first and second electrodes defines the channel of the vertical transistor which includes the portion of the semiconductor over the wall of the post. Additionally, in all embodiments the simultaneous formation of the first and second electrodes results in a structure where the first electrode is located in contact with a first portion of the semiconductor layer over the cap and the second electrode located in contact with a second portion of the semiconductor layer over the substrate and not over the post. As such, the first and second electrodes are different distances from the substrate surface and the distance between the first and second electrodes is greater than zero when measured orthogonal to the substrate surface.

Figure 65:
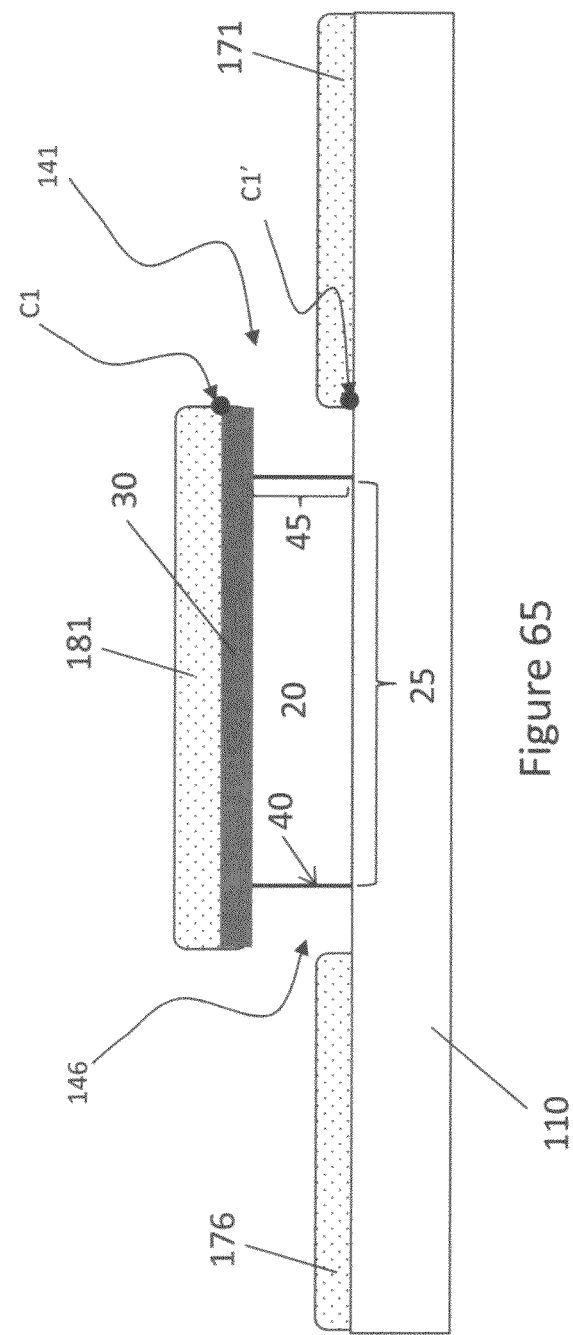
FIG. 65 is a schematic cross-sectional view of an example embodiment of a vertical transistor of the present invention including vertically separated electrodes formed over a structural polymer post and inorganic cap.

FIG. 65 illustrates two vertically spaced electrodes separated by the height of a polymer post 20 and inorganic cap 30. As shown, the post 20 and cap 30 form a first reentrant profile 141 and second reentrant profile 146. The first electrode 181 and the second electrode 171 can include a conductive layer stack. The first electrode 181, second electrode 171 and third electrode 176 can be a single conductive material, as shown in FIG. 64, or can include any number of conductive material layers. The first electrode 181 is located over the cap, and the second electrode 171 electrode is located in over the substrate and not over the post, as shown in FIG. 64. The first electrode 181 has an edge into the plane of FIG. 64 along the line defined by point C1. As shown in FIG. 1a, point C1 is above the substrate surface. Similarly, the second electrode 171 has an edge into the plane of FIG. 64 along the line defined by point C1'. As shown in FIG. 65, the first electrode 181 and second electrode 171 are different distances from the substrate surface (see points C1 and C1'). Stated another way, the distance between the first electrode 181 and second electrode 171 is greater than zero when measured orthogonal to the substrate surface.

The first electrode 181 and second electrode 171 are formed simultaneously, and, therefore, have the same material composition and layer thickness. In some embodiments, the first electrode 181 and second electrode 171 are formed by a line-of-sight deposition resulting in a structure where the first electrode 181 and the second electrode 171 are vertically aligned. Stated more explicitly, the first electrode 181 has an end (C1) and the second electrode 171 has an end (C1'), and the end (C1) of the first electrode 181 and the end (C'1) of the second electrode 171 are vertically aligned. In some embodiments, the first electrode 181 and second electrode 171 are transparent conductive oxides. It should be understood that examples of the post 20 and cap 30 previously discussed are useful to form the vertically separated electrodes 181 and 171 shown in FIG. 65, including both structures and materials composition.

In some embodiments, a conformal dielectric material layer is located on the cap 30, the edges 40 of the post 20, and at least a portion of the substrate 110, the conformal dielectric layer being located at least between the first electrode 181 and cap 30. The conformal dielectric layer can also be located between the second electrode 171 and the substrate. Preferably, the conformal dielectric layer is a uniform coating and is under all of the electrodes. The conformal dielectric layer should be further understood from the previous descriptions.

As shown in FIG. 65, the post has another edge along the height dimension and the cap 30 extends beyond the other edge of the post 20 to define a second reentrant profile 146. In some embodiments, as described above, the structure can be used to form three electrically isolated electrodes. In other embodiments, the first electrode 181 located over the cap 30 extends to conformally cover the second reentrant profile 146. This results in a structure having two electrically separated electrodes, separated vertically due to the post 20 and cap 30 structure, which can each be advantageously contacted at the level of the substrate. Additionally, there can be a filler material in the second reentrant profile. The filler material provides a profile that helps enable the extended first electrode 181 to react the substrate surface without become disconnected due to the presence of the second reentrant profile 145.

EXAMPLES

Description of the Coating Apparatus

Figure 66:
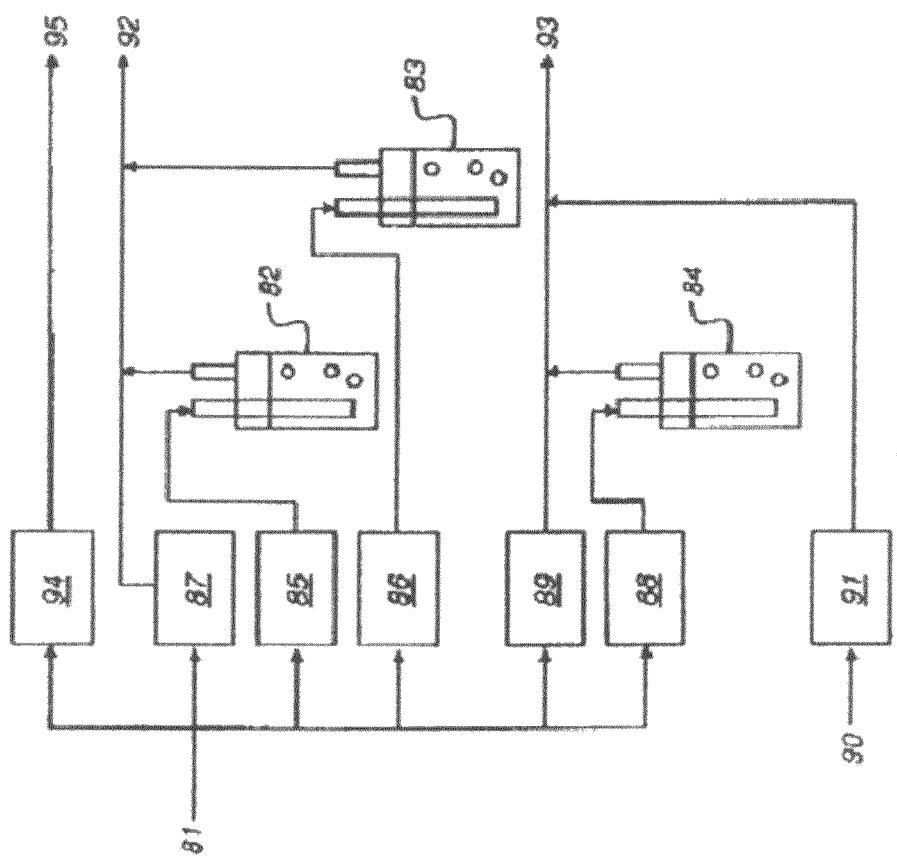
FIG. 66 is a schematic view of a deposition device, used in an exemplified process, showing the arrangement of gaseous materials provided to a substrate subject to the thin film deposition process of the examples described herein.

The process of depositing the inorganic thin film layers of the following examples all employ a flow setup as described with reference to FIG. 66. The flow setup is supplied with nitrogen gas flow 81 that has been purified to remove oxygen and water contamination to below 1 ppm. The gas is diverted by a manifold to several flow meters which control flows of purge gases and of gases diverted through bubblers to select the reactive precursors. In addition to the nitrogen supply, air flow 90 is also delivered to the apparatus. The air is pretreated to remove moisture.

The following flows are delivered to the ALD coating apparatus: metal (zinc) precursor flow 92 containing metal precursors diluted in nitrogen gas; oxidizer-containing flow 93 containing non-metal precursors or oxidizers diluted in nitrogen gas; and nitrogen purge flow 95 composed only of the inert gas. The composition and flows of these streams are controlled as described below.

Figure 67:
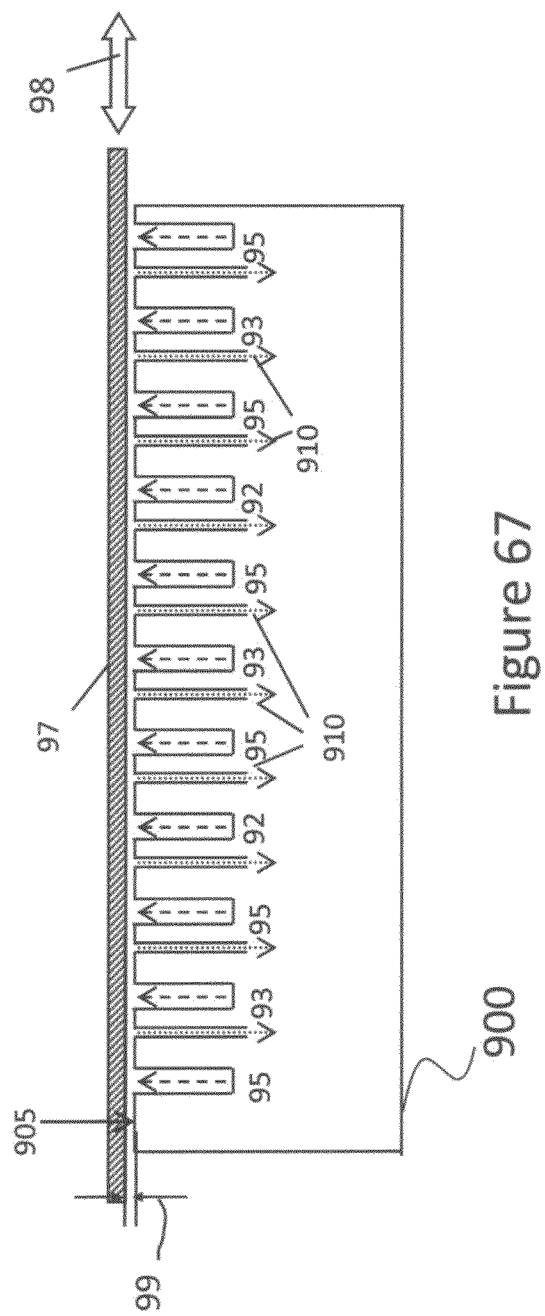
FIG. 67 is a schematic cross-sectional view of a delivery head, used with the deposition device of FIG. 66, showing the arrangement of gaseous materials provided to a substrate subject to the thin film deposition process of the examples described herein.

Gas bubbler 83 contains liquid dimethylaluminum isopropoxide (DMAI) and gas bubbler 82 contains diethyl zinc (DEZ). Flow meter 86 and flow meter 85 deliver flows of pure nitrogen to the bubblers. The output of the bubbler now contains nitrogen gas saturated with the respective precursor solution. The output flow is mixed with a nitrogen gas dilution flow delivered from flow meter 87 to yield the overall flow of metal precursor flow 92. In the following examples, the flows for the dielectric material are as follows:

Flow meter 86: To Dimethylaluminum isopropoxide Bubbler Flow
Flow meter 87: To Metal Precursor Dilution Flow Gas bubbler 84 contains pure water at room temperature. Flow meter 88 delivers a flow of pure nitrogen to gas bubbler 84, the output of which represents a stream of saturated water vapor. An airflow is controlled by flow meter 91. The water bubbler output and air streams are mixed with dilution stream from flow meter 89 to produce the overall flow of oxidizer-containing flow 93 which has a variable water vapor composition, nitrogen composition, and total flow. In the following examples, the flows will be as follows:

Flow meter 88: To Water Bubbler
Flow meter 89: To Oxidizer Dilution Flow
Flow meter 91: To Air Flow Flow meter 94 controls the flow of pure nitrogen that is to be delivered to the coating apparatus. Streams or flows 92, 93, and 95 are then delivered to an atmospheric pressure coating head where they are directed out of the channels or micro-chamber slots as indicated in FIG. 67. A gap 99 exists between the elongated channels and the substrate 97. Substrate 97 is maintained in close proximity to the output face 905 by an equilibrium between the flow of the gases supplied to the output face and a slight amount of vacuum produced at the exhaust slot.

In order to perform a deposition, the delivery head 900 is positioned over a portion of the substrate 97 and then moved in a reciprocating fashion over the substrate 97, as represented by the arrow 98. The length of the reciprocation cycle was 32 mm. The rate of motion of the reciprocation cycle was varied as a deposition parameter.

Materials Used:
(1) Glass substrates, cut to 2.5×2.5" squares, previously cleaned in Piranha solution, washed with distilled water, reagent ethanol and dried.
(2) Dimethylaluminum isopropoxide (DMAI) (commercially available from Strem Chemical Co.).
(3) Diethylzinc (DEZ) (commercially available from Strem Chemical Co.).
(4) Polyvinylpyrrolidone (PVP) k-30 (commercially available from Acros Organics).

General Conditions for the Preparation of Layers Using Atmospheric Pressure ALD

This describes the preparation of a thin film coating of the material layers on glass substrates as used in the examples. The ALD coating device used to prepare these layers, namely $Al_2O_3$, ZnO:N, and Al-doped ZnO (AZO), has been described in detail in US Patent Application Publication No. US 2009/0130858, the disclosure of which is incorporated by reference herein in its entirety. The coating device has an output face (facing up) that contains spatially separated elongated gas channels and operates on a gas bearing principle. The coating device can be understood with respect to FIGS. 66 and 67. Each gas channel is composed of an output slot 95, 93, 92 which supplies gas to the output face 905, and adjacent exhaust slots 910 which remove gas from the output face 905. The order of the gas channels is P-O-P-M-P-O-P-M-P-O-P where P represents a purge channel, O represents a channel containing an oxygen based precursor, and M represents a channel containing a metal based precursor. As a substrate moves relative to the coating head it sees the above sequence of gases which effects ALD deposition.

A 2.5×2.5 inch square (62.5 mm square) glass substrate attached to a heated backer is positioned on the output face of the coating device and is maintained in close proximity to the output face by an equilibrium between the flow of the gases supplied to the output face and a slight amount of vacuum produced at the exhaust slot. For all of the examples, the exhaust slot pressure was approximately 40 inches of water below atmospheric pressure. The purge gas P is composed of pure nitrogen. The oxygen reactive precursor O is a mixture of nitrogen, water vapor, and optionally ammonia vapor. The metal reactive precursor M is one or a mixture of active metal alkyls vapor in nitrogen.

The metal alkyl precursors used in these examples were dimethylaluminum isopropoxide (DMAI) and diethyl zinc (DEZ). The flow rate of the active metal alkyl vapor was controlled by bubbling nitrogen through the pure liquid precursor contained in an airtight bubbler by means of individual mass flow control meters. This saturated stream of metal alkyl was mixed with a dilution flow before being supplied to the coating device. The flow of water vapor was controlled by adjusting the bubbling rate of nitrogen passed through pure water in a bubbler. This saturated stream of water vapor was mixed with a dilution flow before being supplied to the coating device. The flow of ammonia vapor was controlled by passing pure ammonia vapor from a compressed fluid tank through a mass flow controller and mixing with the water vapor stream. All bubblers were held at room temperature. The temperature of the coating was established by controlling heating both the coating device and the backer to a desired temperature. Experimentally, the flow rates of the individual gasses were adjusted to the settings shown in Table 1 for each of the material layers coated in the examples contained herein. The flows shown are the total flows supplied to the coating device, and thus are partitioned equally among the individual gas channels.

The coating process was then initiated by oscillating the coating head across the substrate for the number of cycles necessary to obtain a uniform deposited film of the desired thickness for the given example. Due to the fact that the coating head as described above contains two full ALD cycles (two oxygen and two metal exposures per single direction pass over the head), a round trip oscillation represents 4 ALD cycles. In all of the experimental examples, the growth temperature used was 200° C.

TABLE 1

| Layer | DMAI bubbler flow (sccm) | TMA bubbler flow (sccm) | DEZ bubbler flow (sccm) | NH3 flow (sccm) | Water bubbler flow (sccm) | $N_2$ dilution with Metal Alkyl (sccm) | $N_2$ dilution with water (sccm) | $N_2$ Inert Purge (sccm) | Residence Time (ms) |
|---|---|---|---|---|---|---|---|---|---|
| $Al_2O_3$ | 65 | 0 | 0 | 0 | 65 | 1500 | 2250 | 3000 | 100 |
| $Al_2O_3$ | 0 | 30 | 0 | 0 | 22.5 | 1500 | 2250 | 3000 | 50 |
| ZnO | 0 | 0 | 60 | 0 | 45 | 1500 | 2250 | 3000 | 50 |
| AZO | 10 | 0 | 30 | 0 | 22.5 | 1500 | 2250 | 3000 | 50 |

TFT Experiments

The vertical transistors of the present invention have advantages over planar transistor formed using the same materials and over vertical transistors having metal cores which form the reentrant profile. Generally, the vertical transistors of the present invention have shorter channel lengths than are easily obtainable from the standard processing for planar transistors. In some embodiments, where the entire vertical transistor is formed using printing processes the channel length of the transistor is less than the print resolution (which is unobtainable for a planar transistor whose channel is defined by printing). The vertical transistors of the present invention allow for lower parasitic capacitance than their metal core counterparts, and can be fabricated using simple printing processes. The following Examples serve to illustrate the advantages of various embodiments of the present invention and present process.

Comparative Example C1

Patterned-by-Printing Planar Transistor

Planar Bottom gate thin film transistors were fabricated using the processes described in commonly assigned pending U.S. patent application Ser. Nos. 13/600,266 and 13/600,264, filed Aug. 31, 2012, the disclosures of which are incorporated by reference herein in their entirety, to be used as a control for the vertical printed transistors of the present invention. To fabricate Comparative Example C1, a glass substrate was provided and cleaned using an O2 plasma process. Then the gate was provided using the combination of selective area deposition (SAD) and ALD, by first printing a deposition inhibitor material and then using the Atmospheric ALD system described above to coat AZO, thereby providing a gate having 1000 A of AZO. The printed deposition inhibiting material layer was applied using a Fuji Dimatix 2500 piezo-inkjet printer, and the inhibitor ink was a 2 wt % solution of polyvinyl pyrrolidone k-30 (PVP) in diacetone alcohol. The 10 pL cartridge was used with the Dimatix printer, and the print drop spacing was set to be 70 microns. The inhibitor was removed to complete the gate layer using a 2 minute $O_2$ plasma treatment to remove the inhibitor.

Next, 750 Å of $Al_2O_3$ was deposited as the dielectric layer in two layers. Experimentally, the inhibitor dielectric pattern was printed, and 500 Å of $Al_2O_3$ was deposited at 200° C., using the conditions listed for $Al_2O_3$ in Table 1 and 1164 ALD cycles each with a 100 ms residence time on the Atmospheric ALD equipment described above. Next the sample was subjected to a 2 minute $O_2$ plasma treatment to remove the inhibitor and clean the interface between the two layers of $Al_2O_3$. Next, the semiconductor inhibitor pattern was printed and 250 Å of $Al_2O_3$ was deposited at 200° C., using the conditions listed for $Al_2O_3$ in Table 1 and 582 ALD cycles each with a 100 ms residence time on the Atmospheric ALD equipment described above. The sample was removed from the Atmospheric ALD equipment to facilitate the switch to ZnO deposition. The sample was then reloaded into the equipment without any surface modification and 300 Å of N-doped ZnO was deposited at 200° C., using the conditions listed for ZnO:N in Table 1 and 30 ALD cycles each with a 50 ms residence time. The inhibitor was removed to complete the semiconductor layer using a 2 minute $O_2$ plasma treatment.

The source and drain were formed by selectively depositing 1000 Å of AZO using a printed pattern of PVP inhibitor to define the electrode pattern. 1000 Å of AZO was deposited at 200° C., using the conditions listed for AZO in Table 1. After depositing the AZO, comparative Example C1 was complete and testing was completed without removing the deposition inhibitor material. The pattern used in the formation of C1 contained 133 individual transistors; each transistor as fabricated had a characteristic channel width and length of 70 microns and 400 microns respectively. The channel length was defined by a single row of printed drops, and represents the minimum feature size obtainable with the print system as used in these Examples. Electrical testing of the transistors was accomplished by using a probe station to contact the AZO gate and source/drain. The transistors were swept in the linear regime, with the drain being held constant at 0.2 V (Vd=0.2), and the gate voltage was swept from −10 V to 20 V. The mobility (Mob.), threshold voltage (Vth), on-off ratio of the drain current (Ion/Ioff), the average gate leakage current at the maximum gate voltage applied (Ig(vgmax)), Comparative Example C1 and reported in Tables 2 below.

Printed Vertical Transistors

Vertical thin film transistors with polymer cores were fabricated using an all printing process as described above in reference to the process flow shown in FIG. 34, and the descriptive build of FIGS. 35a and 35b though FIGS. 51a and 51b. They were formed on 2.5 inch square glass substrates.

Inventive Example I1

Four pixel with Printed VTFT

To fabricate Inventive Example I1, a glass substrate was provided and cleaned using an $O_2$ plasma (100 W 0.3 Torr for 1 minute). Next, a 40 wt % solution of SU-8 2010 in cyclopentanone was spun for 10 sec at 500 rpm and ramped to a final spin of 30 sec at 2000 rpm. This coating was cured using a recipe consisting of a two minute pre-exposure hot plate bake at 95° C., 90 second blanket exposure, a two minute post-exposure hot plate bake at 95° C. and final hard bake at 225° C. for 5 minutes resulting in a 7500 Å film of cured SU-8.

Next, the surface of the SU-8 was treated with a 30 second $O_2$ plasma to activate the surface of the SU-8. The inorganic cap was formed over the SU-8 layer using the combination of SAD and ALD. Selective area deposition was done using a patterned deposition inhibiting material layer using a Fuji Dimatix 2500 piezo-inkjet printer, as described in reference to Comparative Example C1 at the same 70 micron dot spacing. The inhibitor ink was the same PVP ink used C1. The PVP ink was printed in a pattern such that the open area defined the pattern of the inorganic cap. Next, 1000 Å of AZO was deposited using the S-ALD system described above and the conditions in Table 1.

After forming the patterned inorganic thin film layer (AZO) for the cap, the post was formed using a 300 W 0.4 Torr $O_2$ plasma for 6 minutes, resulting in a cap 30 and post 20 structure with a reentrant profile 140 (as seen in FIGS. 37a and 37b). The $O_2$ plasma removed the PVP inhibitor and etched the SU-8 in the same process step.

Next, the conductive gate layer was provided as in Steps 852, 853 and 855 as illustrated in FIGS. 38a and 38b through FIGS. 40a and b, using the combination of SAD and ALD, providing a gate 120 having 1000 A of AZO within the reentrant profile. This was done by printing the PVP ink in the gate layer pattern, and depositing 1000 Å of AZO was deposited using the S-ALD system described above and the conditions in Table 1. The PVP was then removed using a 2 minute low power O2 plasma (100 W 0.3 Torr) to complete the gate layer.

The combination of SAD and ALD was also used to pattern the insulating layer 150, thereby forming a portion of thin film dielectric layer by selectively depositing an inorganic dielectric material the regions of the substrate where the first deposition inhibiting material layer is not present using an atomic layer deposition process. The insulating layer 130 covers the gate layer 125 at least in the reentrant profile 140 as shown in FIG. 43a. Inventive Example I1 had the PVP ink printed on the substrate as in FIGS. 42a and 42b, and then 250 A of $Al_2O_3$ was deposited at 200° C., using the conditions listed for $Al_2O_3$ (DMAI and H2O as the precursors) in Table 1. To complete the pattern, the PVP ink was removed using a low power oxygen plasma.

In Example I1, a buffer layer was deposited via selective area deposition (as shown in FIG. 45c). The buffer layer forms another portion of the thin film dielectric layer 130. In this step, the pattern of the semiconductor layer was printed as shown in FIGS. 44a and 44b, and 250 Å of $Al_2O_3$ was deposited at 200° C. as above. This step have been found to be important for TFTs that are formed by the combination of SAD and ALD, since special care should be taken to insure that when changing between the dielectric pattern and the semiconductor pattern that the interface is not disturbed by the removal of the deposition inhibiting material.

To this end, the semiconductor layer 150 was deposited using the same pattern shown in FIGS. 44a and 44b, after depositing the aluminum oxide, but without any intervening process steps. In the present Example I1, nitrogen doped zinc oxide (ZnO:N) was deposited as the semiconductor layer 150 at 200° C., using the conditions listed for ZnO:N in Table 1. The patterned semiconductor layer 150 has the same pattern as the buffer layer 155.

Next, the drain and source electrodes were formed by using selective area deposition of a conductive inorganic material using an atomic layer deposition process. This was done by printing a patterned polymeric inhibitor such that the inhibitor wicks along the reentrant profile in the length dimension of the post. In Example I1, there the open area 80 in the inhibitor pattern as shown in FIG. 47a was designed to be 4 pixels wide in the area of the reentrant profile. The same PVP ink and Dimatix printer was used in this step as was used in the previous patterning steps, such that 4 pixels is the equivalent distance of 280 microns. The inhibitor wicks, or moves by capillary action, along the reentrant profile from each edge of the open pattern 80. In order to have a functional VTFT, the inhibitor ink must meet up such that the reentrant profile is completely protected along the width of the transistor.

After printing the inhibitor pattern containing the open area 80, 1000 Å of AZO was deposited using the 1000 Å of AZO was deposited at 200° C., using the conditions listed for AZO in Table 1 as the drain/source (180, 170). The wicked inhibitor prohibited the growth of AZO within the reentrant profile to form separate electrodes via selective area deposition. The VTFT of Inventive Example 1 was complete after the deposition of the AZO, and testing was completed without removing the deposition inhibitor material.

Inventive Example I2

Three Pixel with Printed VTFT Layer

Inventive Example I2 was formed using the same process, and on the same substrate, as Inventive Example I1. The only difference between Inventive Example I2 and I1, is that Inventive Example I2 had a 3 pixel wide pattern used to define the width of the transistor when forming the source and drain electrodes.

Figure 68A:
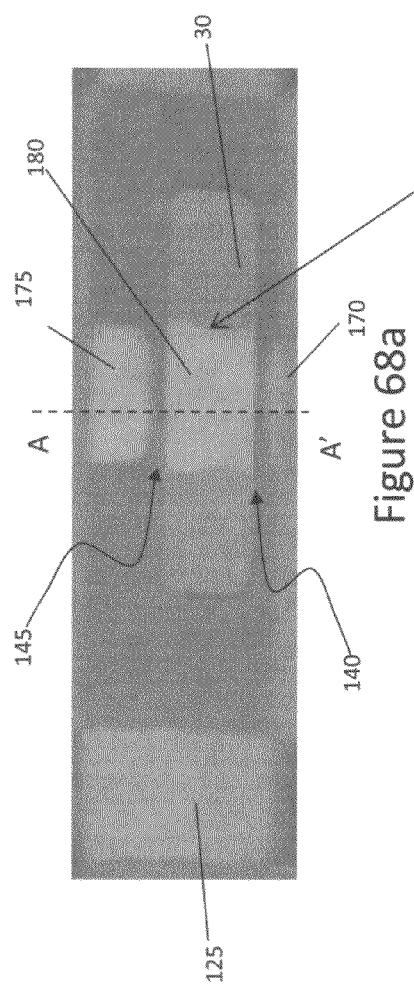
FIGS. 68a through 68c are images of a vertical transistor of the present invention as described in relationship to inventive example I2 with FIG. 68a being an optical micrograph, FIG. 68b being a SEM image of one side of the vertical transistor, and FIG. 68c being a magnified view of a reentrant profile of a vertical transistor.
Figure 68B:
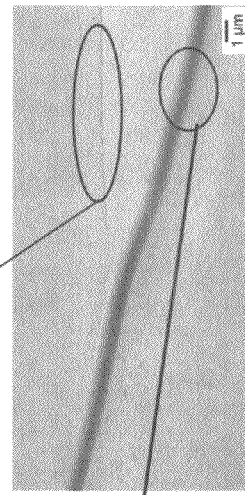
Figure 68C:
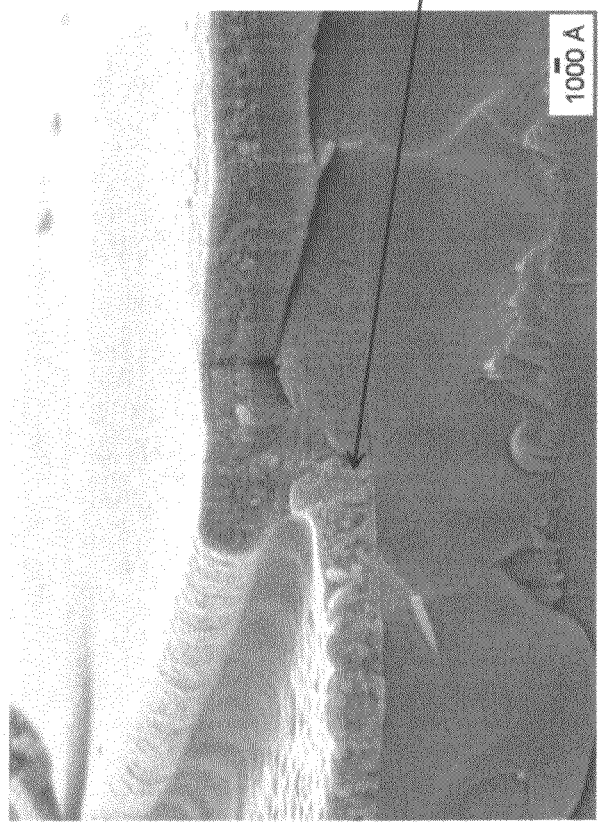

The VTFT of Inventive Example I2 is shown in FIGS. 68a through 68c. FIG. 68a is an optical micrograph of the complete VTFT. The first, second and third electrodes (180, 170 and 175) are labeled as in FIG. 1b for ease of understanding. The post and cap structure is identified by the outline of the cap 30. The optical micrograph of FIG. 68a illustrates the feature of the present invention where the channel defined by the first electrode and the second electrode including a width dimension and a length dimension, wherein the length dimension varies along the width dimension of the transistor. FIG. 68b is a SEM image showing the reentrant profile and the edge of the first electrode and second electrodes over the cap and the substrate respectively. FIG. 68c is a cross-sectional SEM taken along the line A-A' of the optical micrograph in FIG. 68a showing the polymer post, the reentrant profile and the conformal coatings.

Inventive Example I3

Two Pixel with Printed VTFT

Inventive Example I3 was formed using the same process, and on the same substrate, as Inventive Example I1. The only difference between Inventive Example I3 and I1, is that Inventive Example I3 had a 2 pixel wide pattern used to define the width of the transistor when forming the source and drain electrodes.

Inventive Example I4

One Pixel with Printed VTFT

Inventive Example I4 was formed using the same process, and on the same substrate, as Inventive Example I1. The only difference between Inventive Example I4 and I1, is that Inventive Example I4 had a 1 pixel wide pattern used to define the width of the transistor when forming the source and drain electrodes.

Figure 69A:
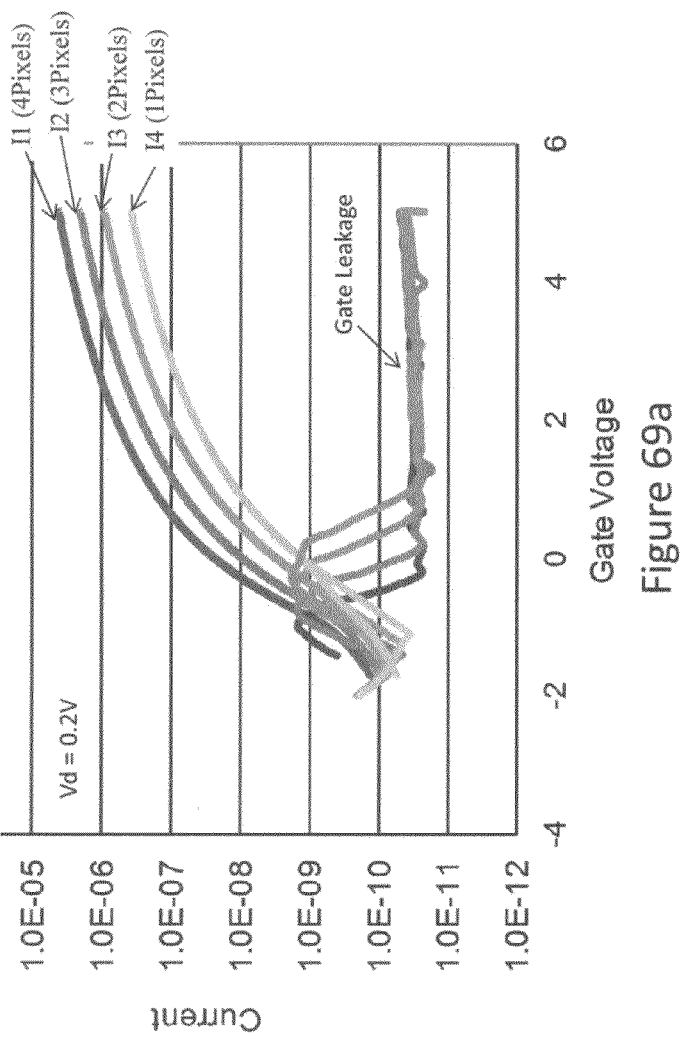
FIG. 69a is a graph showing performance $I_{ds}$-$V_g$ curve characteristics from the transistors of inventive examples I1 through I4.
Figure 69B:
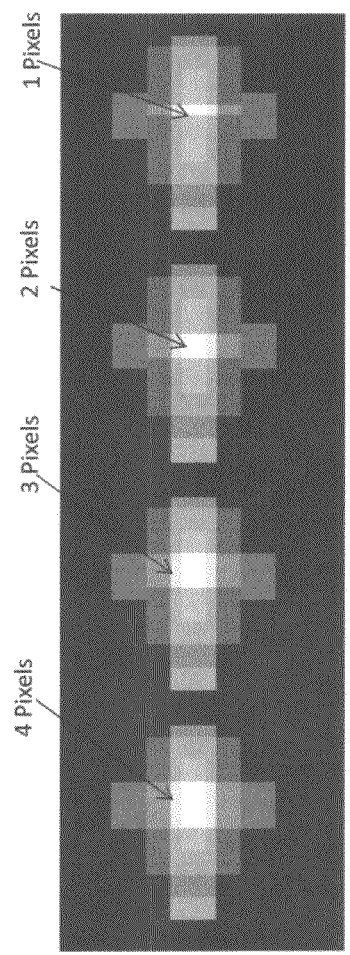
FIG. 69b schematically shows example embodiments of patterns used to form the vertical transistors of inventive examples I1 through I4.

Electrical testing of Inventive Examples I1-I4 was accomplished by using a probe station to contact the AZO gate and the two electrodes at the substrate level (the second 170 and third 175 electrodes as shown in FIGS. 50a and 50b), so that the first transistor and second transistor were connected in series. The transistors were swept in the linear regime, with the drain being held constant at 0.2 V (Vd=0.2), and the gate voltage was swept from −2 V to 5 V. The curves can be found in FIG. 69a, and it is clear that the source and drain electrodes are not shorted each other, or to the gate of the vertical transistors. Additionally, the expected increase in current with increasing width of the transistor is observed. FIG. 69b illustrates the different patterns used to form Inventive Examples I1 through I4.

In Examples I1-I4, there were four patterns used that contained open area 80 in the inhibitor pattern as shown in FIG. 47a. In these variations, the open area 80 was either 4, 3 2 or 1 pixel wide in the area of the reentrant profile. The same PVP ink and Dimatix printer was used in this step as was used in the previous patterning steps. The inhibitor wicks, or moves by capillary action, along the reentrant profile from each edge of the open pattern 80. In order to have a functional VTFT, the inhibitor ink must meet up such that the reentrant profile is completely protected along the width of the transistor. Using variation in open area, and therefore transistor width, allows one to access the wicked profile. Further exploring the relationship between the size of area 80 and the printed inhibitor, as well as the use of the optional dielectric layer 115, Inventive Examples I5 through I7 were run.

Inventive Example I5

Four Pixel with Printed VTFT

Inventive Example I5 was formed using the same process as Inventive Example I1 with the following exceptions. Inventive Example I5 used a 33.5% solution of SU-8 in cyclopentanone, resulting in a cured polymer film thickness of 6000 Å. Instead of forming the inorganic cap from 1000 Å of AZO, Inventive Example I5 deposited 250 Å of aluminum oxide from DMAI and $H_2O$ using the conditions found in Table 1. After forming the reentrant profile, a 250 Å thick film of aluminum oxide was deposited over the entire substrate. The gate layer was deposited as in Inventive Example I1, resulting in the structure shown in FIG. 6. Inventive Example I5, was completed as in I1, except a thinner buffer layer of 150 Å was used in I5 instead of the 250 Å buffer layer of I1.

Inventive Example I6

Three Pixel with Printed VTFT

Inventive Example I6 was formed using the same process, and on the same substrate, as Inventive Example I5. The only difference between Inventive Example I6 and I5, is that Inventive Example I6 had a 3 pixel wide pattern used to define the width of the transistor when forming the source and drain electrodes.

Inventive Example I7

Two Pixel with Printed VTFT

Inventive Example I7 was formed using the same process, and on the same substrate, as Inventive Example I5. The only difference between Inventive Example I7 and I5, is that Inventive Example I7 had a 2 pixel wide pattern used to define the width of the transistor when forming the source and drain electrodes.

Figure 70:
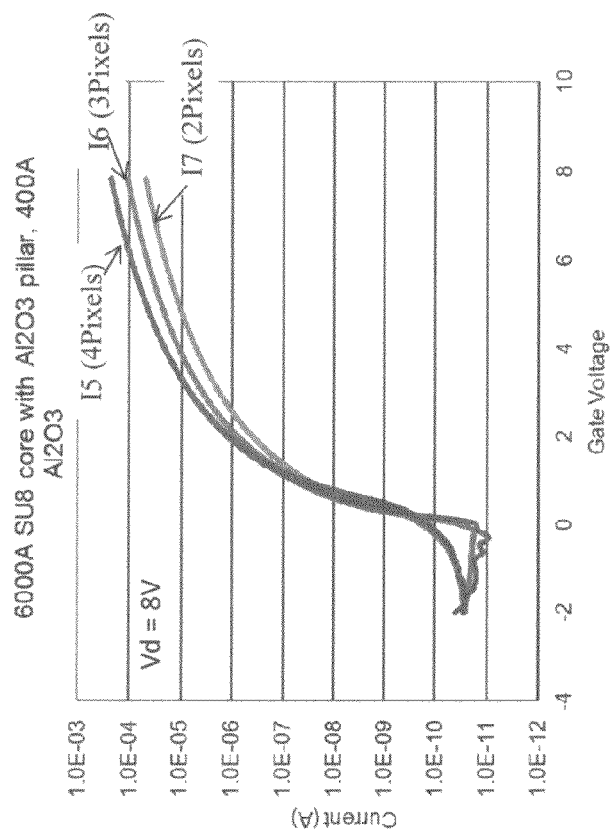
FIG. 70 is a graph showing performance $I_{ds}$-$V_g$ curve characteristics from the transistors of inventive examples I5-I7 as measured with $V_d$=8 Volt.

Electrical testing of Inventive Examples I5-I7 was accomplished by using a probe station to contact the AZO gate and the two electrodes at the substrate level (the first 170 and third 175 electrodes as shown in FIGS. 5a and 5b), so that the first transistor and second transistor were connected in series. The transistors were swept in the linear and saturation regime, with the drain being held constant at 0.2 V or 8V (Vd=0.2, Vd=8) respectively, and the gate voltage was swept from −2 V to 8 V. The mobility (Mob.), threshold voltage (Vth), on-off ratio of the drain current (Ion/Ioff), the average gate leakage current at the maximum gate voltage applied (Ig(Vgmax)) were evaluated for the Examples below and reported in Tables 2. The saturation curves can be found in FIG. 70, and it is clear that the source and drain electrodes are not shorted each other, or to the gate of the vertical transistors. Additionally, the expected increase in current with increasing width of the transistor is observed.

TABLE 2

| Sample | Vd (Volt) | W (micron) | 2 × L (micron) | Mobility | Vth | Ion/Ioff | Ig (Vgmax) |
|---|---|---|---|---|---|---|---|
| C1 | 0.2 | 400 | 70 (L, single planar TFT) | 10.2 | 9.7 | 4.8E+05 | 1.5E−10 |
| I5 | 0.2 | 254 | 17 | 12.2 | 4.0 | 5.6E+05 | 3.4E−11 |
| I5 | 8 | 254 | 17 | 10.5 | 3.0 | 7.0E+06 | 2.6E−11 |
| I6 | 0.2 | 185 | 28 | 12.4 | 3.9 | 2.0E+05 | 3.9E−11 |
| I6 | 8 | 185 | 28 | 10.0 | 2.9 | 2.8E+06 | 3.0E−11 |
| I7 | 0.2 | 111 | 53 | 17.4 | 3.9 | 8.2E+04 | 3.9E−11 |
| I7 | 8 | 111 | 53 | 13.7 | 2.8 | 1.2E+06 | 2.2E−11 |

Figure 71:
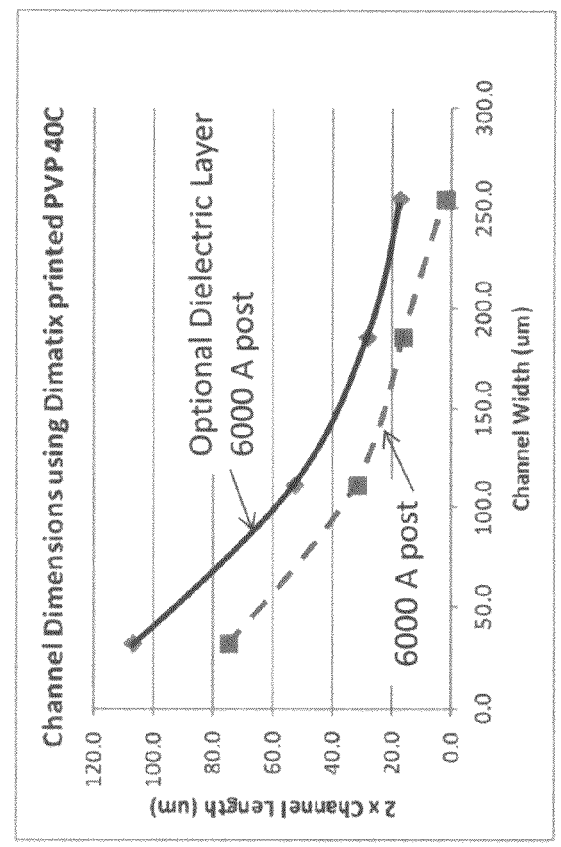
FIG. 71 is a graph showing the relationship of channel length and channel width for vertical transistors of an example embodiment of the present invention.

FIG. 71 illustrates the impact on the different patterns used to form Inventive Examples I1 through I7. As shown, the wider the opening in the inhibitor pattern used to define the transistor width, the shorter the channel length. This relationship is due to the complex space of filling the capillary via wicking, the ink wetting the substrate surface out of the capillary, and the ink drying causing a change in rheology (primarily viscosity) during the filling process. On the y-axis, the value is twice that of the channel length a single transistor defined by a single reentrant profile. As can be seen, at all channel widths tested the channel length is less that the feature size obtainable by simply printing the ink on a flat surface—for the narrowest width transistors the channel length for a single VTF is less than 60 microns and for the widest transistors the channel length is on the order of a few microns, far smaller than the 70 microns dot size of the print system. For reference, values for inventive embodiments like I1-I4 are shown, having comparable post height to I5 through I7.

While the individual transistors of the previous Inventive Examples can be probed, it is most convenient to probe the electrodes at the substrate level, rather than over the cap. To that end, Inventive Examples I8 through I11 were fabricated such that only a single vertical transistor was formed over the polymeric post and cap structure.

Inventive Example I8

Three Pixel Single Printed VTFT (No Filler)

Inventive Example I8 was formed using the same process as Inventive Example I6 with the following exceptions. The gate pattern used in Inventive Example I8 was such that the conductive gate layer only extended into one reentrant profile of the cap and post structure as shown in FIGS. 53a and 53b. All other steps were identical to those of Inventive Example I6. The single vertical transistor of Inventive Example 8 had an on-off ratio of $2*10^5$, and gate leakage of $1*10^{−10}$ Amps when tested in the linear regime with a constant Vd of 0.2 V, and the gate voltage swept from −2 to 8 Volts.

Inventive Example I9

Three Pixel Single Printed VTFT (with Filler)

Inventive Example I9 was formed using the same process as Inventive Example I8 with the following exceptions. As in I8, the gate pattern used in Inventive Example I8 was such that the conductive gate layer only extended into one reentrant profile of the cap and post structure, and in the opposite reentrant profile a filler material was printed prior to the blanket coating of 250 Å of aluminum oxide, as shown in FIGS. 54a and 54b. In Inventive Example I9 the filler material was the same PVP ink that was used as an inhibitor, only it was treated with a short oxygen plasma low power oxygen plasma to activate the surface to enable ALD growth. All other steps were identical to those of Inventive Example I8. The single vertical transistor of Inventive Example I9 had an on-off ratio of $3.6*10^5$, and gate leakage of $2.8*10^{−11}$ Amps when tested in the linear regime with a constant Vd of 0.2 V, and the gate voltage swept from −2 to 7 Volts.

Inventive Example I10

Three Pixel Single Printed VTFT (with Filler)

Inventive Example I10 was formed using the same process as Inventive Example I8 with the following exceptions. After depositing the AZO for the gate layer using the gate pattern used in Inventive Example I8 was such that the conductive gate layer only extended into one reentrant profile of the cap and post structure, the inhibitor material was removed using a low power $O_2$ plasma. Next, a dilute solution of SU-8 was spun on to be the filler material. In Inventive Example I10, a 10% solution of SU-8 2010 in cyclopentanone was coated and cured using the same conditions as for the SU-8 structural polymer layer. After curing the SU-8 layer, it was patterned by printing an inhibitor pattern with openings over the reentrant profile contacting the filler material. Next, a 250 Å $Al_2O_3$ hard protective layer was deposited using the Atmospheric ALD system described above. Finally, the SU-8 filler material was patterned using a 4 minute 300 W 0.4 Torr oxygen plasma, which both removed the inhibitor material and the SU-8 that was not protected by the patterned aluminum oxide. After patterning the SU-8 filler, the single vertical transistor was completed using the same process steps as in Inventive Example I8. The single vertical transistor of Inventive Example I10 had an on-off ratio of $1.2*10^4$, and gate leakage of $1.9*10^{−10}$ Amps when tested in the linear regime with a constant Vd of 0.2 V, and the gate voltage swept from −2 to 8 Volts.

Inventive Example I11

Three Pixel Single Printed VTFT (with Filler)

Inventive Example I11 was formed using the same process as Inventive Example I10 with the following exceptions. After depositing the AZO for the gate layer using the gate pattern used in Inventive Example I8 was such that the conductive gate layer only extended into one reentrant profile of the cap and post structure, the inhibitor material was not removed, and instead was left in place under the dilute SU-8 coating. The dual layer of PVP and SU-8 form the filler layer for Inventive Example I11, and were patterned in the same manner as Inventive Example I10. The single vertical transistor was completed using the same process steps as in Inventive Example I8. The single vertical transistor of Inventive Example I11 had an on-off ratio of $2.7*10^4$, and gate leakage of $6.4*10^{-11}$ Amps when tested in the linear regime with a constant Vd of 0.2V, and the gate voltage swept from −2 to 8 Volts.

Vertical Transistors Fabricated Using Photolithography

Inventive Example I12

Photolithography VTFT with Cr Lines

Figure 31B:
Figure 31A:
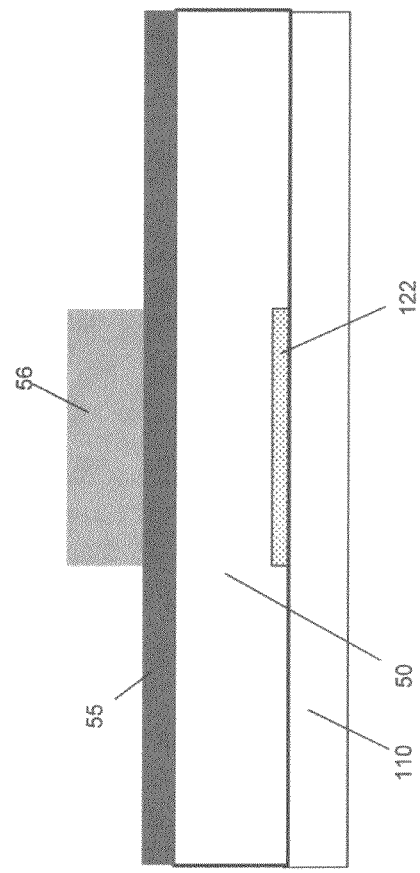

Inventive Example I12 is an example of forming the vertical transistors of the present invention having a polymer post and inorganic cap using a photolithographic process. First a clean glass substrate was coated with 100 nm of Cr via evaporation, and patterned using photolithography with 1813 as the resist layer and a Cr etchant. The resist was then stripped and the sample was cleaned using a 1 minute, 100 W 0.3 Torr oxygen plasma. Next the SU-8 structural polymer layer was coated and cured as in Inventive Example I8. Next, 500 Å of Al2O3 was deposited using the conditions for TMA and H2O listed in Table 1, and 464 cycles at 50 ms residence time. The aluminum oxide layer was patterned using 1813 resist. The resist was exposed through a low resolution mask to leave a large unexposed patch of resist over a portion of the Cr pattern where the post will be formed. Then the sample was exposed through the back side where the Cr pattern on the glass substrate masked the exposure to form an aligned pattern of photoresist over the Cr line on the top of the SU-8 layer, as illustrated in FIGS. 31a and 31b. The aluminum oxide was then etched in a 60° C. phosphoric acid bath for 2 minutes to form the patterned aluminum oxide layer of the inorganic cap. After etching, the 1813 resist was removed using an acetone rinse, followed by a rinse in IPA.

The structure of the inorganic cap and polymeric post was completed as in Inventive Example I8, using a 300 W 0.4 Torr O₂ plasma etch for 6 minutes. Next, 1500 Å of AZO was deposited for the gate layer, and patterned using a self-aligned photo exposure. In this step, PMMA was used as the photo-patternable resist and spin-coated over the entire sample. The sample was then exposed from the top surface so that the AZO gate layer over the inorganic cap protected the PMMA within the reentrant profile from exposure. After exposure, the PMMA was developed in MIBK leaving PMMA only in the reentrant profile. The AZO was then etched for 60 seconds in dilute acetic solution, followed by removal of the PMMA from the reentrant profile using acetone and IPA.

Next, the sample was cleaned using a 1 minute oxygen plasma (100 W, 0.3 Torr) prior to depositing the insulating and semiconductor layers; 120 Å of aluminum oxide (TMA and H2O) followed by 120 Å of ZnO:N (DEZ, H2O, NH4) were deposited during one deposition step using the conditions in Table 1 above. Next, the semiconductor layer was patterned using photolithography in which a Cr mask was used in exposing a resist stack of PMMA and 1813, after which the 1813 was developed and the exposed PMMA was removed with an oxygen plasma. The ZnO was etched in a weak acetic acid solution. The aluminum oxide layer was then patterned by spin-coating another layer of 1813, and exposing using a Cr mask in order to open vias down to the Cr pattern on the substrate. After developing the 1813, the aluminum oxide was etched using a 60° C. phosphoric acid bath.

The source and drain electrodes were deposited using a line of sight deposition such that the reentrant profile caused the electrode over the inorganic cap to be separated from the electrode on over the substrate (not over the post). A 500 Å layer of Al was evaporated onto the sample. A double layer of PMMA and 1813 was spin-coated over the substrate, and patterned using a low resolution Cr mask to expose the 1813, after which the 1813 was developed and the exposed PMMA was removed with an oxygen plasma. The aluminum layer was etched using Dow MF319, the developer solution for resist 1813.

The Inventive vertical transistor I12 was complete and had a structure of that of FIG. 3, using the gate structure illustrated in FIG. 7. The vertical transistor of Inventive Example I12, as fabricated, had two vertical transistors connected in series each with a channel width of 83 microns and a channel length of 1 micron. The transistors had an on-off ratio of $7.6*10^5$, and gate leakage of $4.4*10^{-12}$ Amps when tested in the linear regime with a constant Vd of 0.2 V, and the gate voltage swept from −1 to 3 Volts.

The invention has been described in detail with particular reference to certain preferred embodiments thereof, but it will be understood that variations and modifications can be effected within the scope of the invention.

PARTS LIST 20 polymer post
25 width of post
30 inorganic material cap
45 length of post
40 side wall
41 deposition inhibitor
45 height of post
50 structural polymer layer
55 uniform inorganic thin film layer
56 patterned photoresist
57 patterned inorganic material layer
60 region where the inhibitor material is not present
61 printed polymeric inhibitor having a filler pattern
62 region where the inhibitor material is not present
65 filler material
70 via
71 printed polymeric inhibitor having a cap pattern
73 printed polymeric inhibitor having a gate pattern
75 printed polymeric inhibitor having a dielectric pattern
77 printed polymeric inhibitor having an electrode pattern
72, 74, 76, 78 region where the inhibitor material is not present
80 region where the inhibitor material is not present
81 nitrogen gas flow
82, 83, 84 gas bubbler
85, 86 flow meter
87, 88 flow meter
89, 91, 94 flow meter
90 air flow
92 metal precursor flow
93 oxidizer-containing flow
95 nitrogen purge flow
96 substrate support
97 example substrate
98 arrow
99 gap
100 vertical transistor
103 vertical transistor
104 vertical transistor
105 vertical transistor
106 vertical transistor 107 vertical transistor
108 vertical transistor
110 substrate
115 conformal dielectric material layer
120 electrically conductive gate structure
121 electrically conductive gate structure
122 conductive material layer
125 conductive gate layer
126 first gate
127 second gate
130 patterned insulating layer
140 first reentrant profile
141 first reentrant profile
145 second reentrant profile
146 second reentrant profile
150 semiconductor material layer
151 inorganic thin film layer
155 buffer layer
160 semiconductor material layer
170 second electrode
171 second electrode
175 third electrode
176 third electrode
180 first electrode
181 first electrode
182 first electrode
200 vertical transistor
203 vertical transistor
204 vertical transistor
205 vertical transistor
213 vertical transistor
270 second electrode
275 third electrode
280 first electrode
330 patterned insulating layer
350 semiconductor material layer
370 first electrode
375 third electrode
380 second electrode
385 fourth electrode
500 portion of gate layer
550 portion of gate layer
701 substrate
710 substrate
800 forming an electrically conductive gate structure
801 providing a patterned deposition inhibitor
802 depositing a film using ALD
803 optionally removing the deposition inhibitor
810 providing a substrate
820 providing a structural polymer layer
830 forming patterned inorganic thin film
832 printing a polymeric inhibitor in a cap pattern
834 depositing an inorganic thin film using ALD
842 removing the patterned inhibitor and portions of the polymer layer
840 forming a polymer post having an inorganic material cap
850 forming a patterned gate layer
852 printing a polymeric inhibitor in a gate pattern
853 forming a conformal conductive gate layer using ALD
855 removing the polymeric inhibitor
860 forming a patterned insulating layer
862 printing a polymeric inhibitor in a dielectric pattern
863 forming a conformal dielectric layer using ALD
865 removing the polymeric inhibitor
870 forming a patterned semiconductor layer
872 printing a polymeric inhibitor in a semiconductor pattern
873 forming a conformal semiconductor layer using ALD
875 removing the polymeric inhibitor
880 simultaneously forming first and second electrodes
882 printing a patterned polymeric inhibitor that wicks along the reentrant profile
884 depositing a conductive inorganic thin film using ALD to form first and second electrodes
888 simultaneously forming a first and second electrodes
900 delivery head
905 output face
910 exhaust channels
920 gate
925 gate
940 gap
950 coating a filler material
960 printing a polymeric inhibitor in a filler pattern
970 forming a patterned inorganic filler layer using ALD
980 removing the polymeric inhibitor and portions of the filler material
A,A' line
C1,C1' point
C2,C2' point

The invention claimed is:

1. A vertically separated electrode structure comprising: a substrate; a polymeric material post on the substrate, the post having a height dimension extending away from the substrate to a top defined by a length dimension and a width dimension over the substrate, the post having an edge along the height dimension; an inorganic material cap on the top of the post, the cap covering the top of the post in the length dimension and the width dimension of the post, the cap extending beyond the edge of the post in at least the width dimension to define a first reentrant profile; a first electrode located over the cap; a second electrode located over the substrate and not over the post and adjacent to the edge of the post in the reentrant profile such that a distance between the first electrode and second electrode is greater than zero when measured orthogonally to the substrate surface, the first electrode and second electrode have the same material composition and layer thickness, a conformal dielectric material layer on the cap, the edges of the post, and at least a portion of the substrate, the conformal dielectric layer being located at least between the first electrode and the cap, the first electrode having an end and the second electrode having an end, wherein the end of the first electrode and the end of the second electrode are vertically aligned.

2. The structure of claim 1, wherein the conformal dielectric material layer is located between the second electrode and the substrate.

3. The structure of claim 1, the post having another edge along the height dimension, the cap extending beyond the other edge of the post to define a second reentrant profile.

4. The structure of claim 3, wherein the first electrode located over the cap extends to conformally cover the second reentrant profile.

5. The structure of claim 3, further comprising a filler material in the second reentrant profile, and wherein the first electrode located over the cap extends to conformally cover the filler material.

6. The structure of claim 1, wherein the post comprises a polyester, polyetherester, polyamide, polyesteramide, polyurethane, polyimide, polyetherimide, polyurea, polyamideimide, polyphenyleneoxide, phenoxy resin, epoxy resin, polyolefin, polyacrylate, polyethylene-co-vinyl alcohol, or a copolymer thereof, or a mixture thereof.

7. The structure of claim 1, wherein the post comprises an epoxy resin or polyimide.

8. The structure of claim 1, wherein the inorganic material cap includes one of a $Al_2O_3$, $SiO_2$, HfO, ZrO, $TiO_2$, $Ta_2O_5$, and $Si_xN_y$.

9. The structure of claim 1, wherein the polymeric material post has a height dimension extending away from the substrate that is less than 10 microns.

10. The structure of claim 1, wherein the cap extends beyond the edge of the post by less than the height of the post.

11. The structure of claim 1, wherein the first electrode and the second electrode have the same material composition and layer thickness.

12. The structure of claim 1, wherein the first electrode and the second electrode are transparent conductive oxides.

\* \* \* \* \*